(12) United States Patent
Yamazaki et al.

(10) Patent No.: US 6,424,326 B2
(45) Date of Patent: Jul. 23, 2002

(54) SEMICONDUCTOR DISPLAY DEVICE HAVING A DISPLAY PORTION AND A SENSOR PORTION

(75) Inventors: Shunpei Yamazaki, Tokyo; Jun Koyama, Kanagawa, both of (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/753,708

(22) Filed: Jan. 4, 2001

(30) Foreign Application Priority Data

Jan. 11, 2000 (JP) .................................. 2000-002042

(51) Int. Cl.$^7$ ................................................ G09G 3/30
(52) U.S. Cl. ............................. 345/77; 345/76; 349/69
(58) Field of Search .................. 345/77, 66; 315/169.1; 349/62

(56) References Cited

U.S. PATENT DOCUMENTS

| | | | |
|---|---|---|---|
| 5,247,190 A | | 9/1993 | Friend et al. .................. 257/40 |
| 5,399,502 A | | 3/1995 | Friend et al. .................. 437/1 |
| 5,745,085 A | * | 4/1998 | Tomio et al. .................. 345/63 |
| 5,886,474 A | * | 3/1999 | Asai et al. .................. 315/169.1 |
| 6,069,676 A | * | 5/2000 | Yuyama .................. 349/62 |

FOREIGN PATENT DOCUMENTS

| | | | |
|---|---|---|---|
| JP | 10092576 | 4/1998 | ........... H05B/33/14 |
| WO | WO90/13148 | 11/1990 | ........... H01L/33/00 |

OTHER PUBLICATIONS

Herman Schenk et al., "Polymers for Light Emitting Diodes", EuroDisplay '99 Proceedings, pp. 33–37; Sep. 6–9, 1999.

\* cited by examiner

*Primary Examiner*—David Nelms
*Assistant Examiner*—Tu-Tu Ho
(74) *Attorney, Agent, or Firm*—Fish & Richardson P.C.

(57) ABSTRACT

To provide a semiconductor display device capable of displaying an image having clarity and a desired color, even when the speed of deterioration of an EL layer is influenced by its environment. Display pixels and sensor pixels of an EL display each have and EL element, and the sensor pixels each have a light receiving diode or a sensor TFT. The luminance of the EL elements of each in the display pixels is controlled in accordance with the amount of electric current flowing in each of the light receiving diodes or sensor TFTs.

38 Claims, 25 Drawing Sheets

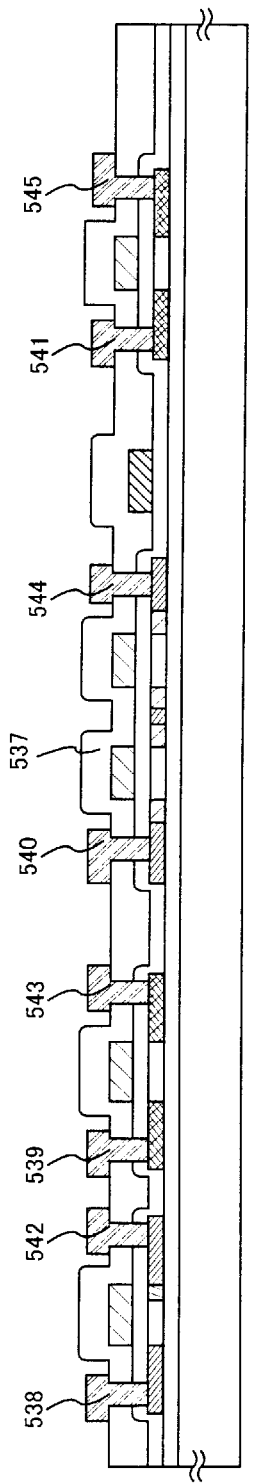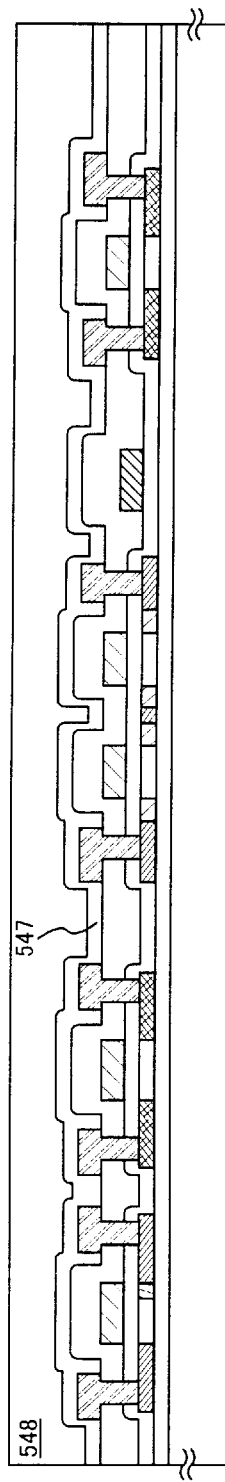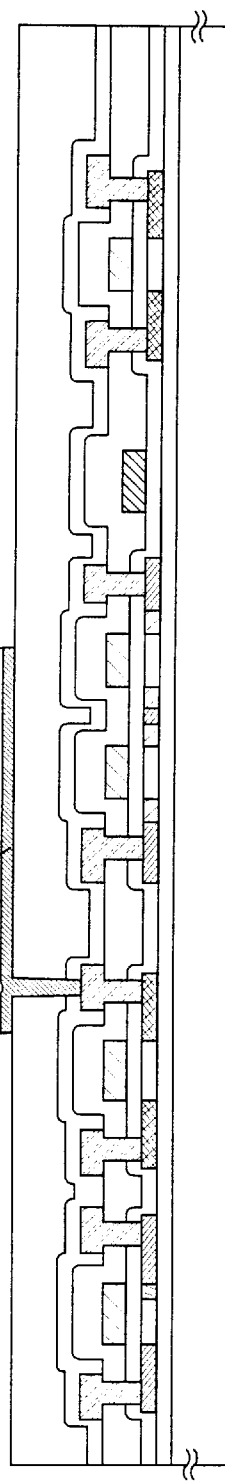

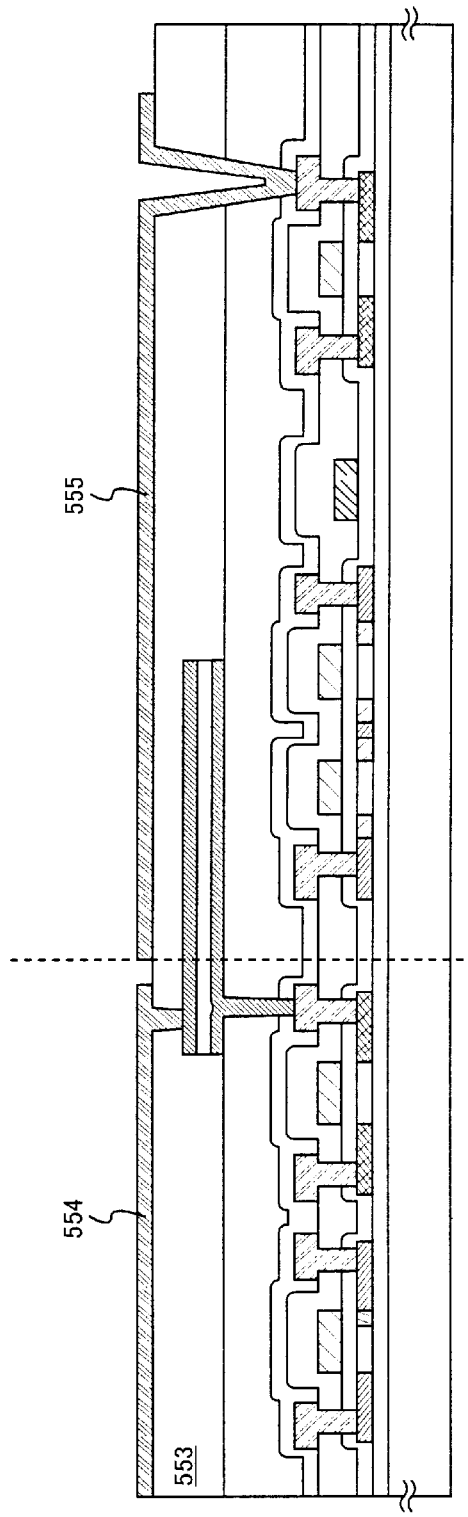
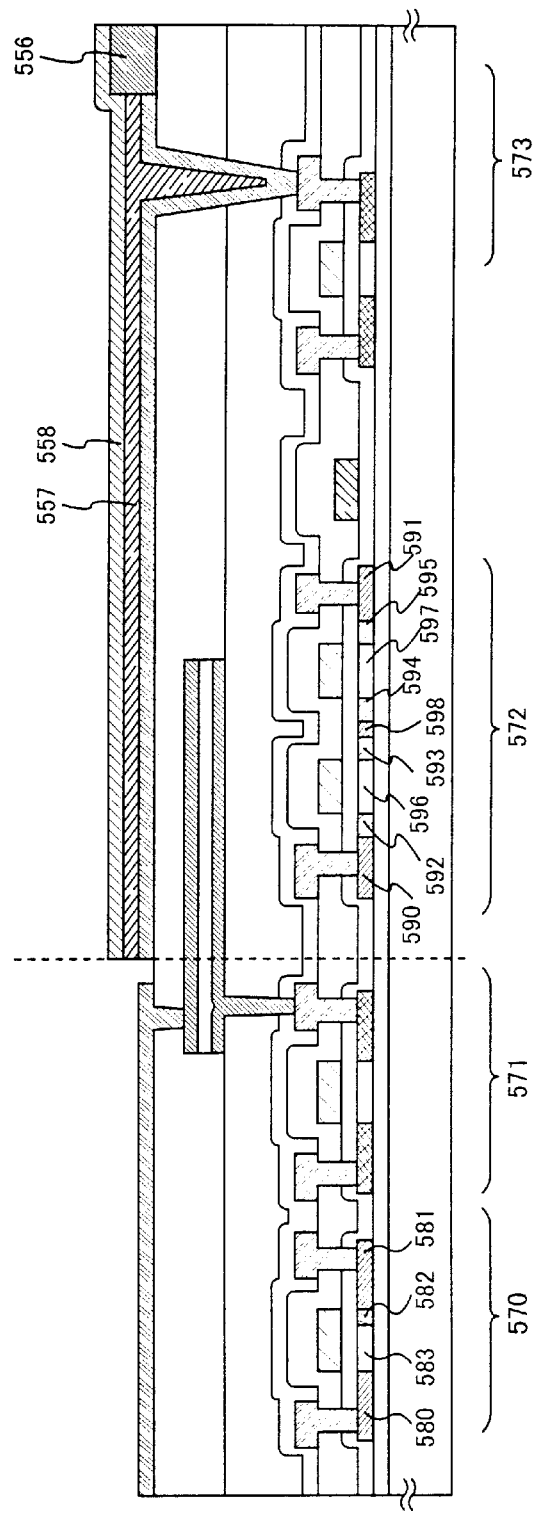
Fig. 13A
Fig. 13B

SEMICONDUCTOR DISPLAY DEVICE HAVING A DISPLAY PORTION AND A SENSOR PORTION

BACKGROUND OF THE INVENTION

1. Field of the Invention

The present invention relates to an EL display that is formed by fabricating an EL (Electro Luminescence) element on a substrate. Particularly, the present invention relates to an active matrix type EL display that uses a semiconductor element (an element employing a semiconductor thin film), and furthermore to a semiconductor display device employing the EL display.

2. Description of the Related Art

In recent years, technology for forming a TFT on a substrate has been largely improved, and an application development of the TFT to an active matrix type semiconductor display device has been carried out. In particular, the TFT using a polysilicon film has a higher electric field effect mobility than the TFT using a conventional amorphous silicon film, and therefore, the TFT may be operated at a high speed. Thus, the pixel control which has been conducted at a driver circuit outside of the substrate may be conducted at the driver circuit which is formed on the same substrate as the pixel.

Such an active matrix type semiconductor display device can, by preparing various circuits and elements on the same substrate, obtain various advantages such as a decrease in manufacturing cost, a decrease in the size of the semiconductor display device, an increase in yield, and a decrease in throughput.

Further, research on the active matrix type EL display having an EL element as a self-light-emitting element is becoming more and more active. The EL display is referred to as a light-emitting display, an organic EL display (OELD) or an organic light-emitting diode (OLED).

The EL display is a self-light-emitting type unlike a liquid crystal display device. The EL element is constituted such that a layer containing an organic compound (hereinafter, referred to as an EL layer) is sandwiched between a pair of electrodes (anode and cathode). However, the EL layer normally has a lamination structure. Typically, the lamination structure of a "hole transport layer/a light emitting layer/an electron transport layer" proposed by Tang et al. of the Eastman Kodak Company can be cited. This structure has a very high light-emitting efficiency, and this structure is adopted in almost all the EL displays which are currently subjected to research and development.

When the EL element obtains Luminescence (Electro Luminescence) which is generated by applying a voltage to the EL element, it is composed of an anode layer, an EL layer, and a cathode layer. There are two types of luminescence in an organic compound, one being a luminescence that is generated when the organic compound returns from a singlet excitation state to a ground state (fluorescence) and the other being a luminescence that is generated when the organic compound returns from a triplet excitation state to a ground state (phosphorescence). Either type of luminescence may be used in the EL display of the present invention.

In addition, the structure may be such that on the electrodes, a hole injection layer/a hole transport layer/a light emitting layer/an electron transport layer, or a hole injection layer/a hole transport layer/a light emitting layer/an electron transport layer/an electron injection layer may be laminated in order. Phosphorescent dye or the like may be doped into the light emitting layer.

In this specification, all the layers provided between a pair of electrodes are generally referred to as EL layers. Consequently, the hole injection layer, the hole transport layer, the light emitting layer, the electron transport layer, the electron injection layer and the like are all included in the EL layers.

In this specification, a light emitting element, which is composed of an anode, an EL layer and a cathode, is referred to as an EL element.

The deterioration of the EL material of the EL layer has become a problem in the realization of the EL display, which leads to the reduction in the luminance of the EL element.

The EL material of the EL layer is inferior to moisture, oxygen, light, and heat, which are the factors that promote the deterioration of the EL layer. To be more specific, the rate at which the EL layer deteriorates is influenced by the structure of a device driving the EL display, characteristics of the EL material structuring the EL layer, materials of an electrode, conditions of the manufacturing processes, a driving method of the EL display and the like.

The EL layer deteriorates even if a constant voltage from a pair of electrodes is applied thereto, whereby the luminance of the EL element is reduced. Thus, an image displayed on the EL display is not clear because of the reduction in the luminance of the EL element.

Further, Color display systems of the EL display are roughly divided into four: a system where three kinds of EL elements corresponding to R (red), G (green), and B (blue), respectively, are formed; a system where EL elements emitting white light are combined with a color filter; a system where EL elements emitting blue or blue-green light are combined with a fluophor (fluorescent color conversion layer: CCM); and a system where EL elements corresponding to R, G, and B are superimposed on a transparent electrode used as a cathode (an opposing electrode) (RGB stacking method).

The EL material that structures the EL layer differs depending on the luminescing color of the EL layer. Therefore, in the color display system that employs three kinds of EI elements corresponding to the colors R (red), G (green), and B (blue), the three kinds of EL elements of the EL layer corresponding to RGB each may deteriorate at different rates. In this case, the luminance of the EL elements that correspond to RGB becomes dissimilar, respectively, as time passes. Consequently, an image having a desirable color cannot be displayed on the EL display.

SUMMARY OF THE INVENTION

The present invention has been made in view of the above, and therefore has an object to provide an EL display capable of performing a clear and desirable color display by suppressing a reduction in luminance of an EL element even if an EL layer is deteriorated.

The EL display of the present invention has a sensor portion for detecting a luminance of a portion for displaying an image of the EL display (display portion) and revising the luminance to a desirable value. The sensor portion includes one or a plurality of pixels. It is to be noted that the pixel(s) of the sensor portion will hereinafter be referred to as sensor pixel(s) throughout this specification.

The sensor pixel(s) is composed of an EL element and a light receiving diode that detects the amount of change in the luminance of the EL element. It is to be noted that throughout this specification, the EL element of the sensor pixel(s) will hereinafter be referred to as a sensor EL element.

The sensor EL element has the same structure as that of the EL element (hereinafter referred to as display EL element) of the pixel (hereinafter referred to as display pixel) of the display portion. At least a material that constructs a pair of electrodes and a material that constructs a lamination structure of an EL layer and the EL layer are the same, respectively.

Then, a signal, which is the same as a signal inputted to an arbitrarily selected display EL element, is fed to the sensor EL element. In this specification, the input of a signal to the EL element (display EL element and sensor EL element) means that an electric potential of the signal is applied to one of the electrodes of the EL element, and an EL drive voltage is applied to the EL layer. Here, the EL drive voltage is the electric potential difference between the electric potential of the signal applied to one of the electrodes of the EL element and the constant electric potential applied to the other electrode thereof.

Thus, an equivalent voltage is applied to the EL layers of the sensor EL element and the arbitrarily selected display EL element, whereby the deterioration rates of the EL layers are nearly equivalent. Therefore, the luminance of the sensor EL element and the luminance of the display EL element maintain almost equivalent states even as time elapses.

Light emitted by the sensor EL element, on one hand, is irradiated to the light receiving diode of the senor pixel. Then, the light receiving diode detects the luminance of the sensor EL element. On the basis of the information of the luminance of the sensor EL element that was detected, the luminance of the display EL element is revised, and the luminance of the sensor EL element is also revised at the same time.

By adopting the above structure, the present invention has made it possible for the EL display to perform a clear and desirable color display by suppressing the reduction in luminance of the EL element even if the EL layer is deteriorated.

The EL display of the present invention may be of a color display system that employs a display EL element emitting white light, or a color display system that employs display EL elements corresponding to the colors RGB, respectively. In case of the color display system that employs the display EL elements corresponding to each of the colors RGB, it is preferable that the senor pixels corresponding to each of the colors RGB are provided in the sensor portion. However, the present invention is not limited to the structure thereof. It may be a structure in which the sensor pixels, which correspond to either 1 or 2 colors of the RGB colors, are provided in the sensor portion. In particular, it is effective to provide the sensor pixel that corresponds to the color of which the deterioration of the EL layer is remarkable in the sensor portion to thereby display an image having a desirable color.

It is further preferable that the display EL element and the sensor EL element are formed at the same time under the same conditions. The deterioration rates of the EL layers of the display EL element and the sensor EL element can be made equivalent by adopting the above structure. Therefore, the luminance of the sensor EL element that will be detected by the light receiving diode becomes equivalent with the luminance of the display EL element, to thereby detect the change in the luminance of the display EL element more accurately. Thus, it becomes possible to revise the luminance of the display EL element to a desirable value.

Furthermore, when the sensor portion is formed simultaneously with the display portion on the substrate, as the manufacturing process of the El display, only the process of forming the light receiving diode has to be added to the manufacturing process in the case where the sensor portion is not provided. Therefore, there is no need to remarkably increase the number of manufacturing processes, thereby making it possible to suppress the number of manufacturing processes.

It is to be noted that a portion of the display portion may be used as the sensor portion. That is, among the pixels of the display portion, one or a plurality of pixels that are arbitrarily selected may be employed as sensor pixels and the rest of the pixels may be employed as display pixels. In this case, the size of the EL display can be suppressed because the space for the provision of the sensor portion can be omitted compared with the case of not including the sensor portion in the display portion.

BRIEF DESCRIPTION OF THE DRAWINGS

In the accompanying drawings:

FIGS. 12A to 12C are diagrams showing the process of manufacturing the EL display of the present invention;

FIGS. 13A and 13B are diagrams showing the process of manufacturing the EL display of the present invention;

DETAILED DESCRIPTION OF THE PREFERRED EMBODIMENTS

An embodiment mode of the present invention will be explained with reference to FIGS. 1 to 6.

Figure 1:
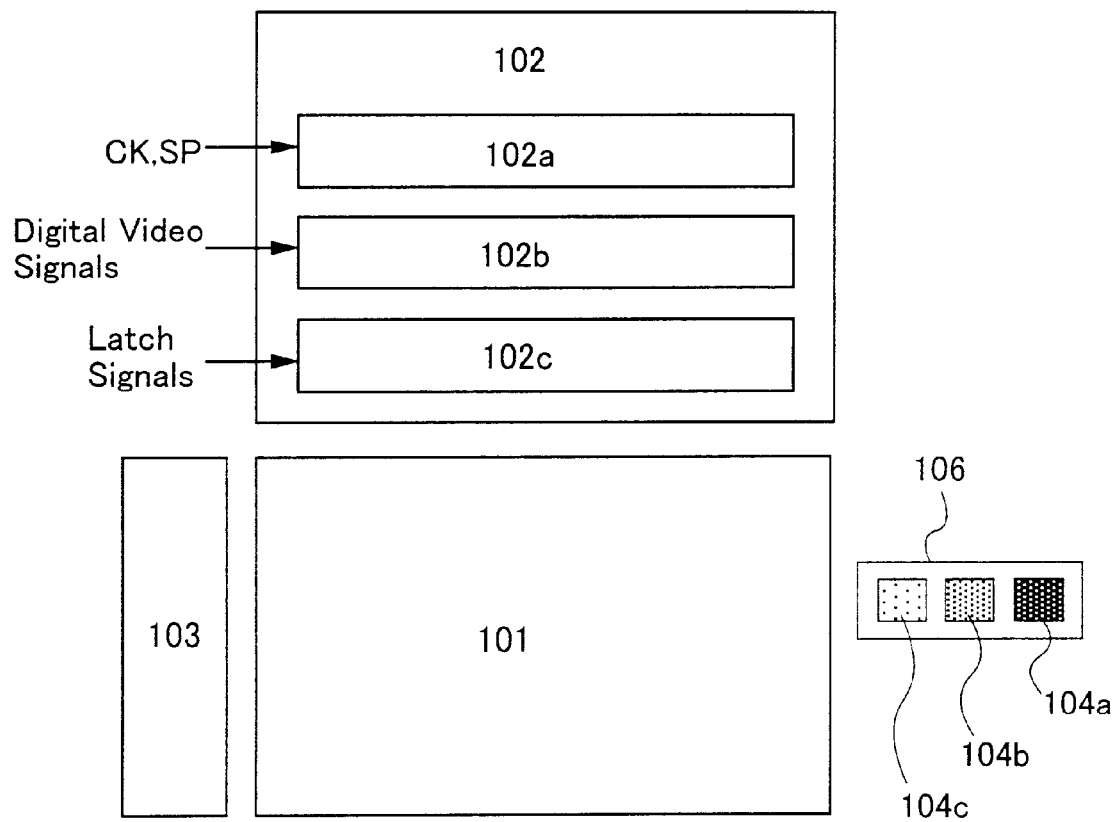
FIG. 1 is a schematic diagram of the top of an EL display of the present invention.

Shown in FIG. 1 is a top view of an EL display, which is a portion of a semiconductor display device of the present invention. It is to be noted that in the embodiment mode of the present invention, an explanation will be made on an EL display for performing color display that is driven by a digital method. However, the driving method of the EL display of the present invention is not limited to the digital method, and the EL display may be driven by an analog method. In addition, although an explanation is made in the embodiment mode on the EL display for performing color display, the EL display of the present invention may performs not only color display, but also monochrome display.

As shown in FIG. 1, there is provided a display portion 101, a source signal line driver circuit 102, a gate signal line driver circuit 103, and a sensor portion 106. The source signal line driver circuit 102 is composed of a shift register 102a, a latch (A) 102b, and a latch (B) 102c.

The sensor portion 106 has sensor pixels 104 (R sensor pixel 104a, G sensor pixel 104b, and B sensor pixel 104c) that correspond to the colors RGB, respectively. Note that an EL display of a color display system that employs three kinds of EL elements corresponding to the colors RGB is illustrated in the embodiment mode. However, the present invention is not limited thereto, and an EL display of a color display system that employs an EL element emitting white light may be used. Further, in the embodiment mode, although the sensor portion 106 has 3 sensor pixels that correspond to the colors RGB, respectively, the present invention is not limited thereto. Only sensor pixels that correspond to 1 or 2 colors of the colors RGB may be provided in the sensor portion.

Figure 2:
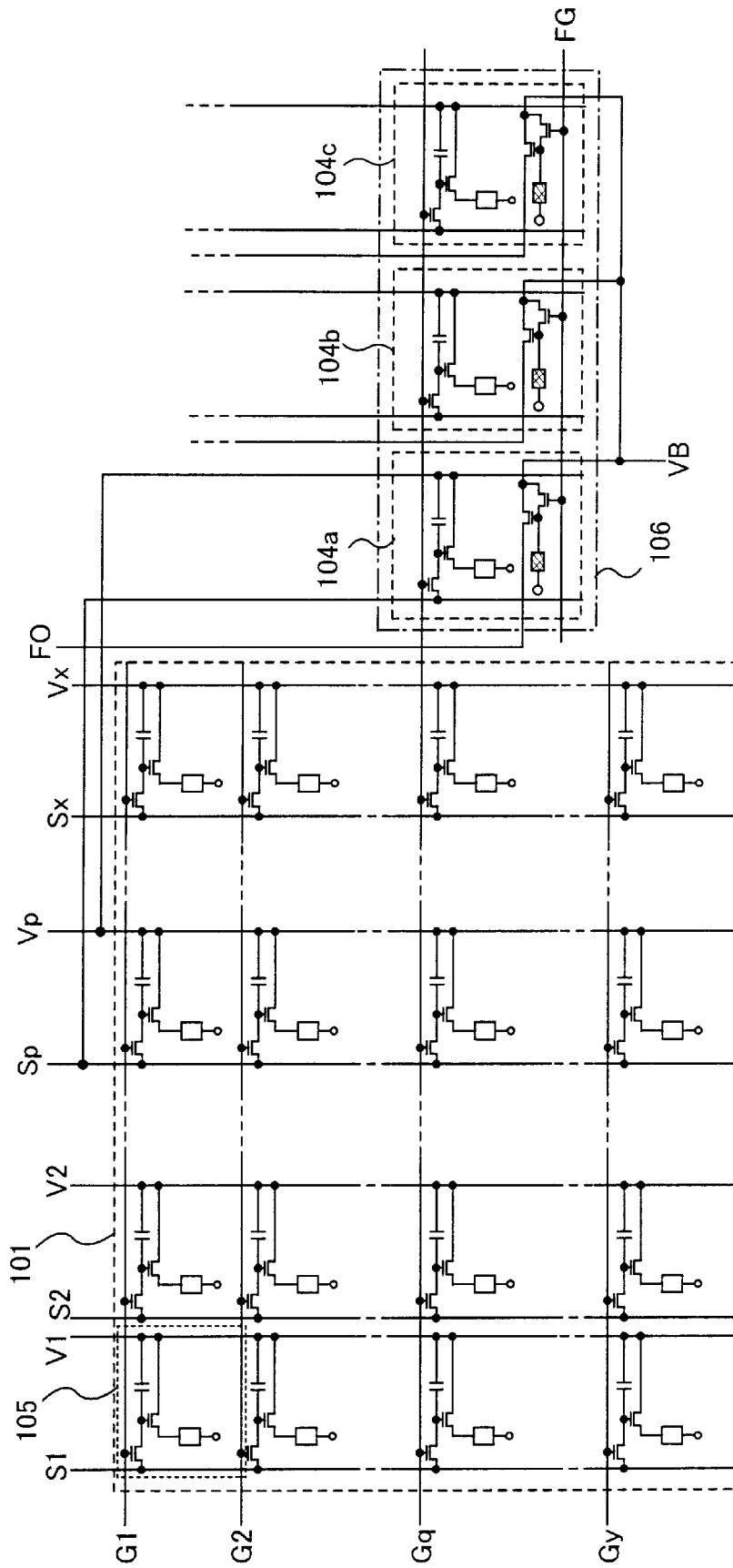
FIG. 2 is a circuit diagram of an EL display of the present invention.

A detailed circuit diagram of the display portion 101 and the sensor portion 106 is shown in FIG. 2. Source signal lines (S1 to Sx), power source supply lines (V1 to Vx), and gate signal lines (G1 to Gy) are provided in the display portion 101. Note that the sensor portion 106 and the display portion 101 are provided on the same substrate in the embodiment mode. However, the present invention is not limited thereto. The structure may be such that the sensor portion and the display portion are provided on different substrates and connected by an FPC or the like.

The display portion 101 includes a plurality of display pixels 105. The display pixels 105 each have any one of the source signal lines (S1 to Sx), any one of the power source supply lines (V1 to Vx), and any one of the gate signal lines (G1 to Gy). There are 3 types of display pixels 105: a display pixel for displaying the color R; a display pixel for displaying the color G; and a display pixel for displaying the color B.

A source signal line Sp (where p is an arbitrary number between 1 and x), a power source supply line Vp, and a gate signal line Gq (where q is an arbitrary number between 1 and y) are contained in an arbitrarily selected display pixel (p, q) of the display pixels for displaying the color R. Also, similar to the display pixel (p, q) for displaying the color R, the source signal line Sp, the power source supply line Vp, and the gate signal line Gq are contained in the R sensor pixel 104a.

Though not shown in the figure, similarly, the same source signal line, power source supply line, and gate signal line that are included in an arbitrarily selected display pixel for displaying the color G are also contained in the G sensor pixel 104b. Likewise not shown in the figure, the same source signal line, power source supply line, and gate signal line that are contained in an arbitrarily selected display pixel for displaying the color B are also contained in the B sensor pixel 104c.

Figure 3:
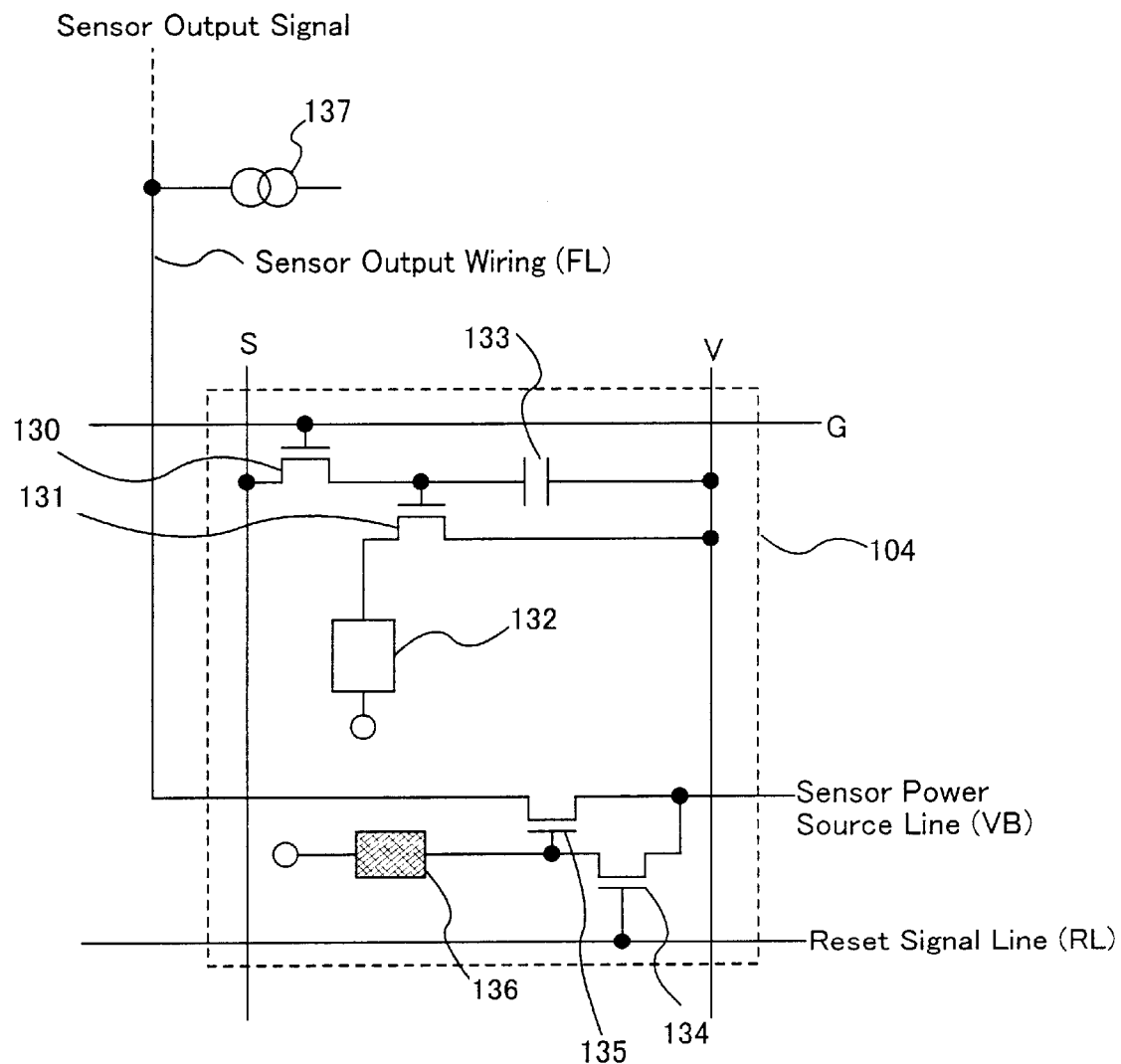
FIG. 3 is a circuit diagram of a sensor pixel of an EL display of the present invention.

A detailed structure of the sensor pixels 104a to 104c is shown in FIG. 3. A region that is surrounded by a dotted line is the sensor pixel 104. Contained in the sensor pixel 104 are a source signal line S (any one of the lines between S1 and Sx), a power source supply line V (any one of the lines between V1 and Vx), and a gate signal line G (any one of the lines between G1 and Gy).

In addition, the sensor pixel 104 (104a to 104c) has a switching TFT 130, an EL driving TFT 131, and a sensor EL element 132. A capacitor 133 is provided in the structure of FIG. 3, but the structure may be formed without the provision of the capacitor 133.

The sensor EL element 132 is composed of an anode, a cathode, and an EL layer provided therebetween. When the anode is connected to a drain region of the EL driving TFT 131, in other words, when the anode is a pixel electrode, the cathode serving as an opposing electrode is held at a predetermined electric potential (opposing electric potential). On the other hand, when the cathode is connected to the drain region of the EL driving TFT 131, in other words, when the cathode is the pixel electrode, then the anode serving as the opposing electrode is held at a predetermined electric potential (opposing electric potential).

A gate electrode of the switching TFT 130 is connected to the gate signal line G. One of a source region and a drain region of the switching TFT 130 is connected to the source signal line S, and the other is connected to a gate electrode of the EL driving TFT 131.

One of a source region and the drain region of the EL driving TFT 131 is connected to the power source supply line V, and the other is connected to the sensor EL element 132. The capacitor 133 is provided so as to be connected to the gate electrode of the EL driving TFT 131 and the power source supply line V.

Further, the sensor pixel 104 has a reset TFT 134, a buffer TFT 135, and a light receiving diode 136.

A gate electrode of the reset TFT 134 is connected to a reset signal line RL. A source region of the reset TFT 134 is connected to a sensor power source line VB and a drain region of the buffer TFT 135. The sensor power source line VB is constantly held at a fixed electric potential (standard electric potential). Further, a drain region of the reset TFT 134 is connected to the light receiving diode 136 and a gate electrode of the buffer TFT 135.

A source region of the buffer TFT 135 is connected to a sensor output wiring FL. The sensor output wiring FL is further connected to a constant-current power source 137 and a fixed current constantly flows therein. Further, the drain region of the buffer TFT 135 is connected to the sensor power source line VB which is constantly maintained at a fixed standard electric potential. The buffer TFT 135 functions as a source follower.

Although not shown in the figure, the light receiving diode 136 is composed of a cathode, an anode, and a photoelectric converting layer provided therebetween.

Figure 4:
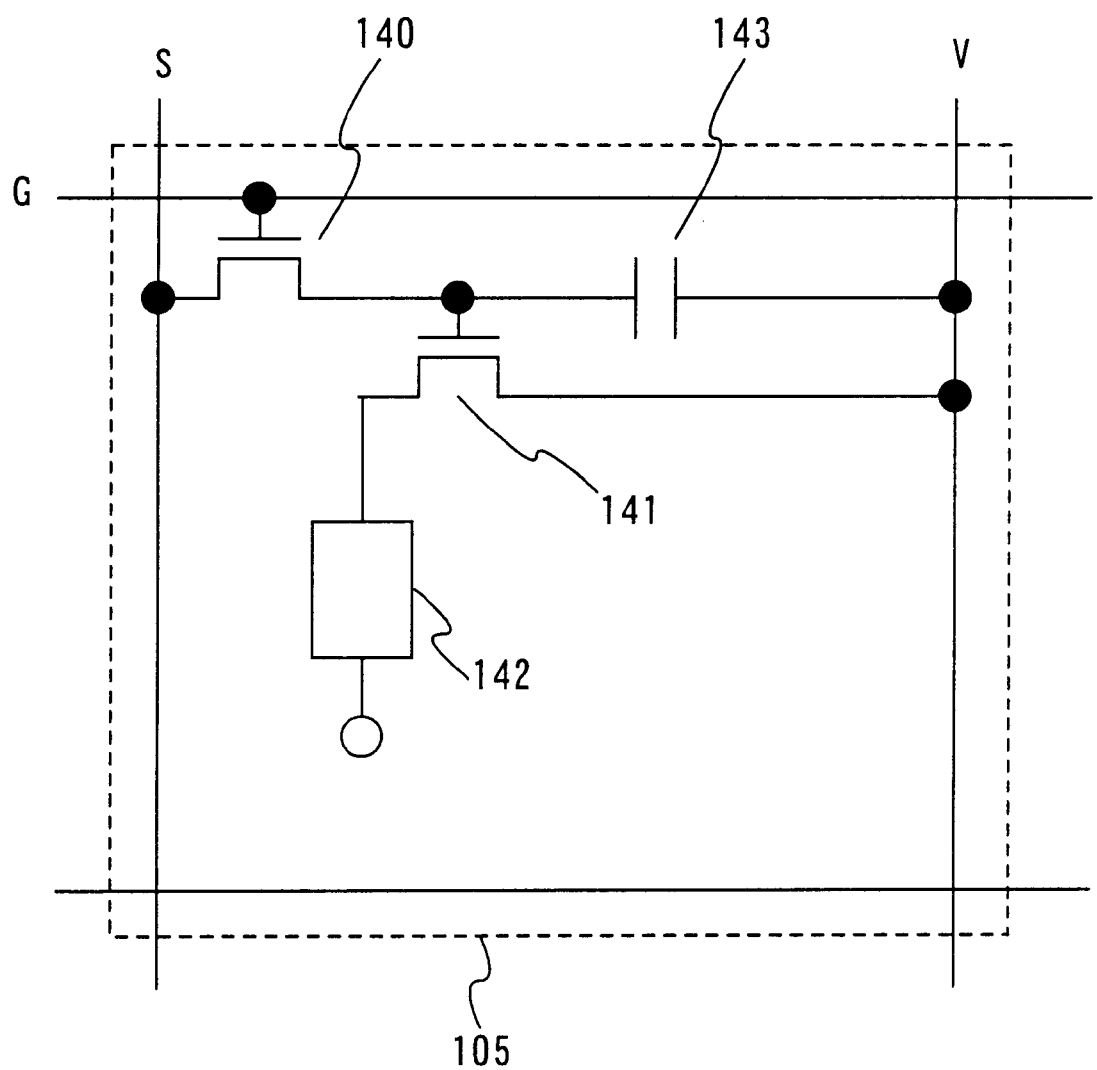
FIG. 4 is a circuit diagram of a display pixel of an EL display of the present invention.

Shown in FIG. 4 is a detailed structure of the display pixel 105. An area surrounded by a dotted line is the display pixel 105. The source signal line S (any one of the lines between S1 and Sx), the power source supply line V (any one of the lines between V1 and Vx), and the gate signal line G (any one of the lines between G1 and Gy) are contained in the display pixel 105.

Similar to the sensor pixel 104, the display pixel 105 has a switching TFT 140, an EL driving TFT 141, and a display EL element 142. The display EL element 142 has the same structure as that of the sensor EL element 132 that is shown in FIG. 3. To be more specific, the display EL element 142 and the sensor EL element 132 each have an EL layer sandwiched between a pair of electrodes. In addition, the material constructing the pair of electrodes and the laminate structure of the EL layer are at least respectively the same for both the EL elements. In particular, when the color of light emitted by the sensor EL element 132 and the display EL element 142 is the same, then the material (EL material) that forms the EL layer is also the same.

The display EL element 142 is composed of an anode, a cathode, and an EL layer provided therebetween. When the anode is connected to a drain region of the EL driving TFT 141, in other words, when the anode is a pixel electrode, the cathode serving as an opposing electrode is held at a predetermined electric potential (opposing electric potential). On the other hand, when the cathode is connected to the drain region of the EL driving TFT 141, in other words, when the cathode is the pixel electrode, then the anode serving as the opposing electrode is held at a predetermined electric potential (opposing electric potential).

Further, a capacitor 143 is provided in the structure of FIG. 4, but the structure may be formed without the provision of the capacitor 143.

A gate electrode of the switching TFT 140 is connected to the gate signal line G. One of a source region and a drain region of the switching TFT 140 is connected to the source signal line S, and the other is connected to a gate electrode of the EL driving TFT 141.

One of a source region and the drain region of the EL driving TFT 141 is connected to the power source supply line V, and the other is connected to the display EL element 142. The capacitor 143 is provided so as to be connected to the gate electrode of the EL driving TFT 141 and the power source supply line V.

Next, a description will be made on a driving method of the EL display of the embodiment mode.

FIG. 1 is referenced. In the source signal line driver circuit 102, a clock signal (CLK) and a start pulse (SP) are inputted to the shift register 102*a*. The shift register 102*a* sequentially generates timing signals on the basis of the clock signal (CLK) and the start pulse (SP) to thereby sequentially feed the timing signals to downstream circuits.

The timing signals from the shift register 102*a* are current-amplified by a buffer (not shown) or the like, and the current-amplified timing signals may be sequentially fed to the downstream circuits. A large number of circuits or elements are connected to the wiring through which the timing signals are fed, so that the load capacitance (parasitic capacitance). The buffer is provided to prevent the sharpness of the rise or fall of the timing signals from being reduced by this large load capacitance.

The timing signals from the shift register 102*a* are then fed to the latch (A) 102*b*. The latch (A) 102*b* has a plurality of stages of latches for processing n-bit digital video signals. The latch (A) 102*b* sequentially writes in and holds the n-bit digital video signals including image information upon input of the timing signals.

Note that the digital video signals may be sequentially fed to the plural stages of the latches of the latch (A) 102*b* when the digital video signals are taken in by the latch (A) 102*b*. However, the present invention is not limited to this structure. A so-called division drive may be performed in which the plural stages of latches of the latch (A) 102*b* are divided into a number of groups and then the digital video signals are parallely fed to the respective groups at the same time. It is to be noted that the number of groups at this point is called a division number. For example, if the latches are grouped into 4 stages each, then it is called a 4-branch division drive.

The time necessary to complete writing of the digital video signals into all the stages of the latches of the latch (A) 102*b* is called a line period. In other words, the line period is defined as a time interval from the start of writing the digital video signals into the latch of the leftmost stage to the end of writing the digital video signals into the latch of the rightmost stage in the latch (A) 102*b*. In practice, a line period may be a period in which a horizontal return period is added to the above line period.

After the completion of one line period, a latch signal is fed to the latch (B) 102*c*. At this moment, the digital video signals written in and held by the latch (A) 102*b* are sent all at once to the latch (B) 102*c* to be written in and held by all the stages of latches thereof.

Sequential writing-in of digital video signals on the basis of the timing signals from the shift register 102*a* is again carried out to the latch (A) 102*b* after it has completed sending the digital video signals to the latch (B) 102*c*.

During this second time one line period, the digital video signals written in and held by the latch (B) 102*b* are inputted to source signal lines.

On the other hand, the gate signal line driver circuit 103 is composed of a shift register and a buffer (both not shown in the figure). Depending on the situation, the gate signal line driver circuit 103 may have a level shifter beside the shift register and the buffer.

In the gate signal line driver circuit 103, the timing signals from the shift register (not shown in the figure) are fed to the buffer (not shown in the figure) to be fed to corresponding gate signal lines (also referred to as scanning lines). The gate signal lines are connected to the gate electrodes of the switching TFTs of one line, and all the switching TFTs of one line have to be turned ON simultaneously. Therefore, the use of a buffer with a large electric current capacity is required.

It is to be noted that the structure, the driving method, and the number of the source signal line driver circuit 102 and the gate signal line driver circuit 103 are not limited to the structure in the embodiment mode.

Figure 5:
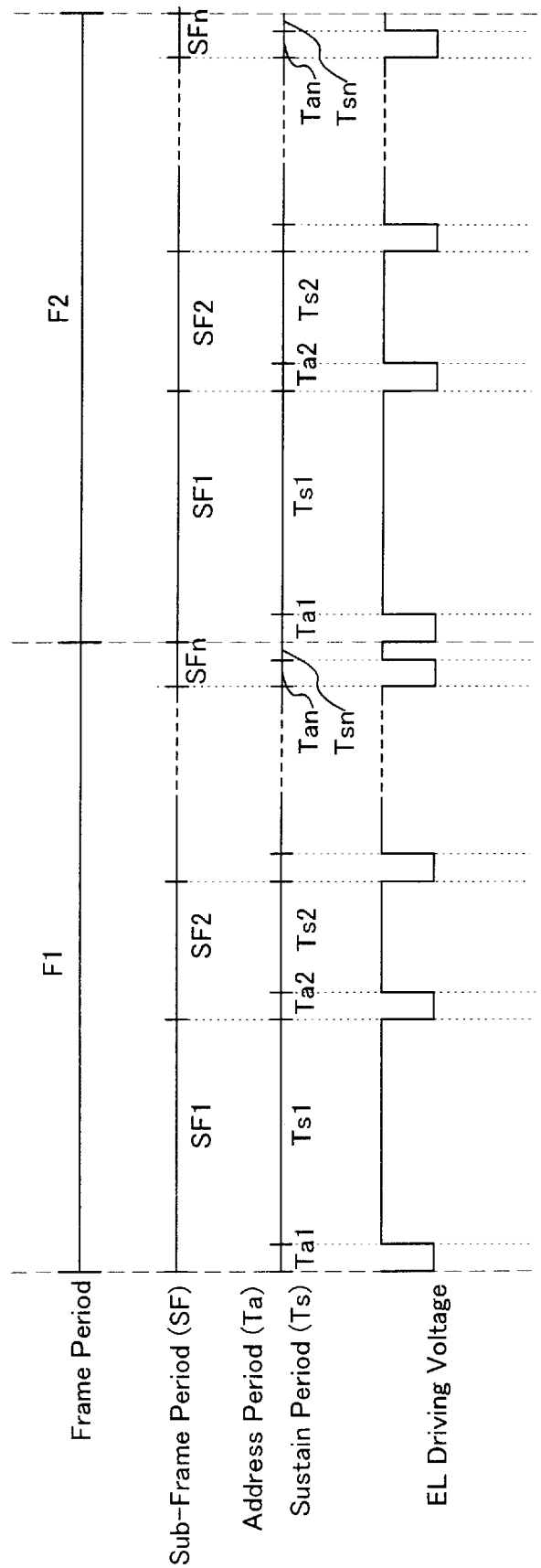
FIG. 5 is a timing chart when an EL display of the present invention is driven by a digital method.

Shown in FIG. 5 is a timing chart illustrating a case where the EL display of the present invention is driven by the digital method to perform a display.

First, a 1 frame period (F) is divided into an "n" number of sub-frame periods (SF1 to SFn). Note that a period in which all the pixels in the pixel portion display 1 image is referred to as the 1 frame period (F).

The provision of 60 or more frame periods within one second by the EL display is preferred. The glimmering of images such as flickering may be visually suppressed by providing the number of images displayed in one second to be 60 or more.

Note that a period in which 1 frame period is divided into a plurality of periods is referred to as sub-frame period (SF). As the number of tones increase, the number of sub-frame periods in 1 frame period also increases.

The subframe periods are divided into address periods (Ta) and sustain periods (Ts). The address period is a period required for inputting digital video signals into all of the pixels during one subframe period, and the sustain period (also referred to as a turn on period) denotes a period in which the EL element is made to either emit light or not to thereby perform display by the digital video signals inputted to the pixels in the address period.

The address periods (Ta) of SF1 to SFn are Ta1 to Tan, respectively. The sustain periods (Ts) of SF1 to SFn are Ts1 to Tsn, respectively.

The electric potential of the power source supply lines (V1 to Vx) is maintained at a predetermined electric potential (power source electric potential).

First, in the address period Ta, the electric potential of the opposing electrodes of both the display EL element 142 and the sensor EL element 132 is maintained at a level equivalent to the power source electric potential.

Then, a gate signal is fed to the gate signal line G1. Among the plural number of switching TFTs 140 of the display pixels 105 and the plural number of switching TFTs 130 of the sensor pixels 104, all the switching TFTs connected to the gate signal line G1 are turned into the ON state. Note that throughout this specification, a TFT in the ON state is referred to as driving of a TFT.

Next, the digital video signals from the source signal line driver circuit 102 are fed to the source signal lines (S1 to Sx) in the state that all the switching TFTs connected to the gate signal line G1 are turned into the ON state. The digital video signals have the information [0] or [1]. The digital video signals [0] and [1] are signals where one has a "Hi" (High) voltage while the other has an "Lo" (Low) voltage.

Then via the switching TFTs that are in the ON state, the digital video signals that are fed to the source signal lines (S1 to Sx) are fed to the gate electrode of the EL driving TFT, which is connected to the source region or the drain region of the switching TFTs.

Next, the gate signal is fed to the gate signal line G2, whereby all the switching TFTs 1501 that are connected to the gate signal line G2 turn into the ON state. Among the plural number of switching TFTs 140 of the display pixels 105 and the plural number of switching TFTs 130 of the sensor pixels 104, all the switching TFTs connected to the gate signal line G2 are turned into the ON state.

The digital video signals from the source signal line driver circuit 102 are then fed to the source signal lines (S1 to Sx) in the state that all the switching TFTs connected to the gate signal line G2 are turned into the ON state. Then via the switching TFTs that are in the ON state, the digital video signals that are fed to the source signal lines (S1 to Sx) are fed to the gate electrode of the EL driving TFT, which is connected to the source region or the drain region of the switching TFTs.

The above-described operation is repeated until the gate signal is fed to the gate signal line Gy to thereby input the digital video signals to all the display pixels 105 and the sensor pixels 104. A period until the completion of inputting the digital video signals to all the display pixels 105 and the sensor pixels 104 is the address period. Note that the lengths of the respective address periods (Ta1 to Tan) of the "n" number of sub-frame periods are all the same.

Upon the completion of the address period Ta, a sustain period begins. In the sustain period, the electric potential of all the opposing electrodes of the EL elements is set to a level where it has an electric potential difference with the power source electric potential to the extent that the EL element emits light when the power source electric potential is applied to the pixel electrode.

Thereafter, in the sustain period, all the switching TFTs of the display pixels 105 and the sensor pixels 104 are turned into the OFF state. The digital video signal fed to the display pixels 105 and the sensor pixels 104 is then fed to the gate electrode of the EL driving TFT of each of the pixels.

In the embodiment mode, when the digital video signal has the information [0], then the EL driving TFT is turned into the OFF state. Therefore, the pixel electrode of the EL element is in the state of being maintained at the electric potential of the opposing electrode. As a result, the EL element of the pixel to which the digital video signal having the information [0] is inputted does not emit light.

On the other hand, when the digital video signal has the information [1], then the EL driving TFT is turned into the ON state in the embodiment mode. Therefore, the power source electric potential is applied to the pixel electrode of the EL element. As a result, the EL element of the pixel to which the digital video signal having the information [1] is inputted emits light.

Thus, the EL element either emits light or not depending on the information of the digital video signal to the pixels, whereby the pixels perform display.

Upon completion of the sustain period, 1 subframe period ends. Then the next subframe period appears and turns into an address period again. At the point the digital video signals have been fed to all the pixels, a sustain period begins again. It is to be noted that the order of appearance of the sub-frame periods is arbitrary.

The same operation is repeated in the rest of the sub-frame periods to thereby perform display. Upon the completion of the "n" number of sub-frame periods, 1 frame period ends.

Further, in the present invention, a ratio of the lengths of the "n" number of sustain periods Ts1, . . . , Tsn is expressed as Ts1: Ts2: Ts3: . . . : Ts(n−1): Tsn=$2^0$: $2^{-1}$: $2^{-2}$: . . . : $2^{-(n-2)}$: $2^{-(n-1)}$.

The gradation of each pixel is determined by which subframe period is selected for light emission during one frame period. For example, if n=8, and the luminance of pixels having light emitted during all of the sustain periods is taken as 100%, then in case of the pixels emitting light in Ts1 and Ts2, the luminance is expressed as 70%, and when Ts3, Ts5, and Ts8 are selected, the luminance can be expressed as 16%.

Note that in the embodiment mode, the EL element did not emit light because the electric potential of the opposing electrode was maintained at an electric potential that is equivalent to the power source electric potential in the address period. However, the present invention is not limited to this structure. An electric potential difference to the extent that EL element emit light when the power source electric potential is applied to the pixel electrode is constantly provided between the opposing electric potential and the power source electric potential. Thus, the address period, similarly to the display period, may also perform display. However, in this case, all the subframe periods actually become periods performing display, and therefore, the lengths of the subframe periods are set at SF1: SF2: SF3: . . . : SF(n−1): SFn=$2^0$: $2^{−1}$: $2^{−2}$: . . . : $2^{−(n−2)}$: 2−(n−1). By adopting the above structure, a high luminance image can be attained compared with the driving method where the address periods do not emit light.

As explained above, simultaneously with the display of an image in the display portion depending on the luminescent or non-luminescent state of the display EL elements, similar to the display EL elements, the sensor EL elements become either luminescent or non-luminescent state.

Next, an explanation will be made on the mechanism of the light receiving diode 136 detecting the luminance of the sensor EL element 132 in the sensor portion 106.

It is desirable that one of the reset TFT 134 and the buffer TFT 135 of the sensor pixel 104 is an n-channel TFT, and the remaining one is a p-channel TFT.

First, the reset TFT 134 is turned into the ON state depending on a reset signal that is fed to the rest signal line RL. Therefore, the standard electric potential of the sensor power source line VB is applied to gate electrode of the buffer TFT 135. The source region of the buffer TFT 135 is connected to the constant-current power source via the sensor output wiring FL, whereby the electric potential difference $V_{GS}$ of the gate electrode and the source region of the buffer TFT 135 is constantly at a fixed value. Accordingly, the source region of the buffer TFT 135 is held at an electric potential where $V_{GS}$ is subtracted from the standard electric potential. Note that in this specification, a period in which the reset TFT 134 is in the ON state is referred to as a reset period.

Next, the electric potential of the reset signal that is fed to the reset signal line RL is changed, whereby the reset TFT 134 is turned into the OFF state. Therefore, the standard electric potential of the sensor power source line VB is not applied to the gate electrode of the buffer TFT 135. Note that a period in which the reset TFT 134 is in the OFF state is referred to as a sample period in this specification.

In case of the EL display being driven by the digital method, the sample period is longer than the address period Ta and overlaps the sustain period Ts in which the sensor EL element 132 is emitting light.

The irradiation of the light generated from the sensor EL element 132 to the light receiving diode 136 makes a current flow in the light receiving diode 136. Therefore, the fixed electric potential of the gate electrode of the buffer TFT 135 in the reset period changes in the sample period. The amount of the change in the electric potential will alternates on the basis of the size of the current flowing in the light receiving diode 136.

The current flowing in the light receiving diode 136 is proportional to the strength of the light irradiated thereto. In other words, compared with when the luminance of the sensor EL element 132 is high and when the luminance thereof is low, a larger current flows to the light receiving diode 136 when the luminance thereof is high. Consequently, the electric potential of the gate electrode of the buffer TFT 135 undergoes a large change when the luminance of the sensor EL element 132 is high compared with when the luminance thereof is low.

Because the electric potential difference $V_{GS}$ of the source region and the gate electrode of the buffer TFT 135 is always a fixed value, the electric potential of the source region of the buffer TFT 135 is maintained at an electric potential in which $V_{GS}$ is subtracted from the electric potential of the gate electrode thereof. Thus, when the electric potential of the gate electrode of the buffer TFT 135 changes, the electric potential of the source region of the buffer TFT 135 changes together therewith.

The electric potential of the source region of the buffer TFT 135 is applied to the sensor output wiring FL to thereby be fed to a correction circuit as a sensor output signal.

Figure 6:
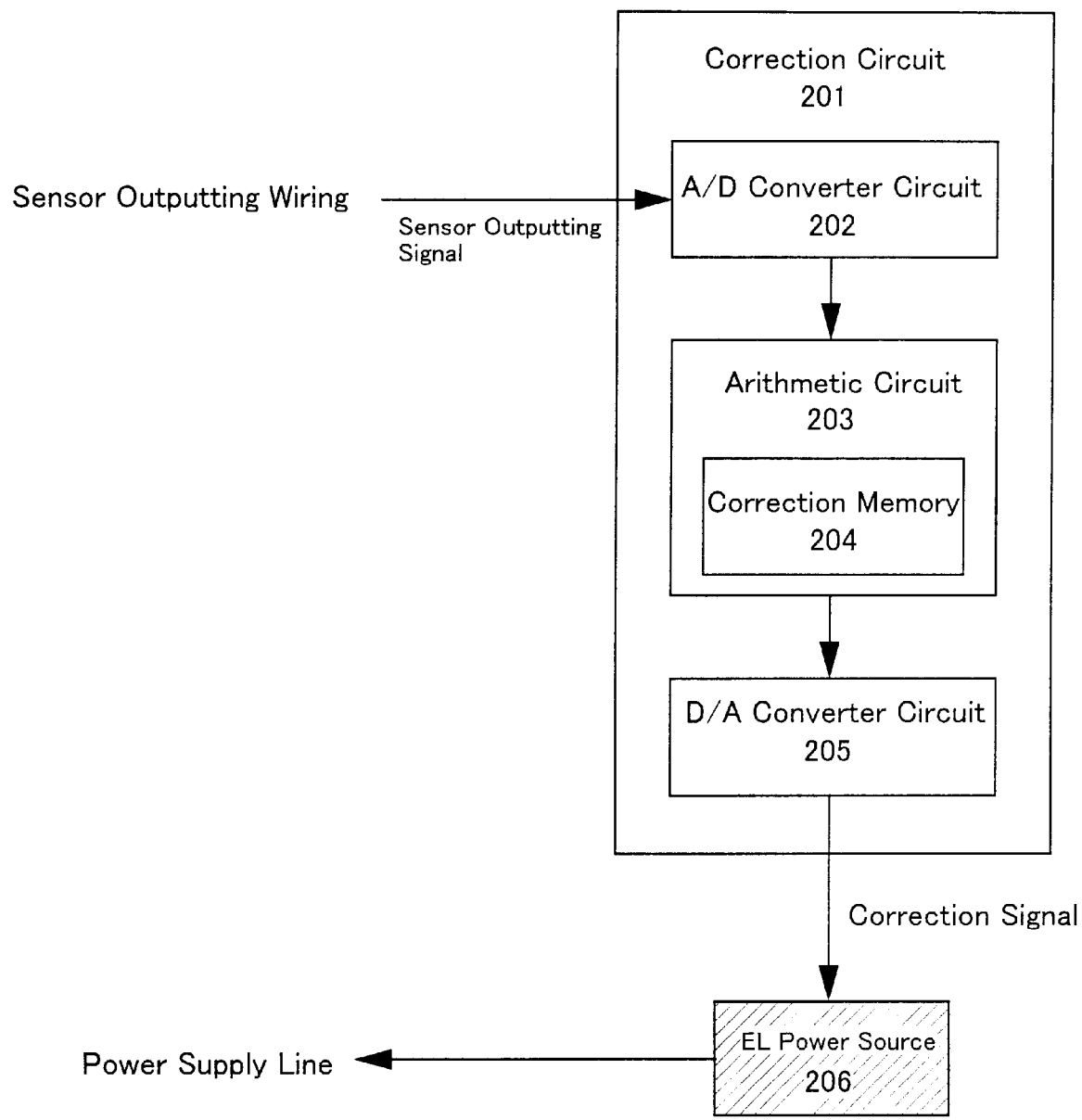
FIG. 6 is a block diagram of a correction circuit of an EL display of the present invention.

Shown in FIG. 6 is the block diagram of a correction circuit 201. The correction circuit 201 may be provided on the same substrate with the display portion 101 or the sensor portion 106. Further, it may be provided on an IC chip and be connected to the sensor portion 106 by an FPC or the like.

The correction circuit 201 is composed of an A/D converter circuit 202, a arithmetic circuit 203, a correction memory 204, and a D/A converter circuit 205. Note that although the structure of FIG. 6 shows a case where the correction memory 204 is constructed as a part of the arithmetic circuit 203, the correction memory 204 and the arithmetic circuit 203 may be provided separately.

The sensor output signal from the sensor output wiring FL is fed to the A/D converter circuit 202 to thereby be converted into a digital sensor output signal and be outputted therefrom. The digital sensor output signal outputted from the A/D converter circuit 202 is then fed to the arithmetic circuit 203.

When the sensor EL element 132 has an ideal luminance, the data of the digital sensor output signal (correction standard data) that is to be fed to the arithmetic circuit 203 is stored in the correction memory 204.

The arithmetic circuit 203 compares the digital sensor output signal that was actually fed to the arithmetic circuit 203 with the correction standard data stored in the correction memory 204. Then the arithmetic circuit 203 calculates, from the difference between the actual sensor output signal and the correction standard data that were compared, the level of the electric potential (power source electric potential) of the power source supply line V necessary for the display EL element 142 and the sensor El element 132 to obtain an ideal luminance. Thereafter, the arithmetic circuit 203 feeds the digital correction signal having the information of the level of the power source electric potential to the D/A converter circuit 205.

The digital correction signal that is fed to the D/A converter circuit 205 is converted into an analog signal to thereby be fed to an EL power source 206. The EL power source 206 applies an electric potential whose level is determined by the inputted analog correction signal to the power source supply lines (V1 to Vx). In case the luminance of the EL element is reduced, the correction mechanism works by regulating the power source electric potential of the power source supply lines so as to supplement the reduction thereof to thereby enhance the luminance of the EL element.

Note that when the EL display employs the three kinds of EL elements corresponding to the colors RGB, it is necessary to provide the correction circuit 201 and the EL power source 206 to each of the colors to be revised. In other words, in case of revising each of the colors RGB, the provision of 3 correction circuits 201 and 3 EL power sources 206 is necessary.

Furthermore, when the EL display employs an EL element emitting a single color such as white, blue, or blue-green, the provision of the correction circuit 201 and the EL power source 206 may be one of each, or the provision thereof may be for each color to be revised. The deterioration rate of the EL layer differs depending on the wavelength of the light irradiated thereto. Therefore, in case of the EL display employing the EL element emitting white light and a color filter, by providing the correction circuit 201 and the EL power source 206 to each of the colors to be revised, a more accurate correction can be made to the luminance of the EL element corresponding to each of the colors. As a result, a clearer image of a desirable color as well can be displayed.

In the present invention, by adopting the above structure, the display EL element 142 and the sensor EL element 132 are capable of having an ideal luminance, thereby making it possible for the EL display to perform a clear and desirable color display even if the EL layer in the EL display deteriorates.

Note that although the sensor portion has one of the sensor pixels corresponding to the respective colors RGB in the embodiment mode, the present invention is not limited thereto. A plurality of sensor pixels corresponding to each of the colors may be provided.

DETAILED DESCRIPTION OF THE PREFERRED EMBODIMENTS

Embodiments of the present invention are explained below.

Embodiment 1

Figure 7:
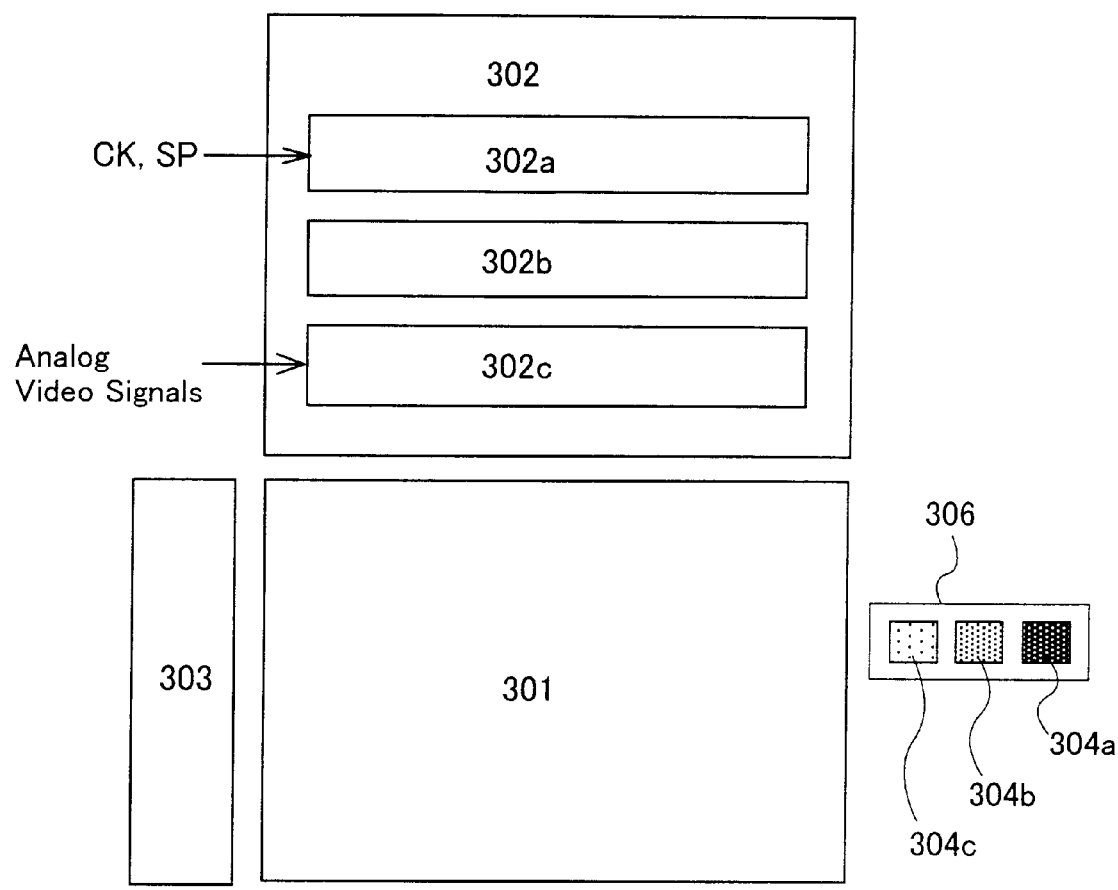
FIG. 7 is a schematic diagram of the top of an EL display of the present invention.
Figure 8:
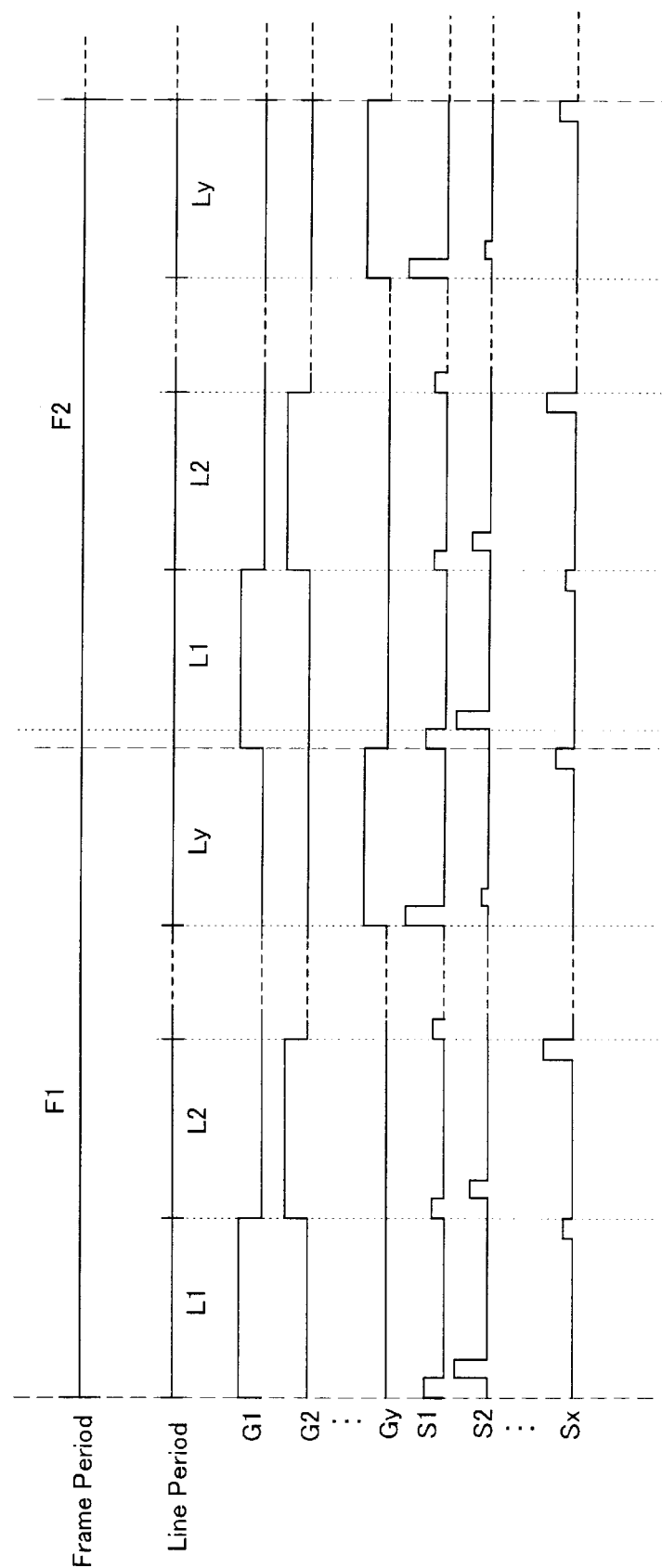
FIG. 8 is a timing chart when an EL display of the present invention is driven by an analog method.
Figure 9:
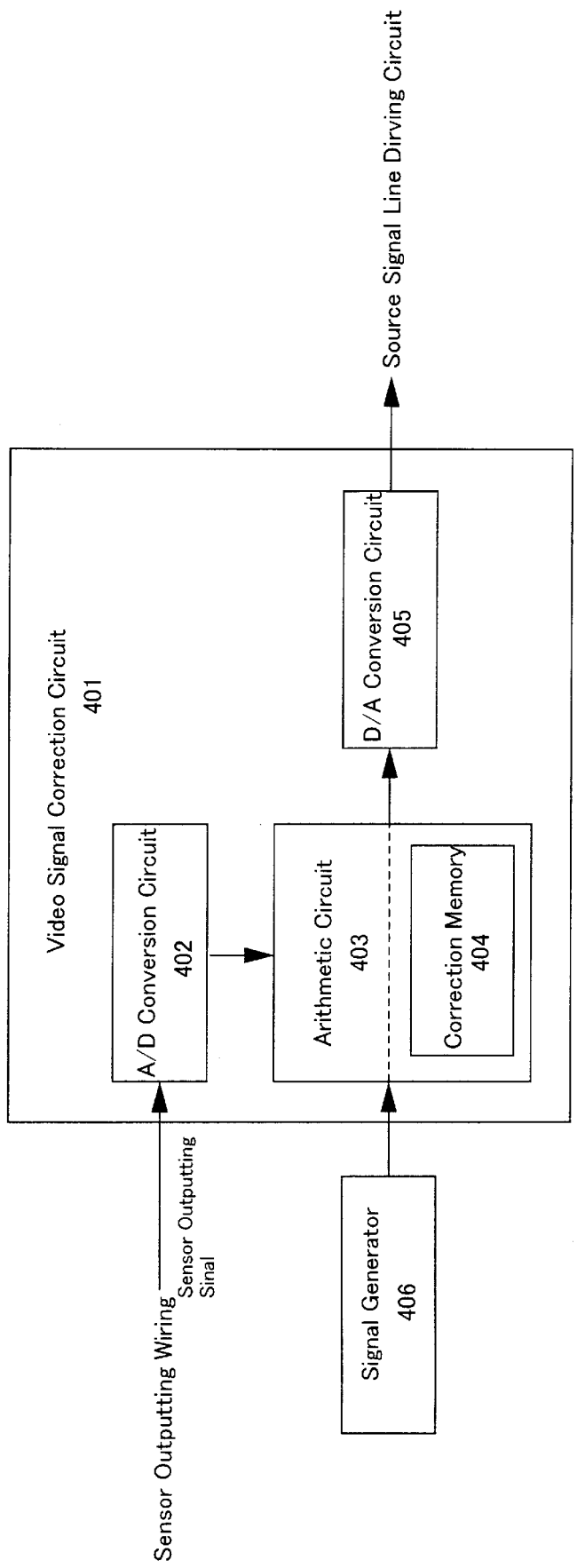
FIG. 9 is a block diagram of a video signal correction circuit of an EL display of the present invention.

An EL display of the present invention driven by an analog method is explained in Embodiment 1 using FIGS. 7 to 9.

Shown in FIG. 7 is a top view of an EL display, which is a portion of a semiconductor display device of the present invention. In Embodiment 1, an explanation will be made on an EL display for performing color display. However, the EL display of the present invention not only performs color display but may also perform monochrome display.

As shown in FIG. 7, there is provided a display portion 301, a source signal line driver circuit 302, a gate signal line driver circuit 303, and a sensor portion 306. The source signal line driver circuit 302 is composed of a shift register 302a, a level shifter 302b, and a sampling circuit 302c.

The sensor portion 306 has sensor pixels 304 (R sensor pixel 304a, G sensor pixel 304b, and B sensor pixel 304c) that correspond to the colors RGB, respectively. Note that an EL display of a color display system that employs three kinds of EL elements corresponding to the colors RGB is illustrated in Embodiment 1. However, Embodiment 1 is not limited thereto, and an EL display of a color display system that employs an EL element emitting white light may be used. Further, although the sensor portion 306 shown in Embodiment 1 has 3 sensor pixels that correspond to the colors RGB, respectively, the present invention is not limited thereto. Only sensor pixels that correspond to 1 or 2 colors of the colors RGB may be provided in the sensor portion.

The detailed structure of the display portion 301 and the sensor portion 306 is the same as for a case of driving by a digital method, and therefore, FIG. 2 is referenced. Note that the display portion 301, the sensor portion 306, the R sensor pixel 304a, the G sensor pixel 304b, and the B sensor pixel 304c, all of FIG. 7, correspond to the display portion 101, the sensor portion 106, the R sensor pixel 104a, the G sensor pixel 104b, and the B sensor pixel 104c, respectively, of FIG. 2.

Note that, in Embodiment 1, the sensor portion and the display portion are formed on the same substrate, but the present invention is not limited thereto. A structure may be such that the sensor portion and the display portion are formed on different substrates and connected by a connector such as an FPC.

The display portion 301 includes a plurality of display pixels. Note that the display pixels in Embodiment 1 correspond to the display pixels 105 in FIG. 2. The display pixels 105 each have any one of source signal lines (S1 to Sx), any one of power source supply lines (V1 to Vx), and any one of gate signal lines (G1 to Gy). There are 3 types of display pixels: a display pixel for displaying the color R; a display pixel for displaying the color G; and a display pixel for displaying the color B.

A source signal line Sp (where p is an arbitrary number between 1 and x), a power source supply line Vp, and a gate signal line Gq (where q is an arbitrary number between 1 and y) are contained in an arbitrarily selected display pixel (p, q) for displaying the color R. Also, similar to the display pixel (p, q), the source signal line Sp, the power source supply line Vp, and the gate signal line Gq are contained in the R sensor pixel 304a.

Also, the same source signal line, power source supply line, and gate signal line that are included in an arbitrarily selected display pixel for displaying the color G are also contained in the G sensor pixel 304b. Further, the same source signal line, power source supply line, and gate signal line that are contained in an arbitrarily selected display pixel for displaying the color B are also contained in the B sensor pixel 304c. The structures of the display pixel and the sensor pixel 304 are the same as for the case of driving by the digital method of FIG. 3 and FIG. 4, and therefore the embodiment mode may be referenced for an explanation of the structures.

Next, a description will be made on a driving method of an EL display of Embodiment 1.

FIG. 7 is referenced. In the source signal line driver circuit 302, a clock signal (CLK) and a start pulse (SP) are inputted to the shift register 302a. The shift register 302a sequentially generates timing signals on the basis of the clock signal (CLK) and the start pulse (SP) to thereby sequentially feed the timing signals to downstream circuits.

A timing signal from the shift register 302a has its voltage amplitude made larger in the level shifter 302b, and is inputted to the sampling circuit 302c. The sampling circuit 302c, in synchronous with the timing signal, then samples the signal having analog image information (analog video signal) in accordance with an analog switch, and the sampled signal is inputted to a corresponding source signal line.

Note that the source signal line driver circuit 302 may have a buffer. A large number of circuits or elements are connected to the wiring through which the timing signals are fed, so that the load capacitance (parasitic capacitance) due to those circuits or elements is large. The buffer is effective to prevent the sharpness of the rise or fall of the timing signals from being reduced due to this large load capacitance.

On the other hand, the gate signal line driver circuits 303 each have a shift register and a buffer (neither shown in the figures). Further, the gate signal line driver circuits 303 also may have level shifter circuits other than a shift register and a buffer.

The timing signal is supplied to the buffer (not shown in the figure) from the shift register (not shown in the figure) in the gate signal line driver circuit 303, and is then supplied to a corresponding gate signal line (also referred to as a scanning line). The gate electrodes of the switching TFT for one line are connected to the gate signal line, and all of the switching TFTs for one line must be turned ON simultaneously. Therefore, a buffer capable of handling a large electric current flow is used.

Note that the number of the source signal line driver circuits 302 and the gate signal line driver circuits 303, the circuit structures, and the methods of driving the circuits are not limited to the constitution shown in Embodiment 1.

Next, a timing chart for a case of driving the EL display of the present invention by the analog method is shown in FIG. 8. A period from the selection of one gate signal line in accordance with a gate signal until a different gate signal line is next selected is referred to as one line period (L). Further, a period from display of one image until display of the next image is referred to as one frame period (F). When there are y gate signal lines, there are y line periods (L1 to Ly) formed within one frame period.

First, power source supply lines (V1 to Vx) are maintained at a predetermined electric power source potential. An opposing electrode is also maintained at a predetermined electric potential. The electric potential of the opposing electrode has an electric potential difference with the electric power source potential to the extent that an EL element emits light when the electric power source potential is applied to a pixel electrode.

A selection signal is inputted to a gate signal line G1 in the first line period L1 from the gate signal line driver circuit 303. The sampled analog video signal is then inputted to source signal lines (S1 to Sx). All of the switching TFTs connected to the gate signal line G1 is turned ON in accordance with the selection signal, and therefore, the analog video signal inputted to the source signal lines is inputted to the gate electrodes of the EL driving TFTs through the switching TFTs.

The amount of electric current flowing in a channel forming region of the EL driving TFT is controlled by the height (voltage) of the electric potential of the signal inputted to its gate electrode. The height of the electric potential of the pixel electrode of the EL element is therefore determined by the electric potential of the analog signal inputted to the gate electrode of the EL driving TFT. The EL element is then controlled by the electric potential of the analog video signal and emits light.

The above-stated operations are repeated, and when the analog video signal is inputted to the source signal lines (S1 to Sx), the first line period L1 ends. Note that the period until completion of analog video signal inputted to the source signal lines (S1 to Sx) may also be taken together with a horizontal return period as one line period. The second line period L2 then begins, and the selection signal is inputted to the gate signal line G2. Then, similar to the first line period L1, the analog video signal is inputted to the source signal lines (S1 to Sx) in order.

When the selection signal is inputted to all of the gate signal lines (G1 to Gy), all of the line periods (L1 to Ly) are completed. One frame period is complete when all of the line periods (L1 to Ly) are complete. Display is performed in all of the pixels within one frame period, and one image is formed. Note that all of the line periods (L1 to Ly) may be taken together with a vertical return period as one frame period.

The luminance of the EL elements is thus controlled in accordance with the electric potential of the analog video signal inputted to the source signal lines, as above. Grayscale display is performed in accordance with the control of luminance.

An explanation of how the luminance of display EL elements and the luminance of sensor EL elements are corrected in accordance with a sensor output signal outputted from the sensor portion 306 is explained next using FIG. 9. Note that a light receiving diode detects the luminance of the sensor EL elements in the sensor pixel shown in FIG. 7. The processes until the sensor output signal is inputted to a sensor output wiring is the same as for the case of the digital drive EL display shown in the embodiment mode, and therefore, the explanation is omitted.

The sensor output signal having luminance information of the sensor EL element detected by the light receiving diode is inputted to a video signal correction circuit through a sensor output wiring FL in a sampling period.

A block diagram of a video signal correction circuit 401 is shown in FIG. 9. The video signal correction circuit 401 may be formed on the same substrate as the display portion 301 and the sensor portion 306, and it may also be formed on an IC chip and connected to the sensor portion 306 by an FPC or the like.

The video signal correction circuit 401 has an A/D converter circuit 402, an arithmetic circuit 403, a correction memory 404, and a D/A converter circuit 405. Note that a structure for a case in which the correction memory 404 is a portion of the arithmetic circuit 403 is shown in FIG. 9, but the correction memory 404 and the arithmetic circuit 403 may also be formed separately.

A signal generator 406 generates a signal having digital image information (digital video signal), and this is inputted to the arithmetic circuit 403. Note that when the signal having image information and output from the signal generator 406 (video signal) is analog, the signal is first converted to a digital video signal by the A/D converter circuit and then is inputted to the arithmetic circuit 403.

The sensor output signal is inputted to the A/D converter circuit 402 from the sensor output wiring FL, is converted into a digital sensor output signal, and is then outputted. The digital sensor output signal outputted from the A/D converter circuit 402 is then inputted to the arithmetic circuit 403.

When the display EL elements and the sensor EL elements have ideal luminances, the digital sensor output signal data inputted to the arithmetic circuit 403 (correction standard date) is stored in the correction memory 404.

The arithmetic circuit 403 compares the actual digital sensor output signal inputted to the arithmetic circuit 403 with the correction standard data stored in the correction memory 404. Then, based upon the comparative difference between the actual sensor output signal and the correction standard data, the digital video signal inputted to the arithmetic circuit 403 from the signal generator 406 is corrected. Note that it is very important that the digital video signal after correction at this time has the necessary electric potential in order to obtain ideal luminance levels in the display EL elements and the sensor EL elements when converted to analog.

Note that a sensor output signal corresponding to each display color is inputted to the arithmetic circuit 403. For example, the three sensor output signals outputted from the R sensor pixel 304a, the G sensor pixel 304b, and the B sensor pixel 304c are inputted to the arithmetic circuit 403 in Embodiment 1. The digital video signal is corrected such that an analog video signal having a desired height electric potential is sampled and inputted to pixels corresponding to each color (the display pixels and the sensor pixels).

The corrected digital video signal is next inputted to the D/A converter circuit 405 from the arithmetic circuit 403. The corrected digital video signal inputted to the D/A converter circuit 405 is converted to analog, and is then inputted to the sampling circuit 302c of the source signal line driver circuit 302 as an analog video signal. The analog video signal has a necessary electric potential in order to obtain the ideal luminance in the display EL elements and the sensor EL elements.

According to the above structure, in the present invention, the display EL elements and the sensor EL elements can have ideal luminances, even if the EL layer in the EL display deteriorates, and it becomes possible to perform the desired color display with clarity.

Note that the sensor portion has one each of sensor pixels corresponding to R, G, and B in Embodiment 1, but the present invention is not limited to this. A plurality of sensor pixels corresponding to each color may also exist.

Further, by correcting the electric potential of the analog video signal inputted to the display portion in the video signal correction circuit, the luminance of the EL elements is corrected with the analog drive EL display of Embodiment 1. However, the present invention is not limited to this. In addition to correcting the electric potential of the analog video signal in the video signal correction circuit, a correction circuit for correcting the electric power source potential may also be added, similar to the digital drive EL display.

Embodiment 2

A method of manufacturing an EL display which uses the present invention is explained using FIGS. 10A to 13B. A method of manufacturing a TFT of a sensor portion is explained here, but it is also possible to similarly manufacture a TFT of a display portion.

Figure 10A:
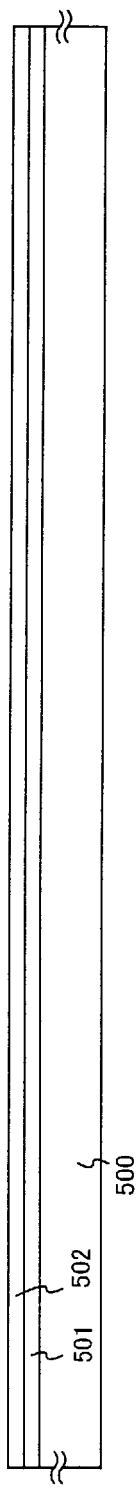
FIGS. 10A to 10E are diagrams showing a process of manufacturing an EL display of the present invention.

First, as shown in FIG. 10A, a base film 501 is formed to a thickness of 300 nm on a glass substrate 500. A silicon oxynitride film is laminated as the base film 501 in Embodiment 2. At this point, it is appropriate to set the nitrogen concentration to between 10 and 25 wt % in the film contacting the glass substrate 500. In addition, it is effective that the base film 501 has a thermal radiation effect, and a DLC (diamond-like carbon) film may also be provided.

Next, an amorphous silicon film (not shown in the figure) is formed with a thickness, of 50 nm on the base film 501 by a known deposition method. Note that it is not necessary to limit to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film thickness may be made from 20 to 100 nm.

The amorphous silicon film is then crystallized by a known technique, forming a crystalline silicon film (also referred to as a polycrystalline silicon film or a polysilicon film) 502. Thermal crystallization using an electric furnace, laser annealing crystallization using a laser light, and lamp annealing crystallization using an infrared lamp exist as known crystallization methods. Crystallization is performed in Embodiment 2 using an excimer laser light, which uses XeCl gas.

Note that pulse emission excimer laser light formed into a linear shape is used in Embodiment 2, but a rectangular shape may also be used. Continuous emission argon laser light and continuous emission excimer laser light can also be used.

In this embodiment, although the crystalline silicon film is used as the active layer of the TFT, it is also possible to use an amorphous silicon film as the active layer.

Note that it is effective to form the active layer of the switching TFT, in which there is a necessity to reduce the off current, by an amorphous silicon film, and to form the active layer of an EL driving TFT by a crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Figure 10B:
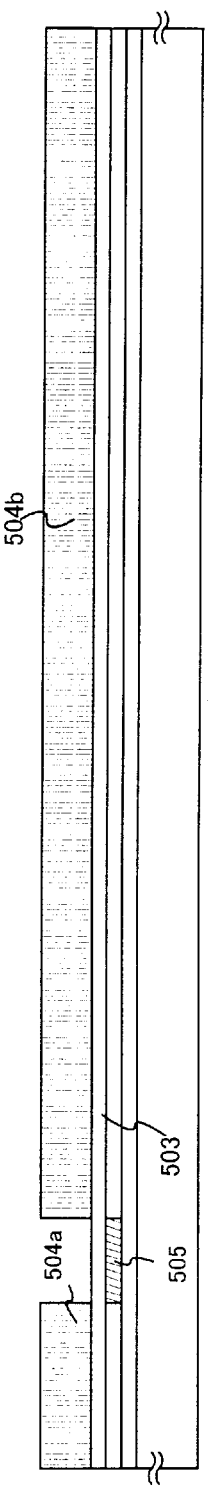

Next, as shown in FIG. 10B, a protective film 503 is formed on the crystalline silicon film 502 with a silicon oxide film having a thickness of 130 nm. This thickness may be chosen within the range of 100 to 200 nm (preferably between 130 and 170 nm). Furthermore, other films may also be used providing that they are insulating films containing silicon. The protective film 503 is formed so that the crystalline silicon film is not directly exposed to plasma during addition of an impurity, and so that it is possible to have delicate concentration control of the impurity.

Resist masks 504a and 504b are then formed on the protective film 503, and an impurity element, which imparts n-type conductivity (hereafter referred to as an n-type impurity element), is added through the protective film 503. Note that elements residing in periodic table group 15 are generally used as the n-type impurity element, and typically phosphorous or arsenic can be used. Note that a plasma doping method is used, in which phosphine ($PH_3$) is plasma-activated without separation of mass, and phosphorous is added at a concentration of $1 \times 10^{18}$ atoms/cm$^3$ in Embodiment 2. An ion implantation method, in which separation of mass is performed, may also be used, of course.

The dose amount is regulated such that the n-type impurity element is contained in an n-type impurity region (b) 505, thus formed by this process, at a concentration of $2 \times 10^{16}$ to $5 \times 10^{19}$ atoms/cm$^3$ (typically between $5 \times 10^{17}$ and $5 \times 10^{18}$ atoms/cm$^3$).

Figure 10C:
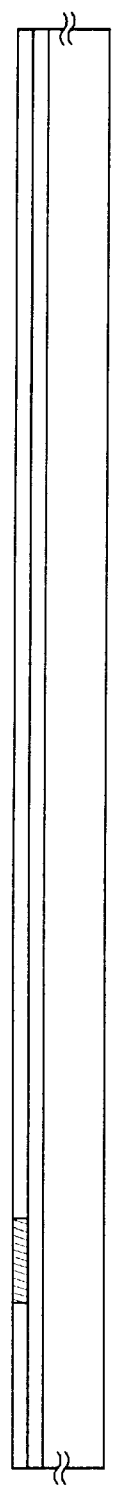

Next, as shown in FIG. 10C, the protective film 503 and the resist masks 504a and 504b are removed, and an activation of the added n-type impurity elements is performed. A known technique of activation may be used as the means of activation, but activation is done in Embodiment 2 by irradiation of excimer laser light (laser annealing). Of course, a pulse emission excimer laser and a continuous emission excimer laser may both, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protective film 503 in place.

The activation by heat treatment (furnace annealing) may also be performed along with activation of the impurity element by laser light. When activation is performed by heat treatment, considering the heat resistance of the substrate, it is good to perform heat treatment at on the order of 450 to 550° C.

A boundary portion (connecting portion) with end portions of the n-type impurity region (b) 505, namely regions, in which the n-type impurity element is not added, on the periphery of the n-type impurity region (b) 505, is delineated by this process. This means that, at the point when the TFTs are later completed, extremely good connecting portion can be formed between LDD regions and channel forming regions.

Figure 10D:
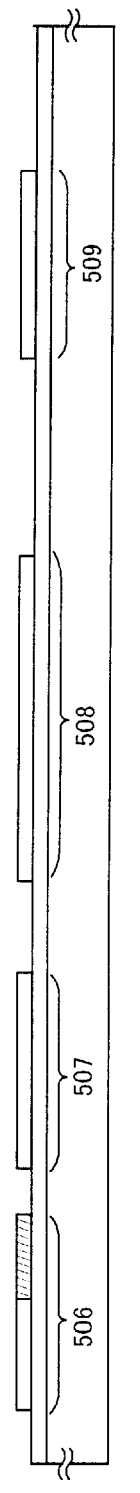

Unnecessary portions of the crystalline silicon film are removed next, as shown in FIG. 10D, and island-shape semiconductor films (hereafter referred to as active layers) 506 to 509 are formed.

Figure 10E:
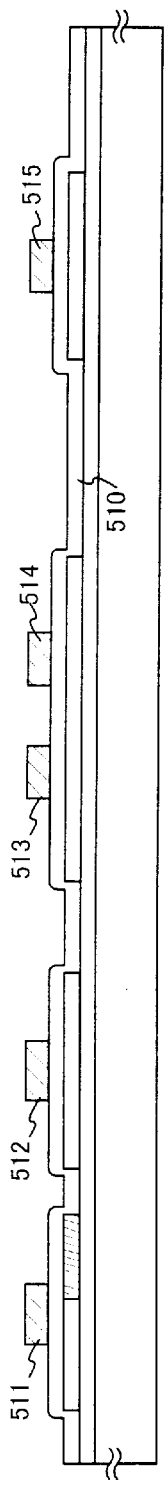

Then, as shown in FIG. 10E, a gate insulating film 510 is formed, covering the active layers 506 to 509. An insulating film containing silicon and with a thickness of 10 to 200 nm, preferably between 50 and 150 nm, may be used as the gate insulating film 510. A single layer structure or a lamination structure may be used. A 110 nm thick silicon oxynitride film is used in Embodiment 2.

Thereafter, a conductive film having a thickness of 200 to 400 nm is formed and patterned to form gate electrodes 511 to 515. In Embodiment 2, the gate electrodes and wirings (hereinafter referred to as gate wirings) electrically connected to the gate electrodes for providing conductive paths are formed of different materials from each other. More specifically, the gate wirings are made of a material having a lower resistivity than the gate electrodes. This is because a material enabling fine processing is used for the gate electrodes, while the gate wirings are formed of a material that can provide a smaller wiring resistance but is not suitable for fine processing. It is of course possible to form the gate electrodes and the gate wirings with the same material.

Although the gate electrode can be made of a single-layered conductive film, it is preferable to form a lamination film with more than two layers for the gate electrode if necessary. Any known conductive films can be used for the gate electrode. It should be noted, that it is preferable to use such a material that enables fine processing, and more specifically, a material that can be patterned with a line width of 2 μm or less.

Typically, it is possible to use a film made of an element selected from the group consisting of tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy or Mo—Ta alloy), or a silicide film of the above element (typically a tungsten silicide film or titanium silicide film). Of course, the films may be used as a single layer or a laminate layer.

In Embodiment 2, a laminate film of a tungsten nitride (WN) film having a thickness of 30 nm and a tungsten (W) film having a thickness of 370 nm is used. This may be formed by sputtering. When an inert gas such as Xe or Ne is added as a sputtering gas, film peeling due to stress can be prevented.

The gate electrode 511 is formed at this time so as to overlap a portion of the n-type impurity region (b) 505. This overlapping portion later becomes an LDD region overlapping the gate electrode (FIG. 10E).

Figure 11A:
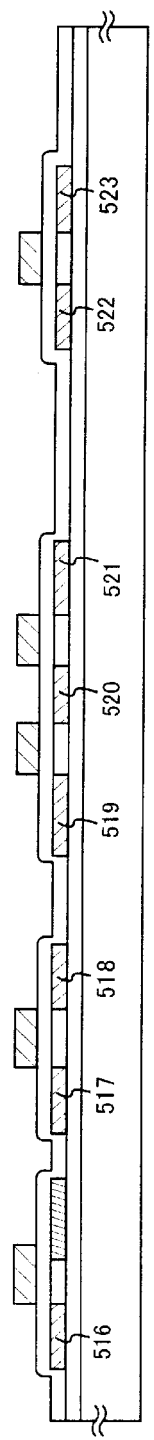
FIGS. 11A to 11D are diagrams showing the process of manufacturing the EL display of the present invention.

Next, an n-type impurity element (phosphorous is used in Embodiment 2) is added in a self-aligning manner with the gate electrodes 511 to 515 as masks, as shown in FIG. 11A. The addition is regulated such that phosphorous is added to n-type impurity regions (c) 516 to 523 thus formed at a concentration of 1/10 to ½ that of the n-type impurity region (b) 505 (typically between ¼ and ⅓). Specifically, a concentration of $1 \times 10^{16}$ to $5 \times 10^{18}$ atoms/cm$^3$ (typically $3 \times 10^{17}$ to $3 \times 10^{18}$ atoms/cm$^3$) is preferable.

Figure 11B:
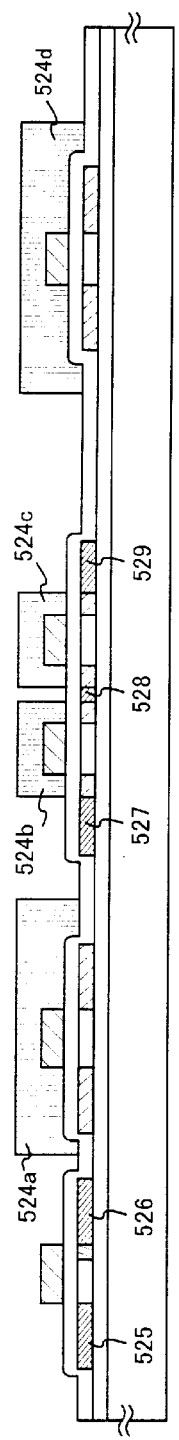

Resist masks 524a to 524c are formed next, with a shape covering the gate electrodes 512 to 515 and the like, as shown in FIG. 11B, and an n-type impurity element (phosphorous is used in Embodiment 2) is added, forming impurity regions (a) 525 to 529 containing phosphorous at high concentration. Ion doping using phosphine (PH$_3$) is also performed here, and the phosphorous concentration of these regions is regulated so as to be set to from $1 \times 10^{20}$ to $1 \times 10^{21}$ atoms/cm$^3$ (typically between $2 \times 10^{20}$ and $5 \times 10^{20}$ atoms/cm$^3$).

A source region or a drain region of the n-channel TFT is formed by this process, and in a switching TFT, a portion of the n-type impurity regions (c) 519 to 521 formed by the process of FIG. 11A is remained. These remaining regions correspond to LDD regions of the switching TFT.

Figure 11C:
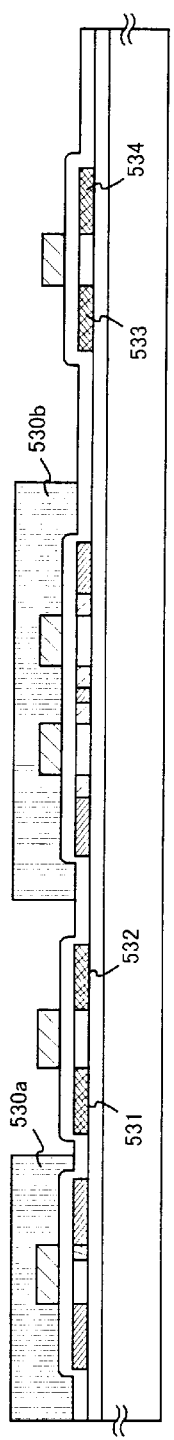
Figure 11D:
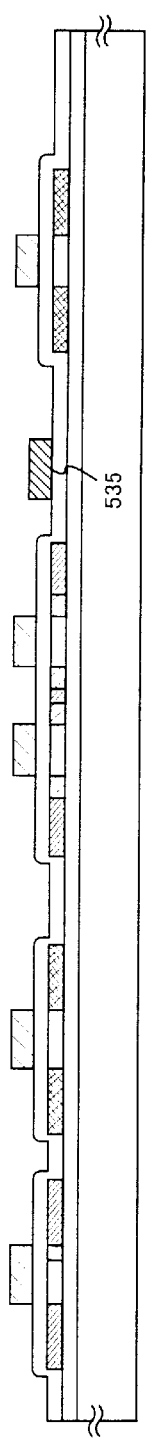

Next, as shown in FIG. 11C, the resist masks 524a to 524d are removed, and new resist masks 530a and 530b are formed. A p-type impurity element (boron is used in Embodiment 2) is then added, forming p-type impurity regions 531 to 534 containing boron at high concentration. Boron is added here to form the p-type impurity regions 531 to 534 at a concentration of $3 \times 10^{20}$ to $3 \times 10^{21}$ atoms/cm$^3$ (typically between $5 \times 10^{20}$ and $1 \times 10^{21}$ atoms/cm$^3$) by ion doping using diborane (B$_2$H$_6$).

Note that phosphorous has already been added to the p-type impurity regions 531 to 534 at a concentration of $1 \times 10^{20}$ to $1 \times 10^{21}$ atoms/cm$^3$, but boron is added here at a concentration of at least 3 times that of the phosphorous. Therefore, the n-type impurity regions already formed completely invert to p-type, and function as p-type impurity regions.

Next, after removing the resist masks 530a and 530b, the n-type or p-type impurity elements added to the active layer at respective concentrations are activated. Furnace annealing, laser annealing or lamp annealing can be used as a means of activation. In Embodiment 2, heat treatment is performed for 4 hours at 550° C. in a nitrogen atmosphere in an electric furnace.

At this time, it is critical to eliminate oxygen from the surrounding atmosphere as much as possible. This is because when even only a small amount of oxygen exists, an exposed surface of the gate electrode is oxidized, which results in an increased resistance and later makes it difficult to form an ohmic contact with the gate electrode. Accordingly, the oxygen concentration in the surrounding atmosphere for the activation process is set at 1 ppm or less, preferably at 0.1 ppm or less.

After the activation process is completed, a gate wiring (gate signal line) 535 having a thickness of 300 nm is formed. As a material for the gate wiring 535, a metal film containing aluminum (Al) or copper (Cu) as its main component (occupied 50 to 100% in the composition) can be used. The gate wiring 335 is arranged so as to provide electrical connection for the gate electrodes 513 and 514 of the switching TFT (see FIG. 11D).

The above-described structure can allow the wiring resistance of the gate wiring to be significantly reduced, and therefore, an image display region (display portion) with a large area can be formed. More specifically, the pixel structure in accordance with Embodiment 2 is advantageous for realizing an EL display device having a display screen with a diagonal size of 10 inches or larger (or 30 inches or larger.)

A first interlayer insulating film 537 is formed next, as shown in FIG. 12A. A single layer insulating film containing silicon is used as the first interlayer insulating film 537, or a lamination film may be used. Further, a film thickness of between 400 nm and 1.5 μm may be used. A lamination structure of an 800 nm thick silicon oxide film on a 200 nm thick silicon oxynitride film is used in Embodiment 2.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen, which is thermally activated. Plasma hydrogenation (using hydrogen activated by plasma) may also be performed as another means of hydrogenation.

Note that the hydrogenation processing may also be inserted during the formation of the first interlayer insulating film 537. Namely, hydrogen processing may be performed as above after forming the 200 nm thick silicon oxynitride film, and then the remaining 800 nm thick silicon oxide film may be formed.

Next, a contact hole is formed in the first interlayer insulating film 537, and source wirings 538 to 541 and drain wirings 542 to 545 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by sputtering. Of course, other conductive films may be used.

A first passivation film 547 is formed next with a thickness of 50 to 500 nm (typically between 200 and 300 nm) as shown in FIG. 12B. A 300 nm thick silicon oxide nitride film is used as the first passivation film 547 in Embodiment 2. This may also be substituted by a silicon nitride film. Note that it is effective to perform plasma processing using a gas containing hydrogen such as $H_2$ or $NH_3$ before the formation of the silicon oxynitride film. Hydrogen activated by this preprocess is supplied to the first interlayer insulating film 537, and the film quality of the first passivation film 547 is improved by performing heat treatment. At the same time, the hydrogen added to the first interlayer insulating film 537 diffuses to the lower side, and the active layers can be hydrogenated effectively.

Next, a second interlayer insulating film 548 made of organic resin is formed. As the organic resin, it is possible to use polyimide, polyamide, acryl, BCB (benzocyclobutene) or the like. Especially, since the second interlayer insulating film 548 is primarily used for leveling, acryl excellent in leveling properties is preferable. In this embodiment, an acrylic film is formed to a thickness sufficient to level a stepped portion formed by TFTs. It is appropriate that the thickness is made 1 to 5 $\mu$m (more preferably, 2 to 4 $\mu$m) (FIG. 12B).

Next, a contact hole is formed in the second interlayer insulating film 548 and the first passivation film 547 so as to reach the drain wiring 543, and a cathode electrode 549 of a light receiving diode (photoelectric converting element) is formed so as to contact the drain wiring 543. Aluminum formed by sputtering is used in this metallic film in Embodiment 2, but other metals, for example titanium, tantalum, tungsten, and copper can also be used. Further, a lamination film made from titanium, aluminum, and titanium may also be used.

Patterning is next performed after depositing an amorphous silicon film containing hydrogen over the entire surface of the substrate, and a photoelectric converting layer 550 is formed. A transparent conductive film is formed on the entire surface of the substrate next. A 200 nm thick ITO film is deposited by sputtering as the transparent conductive film in Embodiment 2. The transparent conductive film is patterned, forming an anode electrode 551. (See FIG. 12C.)

A third interlayer insulating film 553 is then formed, as shown in FIG. 13A. A level surface can be obtained by using a resin such as polyimide, polyamide, polyimide amide, or acrylic as the third interlayer insulating film 553. A polyimide film having a thickness of 0.7 $\mu$m is formed over the entire surface of the substrate as the third interlayer insulating film 553 in Embodiment 2.

A contact hole is next formed in the third interlayer insulating film 553, the second interlayer insulating film 548, and the first passivation film 547 so as to reach the drain wiring 545, and a pixel electrode 555 is formed. Further, a contact hole for reaching the anode electrode 551 is formed in the third interlayer insulating film 553, and a sensor wiring 554 is formed. A 110 nm thick ITO (indium tin oxide) film is formed in Embodiment 2, and then patterning is performed, forming the sensor wiring 554 and the pixel electrode 555 at the same time. Furthermore, indium oxide mixed with between 2 and 20% of zinc oxide (ZnO) may also be used as the transparent conductive film. The pixel electrode 555 becomes an EL element anode.

A bank 556 is formed next from a resin material. The bank 556 may be formed by patterning an acrylic film or polyimide film having a thickness of 1 to 2 $\mu$m. The bank 556 is formed having a stripe shape between pixels. The bank 556 may be formed along and on the source wiring 540, and it may also be formed along and on the gate wiring 535. Note that a material such as a pigment may be mixed into the resin material forming the bank 661, and the bank 661 may be used as a shielding film.

An EL layer 557 and a cathode (MgAg electrode) 558 are formed next in succession without exposure to the atmosphere by using vacuum evaporation. Note that the film thickness of the EL layer 557 may be from 80 to 200 nm (typically between 100 and 120 nm), and the thickness of the cathode 558 may be from 180 to 300 nm (typically between 200 and 250 nm). In addition, only one pixel is shown in Embodiment 2, but an EL layer for emitting red color light, an EL layer for emitting green color light, and an EL layer for emitting blue color light are formed simultaneously.

EL layers 557 are sequentially formed with respect to the pixel corresponding to the color red, the pixel corresponding to the color green, and the pixel corresponding to the color blue, respectively, by this process. However, the EL layers 557 have little resistance to solution, and therefore, the EL layers 557 for the respective colors must be formed separately without using photolithography. It is then preferable to cover locations other than that of the desired pixels by using a metal mask, and then form the EL layers 557 selectively only in required locations.

In other words, first, a mask for covering everything except for the pixel corresponding to the color red is set, and an EL layer which emits red color light is selectively formed using the mask. A mask for covering everything except for the pixel corresponding to the color green is set next, and an EL layer which emits green color light is selectively formed using the mask. Finally, a mask for covering all areas outside of the pixel corresponding to the color blue is set, and an EL layer which emits blue color light is selectively formed using the mask. Note that a case of using different masks is stated here, but the same mask may also be reused. Further, it is preferable to perform processing without releasing the vacuum until the EL layers of all of the pixels have been formed.

Note that the EL layer 557 is a single layer structure composed of only a light emitting layer in Embodiment 2, but the EL layer 557 may also have a hole transport layer, a hole injection layer, an electron transport layer, and an electron injection layer. Various examples of this type of combination have already been reported upon, and any of these structures may be used. Known materials can be used as the EL layer 557. It is preferable to use an organic material as the known material, considering the EL driver voltage.

The cathode 558 is formed next. An example of using an MgAg electrode as the cathode of an EL element is shown in Embodiment 2, but it is also possible to use other known materials.

An active matrix substrate having the structure shown in FIG. 13B is thus completed. Note that the processes after forming the bank 556 and until the formation of the cathode 558 may be performed in succession, without exposure to the atmosphere, using a multi-chamber method (or in-line method) thin film formation apparatus.

Note also that a method of manufacturing a TFT of a sensor portion is explained in Embodiment 2, but a TFT of a display portion and a driver circuit TFT may also be formed simultaneously on the substrate.

A buffer TFT 570, which is an n-channel TFT, has a structure in Embodiment 2 in which hot carrier injection is reduced with as little drop in operating speed as possible, as shown in FIG. 13B. An active layer of the buffer TFT 570 contains a source region 580, a drain region 581, an LDD region 582, and a channel forming region 583. The LDD region 582 overlaps the gate electrode 511 through the gate insulating film 510.

The formation of the LDD region on only the drain region side is in consideration of not causing the operating speed to drop. Further, it is not necessary to be too concerned with the value of the off current for the buffer TFT 570, and more importance may be placed on the operating speed. It is therefore preferable for the LDD region 582 to completely overlap with the gate electrode 511, and to reduce resistive components as much as possible. Namely, the so-called offset should be eliminated.

Furthermore, degradation due to hot carrier injection is almost of no concern for a reset TFT 571 and an EL driving TFT 573, which are p-channel TFTs, and therefore LDD regions do not have to be formed in particular. It is also possible, of course, to form an LDD region similar to that of an n-channel TFT to take action against hot carriers.

An active layer of a switching TFT 572 in Embodiment 2 contains a source region 590, a drain region 591, LDD regions 592 to 595, channel forming regions 596 and 597, and a separation region 598. The LDD regions 592 to 595 are formed so as not to overlap with the gate electrodes 513 and 514 through the gate insulating film 510. This type of structure is extremely effective in reducing the off current.

Further, the switching TFT 572 has a double gate structure, and by using the double gate structure, this effectively becomes a structure having two TFTs connected in series, and has the advantage of being capable of reducing the value of the off current. Note that the double gate structure is used in Embodiment 2, but a single gate structure may also be used, and a multiple gate structure possessing more than three gates may also be used.

Note also that, in practice, after completing through FIG. 13B, it is preferable to perform packaging (sealing) using a protective film (such as a laminate film or an ultraviolet hardened resin film), or a light transmitting sealing member, having high airtight properties and little outgassing, in order to have no exposure to the atmosphere. The EL element reliability is increased if the inside of the sealing member is filled with an inert gas atmosphere and a drying agent (barium oxide, for example) is arranged within the sealing member.

Further, after increasing airtightness by the packaging process, the device is completed as a manufactured product by attaching a connector (flexible printed circuit, FPC) for connecting terminals pulled around from the elements or circuits formed on the substrate with external signal terminals. This shipping-ready state is referred to as an EL display (EL module) throughout this specification.

Note that it is possible to implement Embodiment 2 in combination with Embodiment 1.

Embodiment 3

An example in which light emitted from an EL element is irradiated to the side of a substrate on which TFTs are formed is explained in Embodiment 2. Using FIG. 14, an example of irradiating light emitted from an EL element to the opposite side of the substrate on which TFTs are formed is explained in Embodiment 3.

Although a p-channel TFT was used for the EL driving TFT in Embodiment 2, an n-channel TFT was used for the EL driving TFT in this embodiment. Accordingly, the active later in the EL driving TFT was covered with a mask in a process for adding n-type impurity, and the active layer in the EL driving TFT was not covered with the mask in the process for adding p-type impurity.

After forming a third interlayer insulating film 653, a contact hole for reaching a drain wiring 645 is formed in the third interlayer insulating film 653, a second interlayer insulating film 648, and a first passivation film 647. A pixel electrode 655 is then formed. Further, a contact hole is formed in the third interlayer insulating film 653 in order to reach an anode electrode 651, and a sensor wiring 654 is formed. A 300 nm thick aluminum alloy film (an aluminum film containing 1 wt % of titanium) is formed in Embodiment 3, and patterning is then performed, simultaneously forming the sensor wiring 654 and the pixel electrode 655. Note that although the pixel electrode and the sensor wiring are formed using an aluminum alloy film in Embodiment 3, the present invention is not limited to this, and MgAg may also be used. Further, it is possible to use all other materials known to be used as an EL element cathode.

Figure 14:
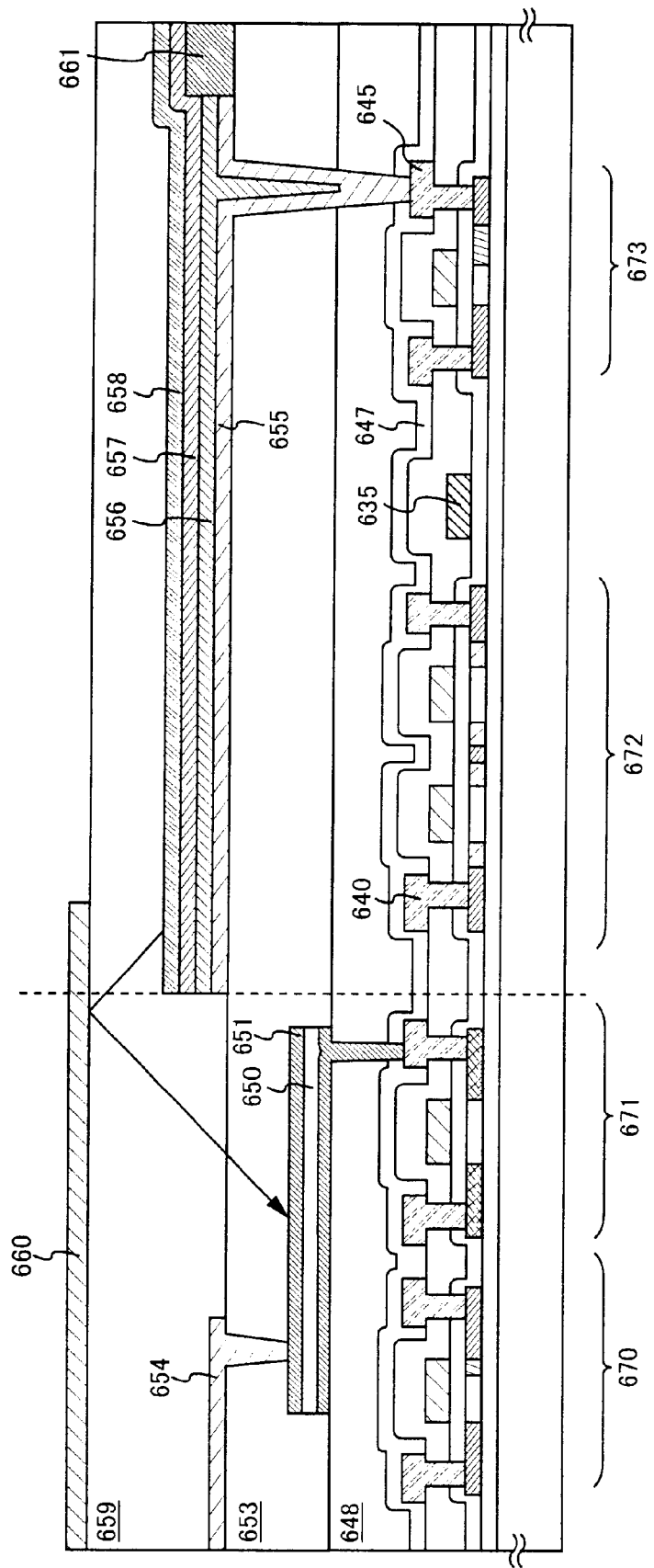
FIG. 14 is a cross sectional diagram of an EL display of the present invention.

A bank 661 made of a resin material is formed next, as shown in FIG. 14. The bank 661 may be formed by patterning an acrylic film or a polyimide film having a thickness of 1 to 2 $\mu$m. The bank 661 is formed in a stripe shape between pixels. The bank 661 may be formed on and along a source wiring (source signal line) 640, and may be formed on and along a gate wiring (gate signal line) 635. Note that a material such as a pigment may be mixed into the resin material forming the bank 661, and the bank 661 may be used as a shielding film.

A light emitting layer 656 is formed next. Specifically, an organic EL material which becomes the light emitting layer 656 is dissolved in a solvent such as chloroform, dichloromethane, xylene, toluene, or tetrahydrobenzene, and applied. The solvent is then vaporized by performing heat treatment, and the organic EL material light emitting layer is formed.

Note that only one pixel is shown in Embodiment 3, but a light emitting layer for emitting red color light, a light emitting layer for emitting green color light, and a light emitting layer for emitting blue color light are formed simultaneously. In Embodiment 3, Cyano-polyphenylene vinylene is formed as the red color light emitting layer, polyphenylene vinylene is formed as the green light emitting layer, and polyalkylphenylene is formed as the blue light emitting layer, each having a thickness of 50 nm. Further, 1,2-dichloromethane is used as the solvent, and heat treatment is performed by hotplate at a temperature of 80 to 150° C. for between 1 and 5 minutes, vaporizing moisture.

A 20 nm thick hole injection layer 657 is formed next. The hole injection layer 657 may be formed common for all pixels, and therefore it may be formed using spin coating or printing. Polythiophene (PEDOT) in aqueous solution is applied in Embodiment 3, and then heat treatment is performed for 1 to 5 minutes by using a hotplate at a temperature from 100 to 150° C., vaporizing moisture. Polyphenylene vinylene and polyalkylphenylene do not dissolve in water, and therefore it is possible in this case to form the hole injection layer 657 without dissolution of the light emitting layer 656.

Note that it is also possible to use a low molecular weight organic EL material as the hole injection layer 657. In that case, it may be formed by evaporation.

A two layer structure of a light emitting layer and a hole injection layer is taken as the EL layer in Embodiment 3, but in addition, a hole transport layer, an electron injection layer, and an electron transport layer may also be formed. Various examples of this type of combination have already been reported upon, and any of these structures may be used.

An anode 658 is formed, as an opposing electrode, of a 120 nm thick transparent conductive film after formation of the light emitting layer 656 and the hole injection layer 657. A transparent conductive film in which 10 to 20 wt % of zinc oxide is added to indium oxide is used in Embodiment 3. It is preferable to form the anode 658 by evaporation at room temperature so as not to cause degradation of the light emitting layer 656 and the hole injection layer 657.

A fourth interlayer insulating film 659 is formed once the anode 658 is formed. A level surface can be obtained by using a resin such as polyimide, polyamide, polyimide amide, or acrylic as the fourth interlayer insulating film 659. A 0.7 µm thick polyimide film is formed over the entire surface of the substrate as the fourth interlayer insulating film 659 in Embodiment 3.

Next, an aluminum alloy film (an aluminum film containing 1 wt % of titanium) is formed with a thickness of 300 nm on the fourth interlayer insulating film 659. Patterning is performed, forming a reflecting plate 660. It is very important to form the reflecting plate 660 in a position such that light emitted by the EL element is reflected in the reflecting plate 660 and is made incident to a photoelectric converting layer 650 of a light receiving diode.

Note that, although the reflecting plate 660 is formed using an aluminum alloy film in Embodiment 3, the present invention is not limited to this. It is possible to use a known material provided that it is a non-transparent metal. For example, a film of an element selected from the group consisting of copper (Cu), silver (Ag), tantalum (Ta), titanium (Ti), molybdenum (Mo), tungsten (W), chromium (Cr), and silicon (Si); or a nitride film of one of these elements (typically a tantalum nitride film, a tungsten nitride film, or a titanium nitride film); or an alloy film of a combination of these elements (typically an Mo—W alloy or an Mo—Ta alloy); or a silicide film of one of these elements (typically a tungsten silicide film or a titanium silicide film) can be used. A single layer structure and a lamination structure may be used, of course.

An active matrix substrate having a structure as shown in FIG. 14 is thus completed. Note that reference numeral 670 denotes a buffer TFT, reference numeral 671 denotes a reset TFT, 672 denotes a switching TFT, and 673 denotes an EL driving TFT.

Note also that the process of manufacturing the TFT of the sensor portion is explained in Embodiment 3, but a TFT of a display portion and a driver circuit TFT may also be formed on the substrate at the same time.

Further, after completing through FIG. 14, it is preferable in practice to perform packaging (sealing) using a protective film (such as a laminate film or an ultraviolet hardened resin film), or a light transmitting sealing member, having high airtight properties and little outgassing, in order to have no exposure to the atmosphere. The reliability of the EL elements is increased if the inside of the sealing member is filled with an inert gas atmosphere and a drying agent (barium oxide, for example) is arranged within the sealing member.

Further, after increasing airtightness by the packaging process, the device is completed as a manufactured product by attaching a connector (flexible printed circuit, FPC) for connecting terminals pulled around from the elements or circuits formed on the substrate with external signal terminals. This shipping-ready state is referred to as an EL display (EL module) throughout this specification.

Note that it is possible to implement Embodiment 3 in combination with Embodiment 1.

Embodiment 4

An EL display of the present invention in which the structure of a sensor pixel differs from that of the embodiment mode and those of Embodiment 1 to Embodiment 3 is explained in Embodiment 4.

Figure 15:
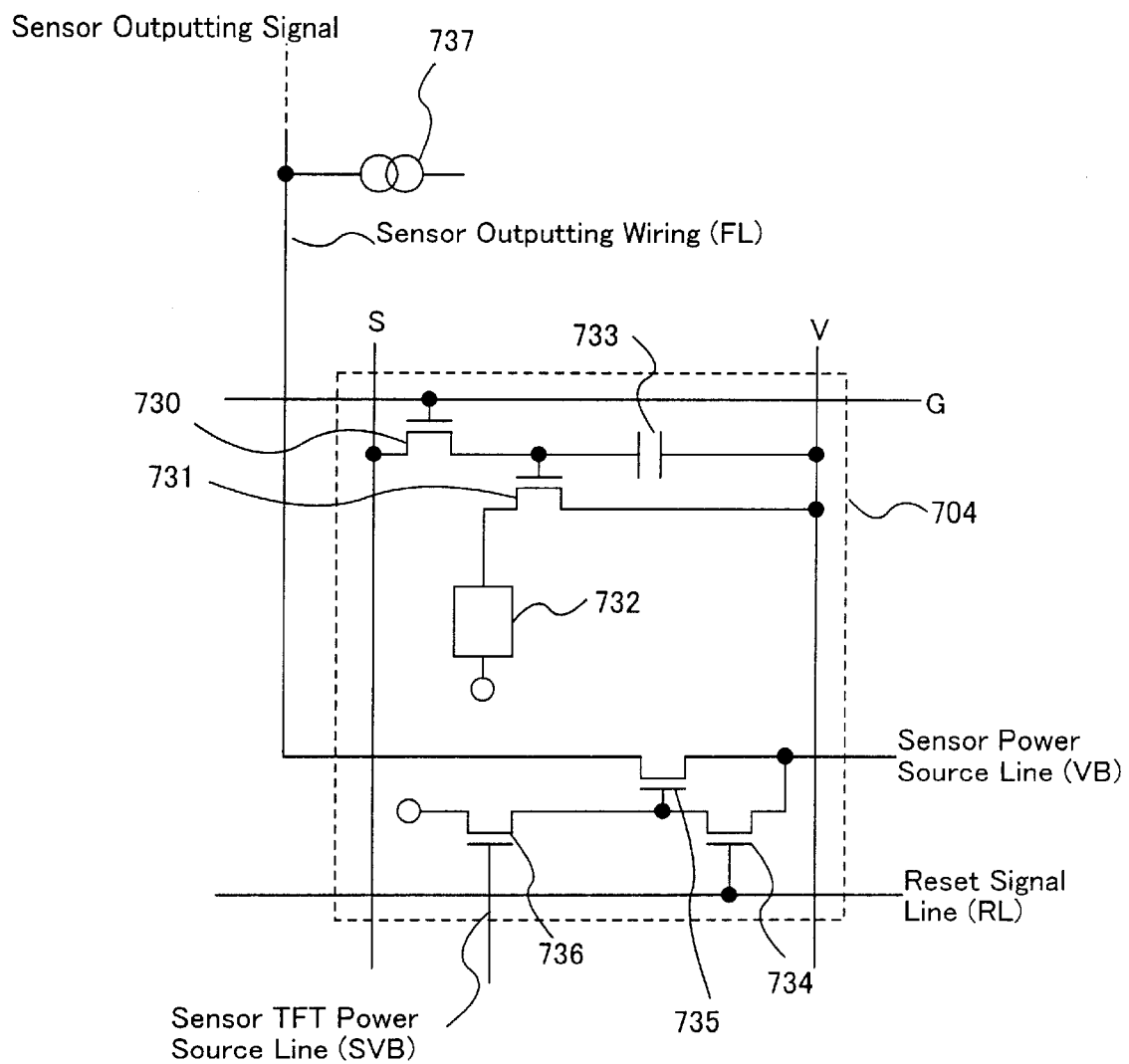
FIG. 15 is a circuit diagram of a sensor pixel of an EL display of the present invention.

A circuit diagram of the sensor pixel in the EL display of Embodiment 4 is shown in FIG. 15. A region that is surrounded by a dotted line is the sensor pixel 704. Contained in the sensor pixel 704 are a source signal line S (any one of the lines between (S1 and Sx)), a power source supply line V (any one of the lines between (V1 and Vx)), and a gate signal line G (any one of the lines between (G1 and Gy)).

In addition, the sensor pixel 704 has a switching TFT 730, an EL driving TFT 731, and a sensor EL element 732. A capacitor 733 is provided in the structure of FIG. 15, but the structure thereof may be formed without the provision of the capacitor 733.

The sensor EL element 732 is composed of an anode, a cathode, and an EL layer provided therebetween. When the anode is connected to a drain region of the EL driving TFT 731, the anode is a pixel electrode, and the cathode is an opposing electrode. On the other hand, when the cathode is connected to the drain region of the EL driving TFT 731, the cathode is the pixel electrode, and the anode is the opposing electrode.

A gate electrode of the switching TFT 730 is connected to the gate signal line G. One of a source region and a drain region of the switching TFT 730 is connected to the source signal line S, and the other is connected to a gate electrode of the EL driving TFT 731.

One of a source region and the drain region of the EL driving TFT 731 is connected to the power source supply line V, and the other is connected to the sensor EL element 732. The capacitor 733 is provided so as connected to the gate electrode of the EL driving TFT 731 and the power source supply line V.

Further, the sensor pixel 704 has a reset TFT 734, a buffer TFT 735, and a sensor TFT 736.

It is preferable that one of the reset TFT 734 and the buffer TFT 735 of the sensor pixel 704 be an n-channel TFT and that the remaining TFT be a p-channel TFT. Furthermore, it is preferable that the polarity of the buffer TFT 735 and the sensor TFT 736 be the same.

A gate electrode of the reset TFT 734 is connected to a reset signal line RL. A source region of the reset TFT 734 is connected to a sensor power source line VB and a drain region of the buffer TFT 735. The sensor power source line VB is constantly held at a fixed electric potential (standard electric potential). Furthermore, a drain region of the reset TFT 734 is connected to a drain region of the sensor TFT 736 and a gate electrode of the buffer TFT 735.

A source region of the buffer TFT 735 is connected to a sensor output wiring FL. The sensor output wiring FL is further connected to a constant-current power source 737 and a fixed current constantly flows therein. Further, a drain region of the buffer TFT 735 is connected to the sensor power source line VB which is constantly maintained at a fixed standard electric potential. The buffer TFT 735 functions as a source follower.

A source region of the sensor TFT 736 is maintained at a predetermined electric potential. A gate electrode of the sensor TFT 736 is then connected to a sensor TFT power source line SVB and is always maintained at a fixed electric potential. The electric potential difference $V_{GS}$ between the gate electrode and the source region of the sensor TFT is maintained such that the sensor TFT is always maintained in the OFF state. Note that the source region and the gate electrode of the sensor TFT 736 may also have an electrically connected structure. In this case, the electric potential difference $V_{GS}$ between the gate electrode and the source region of the sensor TFT is 0 V, and therefore the sensor TFT will always be in the OFF state.

Drive of the sensor pixel 704 is explained next.

First, the reset TFT 734 is placed in the ON state in accordance with a reset signal inputted by the reset signal line RL. The standard electric potential of the sensor power source line VB is therefore applied to the gate electrode of the buffer TFT 735. The source region of the buffer TFT 735 is then connected to constant- current power source through the sensor output wiring FL, and the electric potential difference $V_{GS}$ between the source region and the gate electrode of the buffer TFT 735 is always fixed. The source region of the buffer TFT 735 is therefore maintained at an electric potential in which $V_{GS}$ is subtracted from the standard electric potential. Note that a period during which the reset TFT 734 is in the ON state is referred to as a reset period throughout this specification.

Next, the electric potential of the reset signal inputted to the reset signal line RL is changed and the reset TFT 734 is placed in the OFF state. The standard electric potential of the sensor power source line VB is therefore not applied to the gate electrode of the buffer TFT 735. Note that a period during which the reset TFT 734 is in the OFF state is referred to as a sample period throughout this specification.

Note also that it is possible to drive an EL display having the sensor pixel shown in Embodiment 4 by a digital method and by an analog method. For a case of digital drive, it is preferable that the sample period be longer than the address period Ta.

When light from the sensor EL element 732 is irradiated to the sensor TFT 736, the off current flows in a channel forming region of the sensor TFT 736. It is very important that the sensor TFT 736 be a bottom gate TFT. The electric potential of the gate electrode of the buffer TFT 735 therefore changes in the sample period, and the size of the electric potential change varies in accordance with the amount of off current flowing in the channel forming region of the sensor TFT 736.

The off current flowing in the channel forming region of the sensor TFT 736 is proportional to the strength of light irradiated to the sensor TFT 736 because the electric potential difference $V_{GS}$ between the gate electrode and the source region of the sensor TFT 736 is fixed. In other words, comparing when the luminance of the sensor EL element 732 is high and when it is low, when the luminance is high, a large off current flows in accordance with the channel forming region of the sensor TFT 736. Therefore, compared with when the luminance of the sensor EL element 732 is low, the changes in the electric potential of the gate electrode of the buffer TFT 735 become larger when the luminance is high.

The electric potential difference $V_{GS}$ between the source region and the gate electrode of the buffer TFT 735 is always fixed. Therefore, when the electric potential of the gate electrode of the buffer TFT 735 changes, the electric potential of the source region of the buffer TFT 735 also changes in accordance with the gate electrode change. The source region of the buffer TFT 735 is maintained at an electric potential in which $V_{GS}$ is subtracted from the electric potential of the gate electrode of the buffer TFT 735.

The electric potential of the source region of the buffer TFT 735 is applied to the sensor output wiring FL, and is inputted to a correction circuit or a video signal correction circuit as a sensor output signal.

Figure 16:
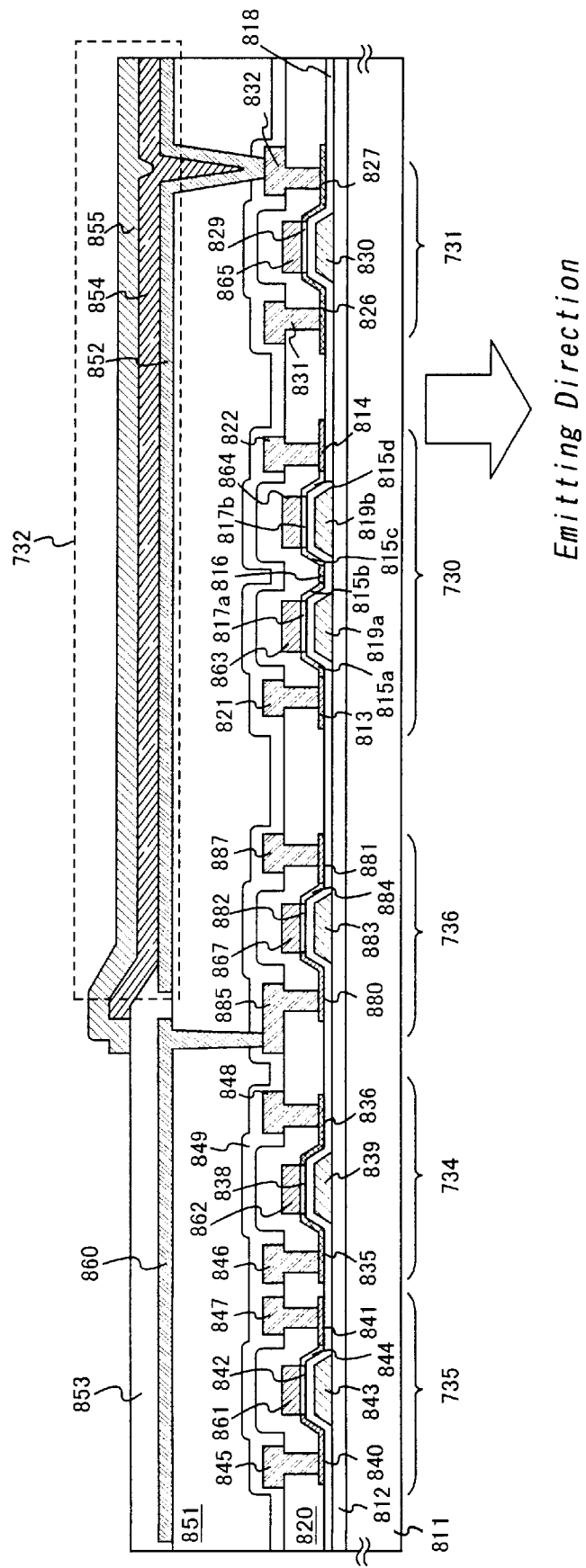
FIG. 16 is a cross sectional diagram of an EL display of the present invention.

A cross sectional diagram of an EL display of Embodiment 4 having the sensor pixel 704 is shown in FIG. 16. In FIG. 16, reference numeral 811 denotes a substrate and 812 denotes an insulating film which becomes a base (hereafter referred to as a base film). A transparent substrate, typically a glass substrate, a quartz substrate, a glass ceramic substrate, or a crystalline glass substrate can be used as the substrate 811. Note that a material which can withstand the maximum processing temperature attained during the manufacturing processes must be used.

Further, the base film 812 is particularly effective for a case of using a substrate containing a mobile ion and a substrate having conductivity need not be formed for a quartz substrate. An insulating film containing silicon may be used as the base film 812. Note that an "insulating film containing silicon" indicates an insulating film containing a predetermined ratio of oxygen and nitrogen with respect to silicon, such as a silicon oxide film, a silicon nitride film, or a silicon oxynitride film (denoted by SiOxNy, where x and y are arbitrary integers).

Reference numeral 735 denotes the buffer TFT, 734 denotes the reset TFT, 736 denotes the sensor TFT, 730 denotes the switching TFT, and 731 denotes the EL driving TFT. The buffer TFT 735, the switching TFT 730, and the sensor TFT 736 are each formed by an n-channel TFT. Further, the reset TFT 734 and the EL driving TFT 731 are both formed by a p-channel TFT.

When the direction of EL light emitted is toward the substrate side, it is preferable that the switching TFT and the EL driving TFT have the above structure. However, the present invention is not limited to this structure. The switching TFT and the EL driving TFT may be n-channel TFTs and may be p-channel TFTs. Furthermore, the reset TFT 734 and the buffer TFT 735 may have mutually differing polarities, and may be n-channel TFTs and may be p-channel TFTs. The sensor TFT 736 may also be an n-channel TFT or a p-channel TFT, provided that it has the same polarity as the buffer TFT 735.

The switching TFT 730 has an active layer containing a source region 813, a drain region 814, LDD regions 815a to 815d, a separation region 816, and channel forming regions 817a and 817b; a gate insulating film 818; gate electrodes 819a and 819b; a first interlayer insulating film 820; a source wiring (source signal line) 821; a drain wiring 822; and channel forming region protective films 863 and 864. Note that the gate insulating film 818 and the first interlayer insulating film 820 may be common among all TFTs on the substrate, or may differ depending upon the circuit or the element.

Furthermore, the switching TFT 730 shown in FIG. 16 is electrically connected to the gate electrodes 817a and 817b, becoming a double gate structure. A multi-gate structure (a structure containing an active layer having two or more channel forming regions connected in series) such as a triple gate structure, may of course also be used, in addition to the double gate structure.

The multi-gate structure is extremely effective in reducing the off current, and provided that the off current of the switching TFT is sufficiently lowered, a capacitor connected to the gate electrode of the EL driving TFT 731 can have its capacitance reduced to the minimum necessary. In other words, the surface area of the capacitor can be made smaller, and therefore using the multi-gate structure is also effective in expanding the effective light emitting surface area of the EL elements.

In addition, the LDD regions 815a to 815d are formed so as not to overlap the gate electrodes 819a and 819b through the gate insulating film 818 in the switching TFT 730. This type of structure is extremely effective in reducing the off current. Furthermore, the length (width) of the LDD regions 815a to 815d may be set from 0.5 to 3.5 $\mu$m, typically between 2.0 and 2.5 $\mu$m.

Note that forming an offset region (a region which is a semiconductor layer having the same composition as the channel forming region and to which the gate voltage is not applied) between the channel forming region and the LDD region is additionally preferable in a point that the off current is lowered. Further, when using a multi-gate structure having two or more gate electrodes, the separation region 816 (a region to which the same impurity element, at the same concentration, as that added to the source region or the drain region, is added) provided between the channel forming regions is effective in reducing the off current.

Next, the EL driving TFT 731 is formed having an active layer containing a source region 826, a drain region 827, and a channel forming region 829; the gate insulating film 818; a gate electrode 830, the first interlayer insulating film 820; a channel forming region 865; a source wiring 831; and a drain wiring 832.

Further, the drain region 814 of the switching TFT 730 is connected to the gate 830 of the EL driving TFT 731. Although not shown in the figure, specifically the gate electrode 830 of the EL driving TFT 731 is electrically connected to the drain region 814 of the switching TFT 730 through the drain wiring (also referred to as a connection wiring) 822. Note that the gate electrode 830 has a single gate structure, but a multi-gate structure may also be used. Further, the source wiring 831 of the EL driving TFT 731 is connected to a power source supply line (not shown in the figure).

The EL driving TFT 731 is an element for controlling the amount of electric current injected to the EL element, and a relatively large amount of current flows in the EL driving TFT 731. It is therefore preferable to design the channel width W to be larger than the channel width of the switching TFT 730. Further, it is preferable to design the channel length L such that an excess of electric current does not flow in the EL driving TFT 731. It is preferable to have from 0.5 to 2 $\mu$A (more preferably between 1 and 1.5 $\mu$A) per pixel.

In addition, by making the film thickness of the active layer (particularly the channel forming region) of the EL driving TFT 731 thicker (preferably from 50 to 100 nm, even better between 60 and 80 nm), degradation of the TFT may be suppressed. Conversely, in the case of the switching TFT 730 it is also effective to make the film thickness of the active layer (particularly the channel forming region) thinner (preferably from 20 to 50 nm, and more preferably between 25 and 40 nm) from the standpoint of making the off current smaller.

The buffer TFT 735, the reset TFT 734, and the sensor TFT 736 have source wirings 845, 846, and 885, respectively. Further, they similarly have drain wirings 847, 848, and 887; gate electrodes 843, 839, and 883; source regions 840, 835, and 880; channel forming regions 842, 838, and 882; drain regions 841, 836, and 881; the gate insulating film 818; the first interlayer insulating film 820; the channel forming region protective films 861, 862, and 867; and LDD regions 844a, 844b, 884a, and 884b, respectively.

Note that in Embodiment 4, the LDD regions 844a, 844b, 884a, and 884b are formed in the buffer TFT 735 and the sensor TFT 736, but a structure having no LDD regions may also be used. Further, a structure having one LDD region in each source region side or drain region side may also be used.

There is almost no concern with degradation of the reset TFT 734, which is a p-channel TFT, due to hot carrier injection, and therefore no LDD region need be formed in particular. It is possible to take measures against hot carrier injection by forming an LDD region similar to that of the buffer TFT 735 and the sensor TFT 736, which is an n-channel TFT, of course.

Note that the channel forming region protective films 861 to 865 are masks for forming the channel forming regions 842, 838, 817a, 817b, 829, and 882. It is necessary for light to pass through the channel forming region protective films 861 to 865.

Next, reference numeral 849 denotes a first passivation film, and its film thickness may be set from 10 nm to 1 $\mu$m (preferably between 200 and 500 nm). An insulating film containing silicon (in particular, it is preferable to use a silicon oxynitride film or a silicon nitride film) can be used as the passivation film material. The passivation film 847 possesses a role of protecting the TFTs from alkaline metals and moisture. Alkaline metals such as sodium are contained in an EL layer 854 formed on the final TFT (in particular, the EL driving TFT). In other words, the first passivation film 849 works as a protecting layer so that these alkaline metals (mobile ions) do not penetrate into the TFT side.

Further, reference numeral 851 denotes a second interlayer insulating film, which has a function as a leveling film for performing leveling of a step due to the TFTs. An organic resin film is preferable as the second interlayer insulating film 851, and one such as polyimide, polyamide, acrylic, or BCB (benzocyclobutene) may be used. These organic resin films have the advantages of easily forming a good, level surface, and having a low specific dielectric constant. The EL layer is extremely sensitive to unevenness, and therefore it is preferable to nearly absorb the TFT step by the second interlayer insulating film 851. In addition, it is preferable to form the low specific dielectric constant material thickly in order to reduce the parasitic capacitance formed between the gate signal wiring and the data signal wiring, and the cathode of the EL element. The thickness, therefore, is preferably from 0.5 to 5 $\mu$m (more preferably between 1.5 and 2.5 $\mu$m).

Further, reference numeral 852 denotes a pixel electrode (an anode of an EL element) made of a transparent conductive film. After forming a contact hole (opening) in the second interlayer insulating film 851 and in the first passivation film 849, the pixel electrode 852 is formed so as to be connected to the drain wiring 832 of the EL driving TFT 731. Further, reference numeral 860 denotes a sensor wiring made from a transparent conductive film, and after opening a contact hole (opening) in the second interlayer insulating film 851 and the first passivation film 849, the sensor wiring 860 is formed so as to connect to the source wiring 885 of the sensor TFT 736 in the formed opening, at the same time as the pixel electrode 852. Note that if the pixel electrode 852 and the drain region 827 are formed so as to not be directly connected as in FIG. 16, then alkaline metals of the EL layer can be prevented from entering the active layer via the pixel electrode.

A third interlayer insulating film 853 is formed on the pixel electrode 852 and the sensor wiring 860 from a silicon oxide film, a silicon nitride oxide film, or an organic resin film, with a thickness from 0.3 to 1 µm. An opening is formed in the third interlayer insulating film 853 over the pixel electrode 852 by etching, and the edge of the opening is etched so as to become a tapered shape. The taper angle may be set from 10 to 60°, (preferably between 30 and 50°).

An EL layer 854 is formed on the third interlayer insulating film 853. A single layer structure or a lamination structure can be used for the EL layer 854, but the lamination structure has good light emitting efficiency. In general, a hole injection layer, a hole transport layer, a light emitting layer, and an electron transport layer are formed in order on the electrode, but a structure having a hole transport layer, a light emitting layer, and an electron transport layer, or a structure having a hole injection layer, a hole transport layer, a light emitting layer, an electron transport layer, and an electron injection layer may also be used. Any known structure may be used by the present invention, and doping of a fluorescing pigment or the like into the EL layer may also be performed.

The structure of FIG. 16 is an example of a case of forming three types of EL elements corresponding to R, G, and B. Note that although only one pixel is shown in FIG. 16, pixels having an identical structure are formed corresponding to red, green and blue colors, respectively, and that color display can thus be performed. It is possible to implement the present invention without depending upon the method of color display.

A cathode 855 of the EL element is formed on the EL layer 854 as an opposing electrode. A material containing a low work coefficient material such as magnesium (Mg), lithium (Li), or calcium (Ca), is used as the cathode 855. Preferably, an electrode made from MgAg (a material made from Mg and Ag at a mixture of Mg:Ag=10:1) is used. In addition, a MgAgAl electrode, an LiAl electrode, and an LiFAl electrode can be given as other examples.

It is preferable to form the cathode 855 in succession, without exposure to the atmosphere, after forming the EL layer 854. This is because the interface state between the cathode 855 and the EL layer 854 greatly influences the light emitting efficiency of the EL element. Note that, throughout this specification, a light emitting element formed by a pixel electrode (anode), an EL layer, and a cathode is referred to as an EL element. Note also that FIG. 16 shows a cross sectional diagram of the sensor pixel, and therefore a location in which the pixel electrode 852, the EL layer 854, and the opposing electrode 855 are surrounded by a dotted line is the sensor EL element 732.

The lamination body composed of the EL layer 854 and the cathode 855 must be formed separately for each pixel, but the EL layer 854 is extremely weak with respect to moisture, and consequently a normal photolithography technique cannot be used. It is therefore preferable to use a physical mask material such as a metal mask, and to selectively form the layers by a gas phase method such as vacuum evaporation, sputtering, or plasma CVD.

Note that it is also possible to use a method such as ink jet printing or screen printing as the method of selectively forming the EL layer 854. However, the cathode cannot currently be formed in succession with these methods, and therefore it is preferable to use the other methods stated above.

Further, a protecting electrode may also be formed on the opposing electrode 855. The protecting electrode protects the cathode 855 from external moisture and the like, and at the same time is an electrode for connecting the cathodes 855 of each pixel. It is preferable to use a low resistance material containing aluminum (Al), copper (Cu), or silver (Ag) as the protecting electrode. The protecting electrode can also be expected to have a heat radiating effect which relieves the amount of heat generated by the EL layer. Further, it is effective to form the protecting electrode in succession, without exposure to the atmosphere, after forming the EL layer 854 and the cathode 855.

Note that it goes without saying that all of the TFTs shown in FIG. 16 may have a polysilicon film as their active layer.

The present invention is not limited to the structure of the EL display of FIG. 16, and the structure of FIG. 16 is only one preferred embodiment for implementing the present invention.

Embodiment 5

An example of an external view of an EL display of the present invention is explained in Embodiment 5.

Figure 17A:
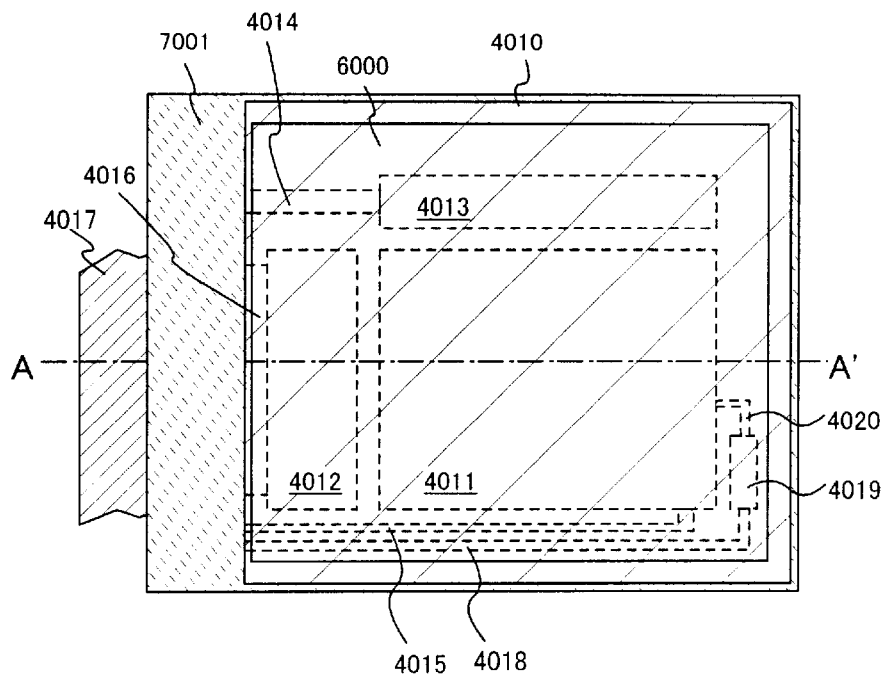
FIGS. 17A and 17B are external views of an EL display of the present invention.

FIG. 17A is a top view of an EL display of the present invention. In FIG. 17A, reference numeral 4010 denotes a substrate, reference numeral 4011 denotes a display portion, reference numeral 4012 denotes a source signal line driver circuit, and reference numeral 4013 denotes a gate signal line driver circuit. The driver circuits are connected to an external device via wirings 4014 to 4016, which lead to an FPC 4017.

Further, a sensor portion 4019 is connected to the display portion 4011 in by a wiring 4020, and is connected to a correction circuit or a video signal correction circuit provided outside the substrate by a wiring 4018 leading to the FPC 4017. Note that although the correction circuit, or the video signal correction circuit, is provided outside the substrate in Embodiment 5, the present invention is not limited to such, and the correction circuit, or the video signal correction circuit, may be provided on the substrate.

A cover member 6000, a sealing member (also referred to as a housing material) 7000, and a sealant (a second sealing member) 7001 are provided at this point so as to surround at least the display portion 4011 and the sensor portion 4019, and preferably to surround the driver circuits 4012 and 4013, the sensor portion 4019, and the display portion 4011.

Figure 17B:
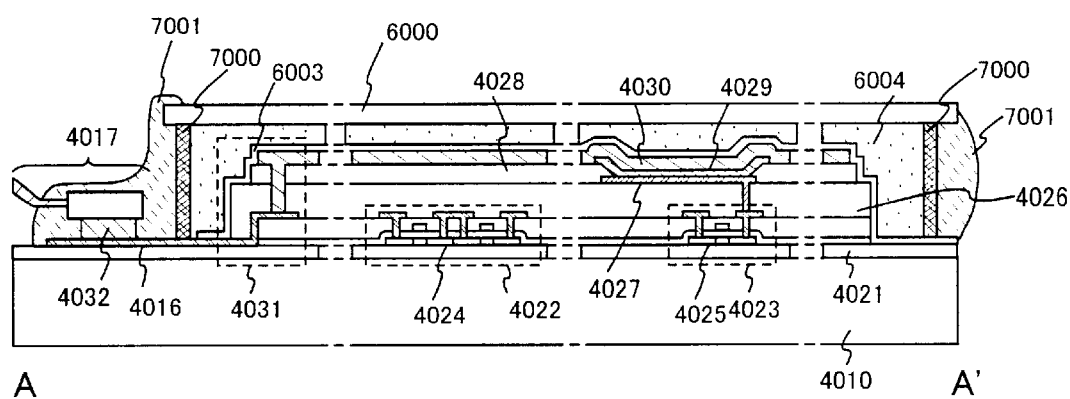

Further, FIG. 17B shows in cross section the structure of the EL display of Embodiment 5, and a driver circuit TFT (note that a CMOS circuit combining an n-channel TFT and a p-channel TFT is shown here) 4022 and a TFT of a display pixel (note that only an EL driving TFT for controlling the electric current to an EL element is shown here) 4023 are formed on the substrate 4010 and a base film 4021. Note that a TFT of a sensor pixel is not shown in the figure here. These TFTs have a known structure (a top gate structure or a bottom gate structure).

After the driver circuit TFT 4022 and the EL driver circuit TFT 4023 are completed using a known method of manufacture, a pixel electrode 4027 made from a transparent conductive film electrically connected to a drain of the EL driving TFT 4023 is formed on an interlayer insulating film (leveling film) 4023 made from a resin material. A compound of indium oxide and tin oxide (referred to as ITO) or a compound of indium oxide and zinc oxide can be used as the transparent conductive film. An insulating film 4028 is formed once the pixel electrode is formed, and an opening is formed on the pixel electrode 4027.

An EL layer 4029 is formed next. A lamination structure obtained by freely combining known EL materials (a hole injection layer, a hole transport layer, a light emitting layer, an electron transport layer, and an electron injection layer), or a single layer structure, may be used for the EL layer 4029. A known technique may be used to form such a structure. Further, there are low molecular weight materials and high molecular weight materials (polymer materials)

among the EL materials form forming the EL layer. An evaporation method is used when a low molecular weight material is used, while it is possible to use a simple method such as printing, or ink-jet method when a high molecular weight material is used.

The EL layer is formed by evaporation using a shadow mask in Embodiment 5. Color display becomes possible by forming light emitting layers (a red color light emitting layer, a green color light emitting layer, and a blue color light emitting layer) capable of emitting light at different wavelength for each pixel using the shadow mask. In addition, a method of combining a color changing layer (CCM) and a color filter, and a method of combining a white color light emitting layer and a color filter are available, and both may be used. A single color light emitting EL display can also be made, of course.

After forming the EL layer 4029, a cathode 4030 is formed on top. It is preferable to remove as much moisture and oxygen as possible from the interface between the cathode 4030 and the EL layer 4029. A method in which the EL layer 4029 and the cathode 4030 are formed in succession within a vacuum, or a method in which the EL layer 4029 is formed in an inert atmosphere and the cathode 4030 is then formed without exposure to the atmospheric air is therefore necessary. The above film formation can be performed by using a multi-chamber method (cluster chamber method) film formation apparatus.

Note that a lamination structure of a LiF (lithium fluoride) film and an Al (aluminum) film is used as the cathode 4030 in Embodiment 5. Specifically, a 1 nm thick LiF (lithium fluoride) film is formed by evaporation on the EL layer 4029, and a 300 nm thick aluminum film is formed on the LiF film. An MgAg electrode, which is a known cathode material, may of course be used instead. The cathode 4030 is then connected to the wiring 4016 in a region denoted by reference numeral 4031. The wiring 4016 is an power source supply line for applying a predetermined voltage to the cathode 4030, and is connected to the FPC 4017 through a conductive paste material 4032.

The cathode 4030 and the wiring 4016 are electrically connected in the region shown by reference numeral 4031, and therefore it is necessary to form contact holes in the interlayer insulating film 4026 and in the insulating film 4028. These contact holes may be formed during etching of the interlayer insulating film 4026 (when the pixel electrode contact hole is formed) and during etching of the insulating film 4028 (when forming the opening before forming the EL layer). Further, the contact holes may also be formed by etching in one shot through the interlayer insulating film 4026 when etching the insulating film 4028. A contact hole having a good shape can be formed in this case provided that the interlayer insulating film 4026 and the insulating film 4028 are formed from the same resin material.

A passivation film 6003, a filler material 6004 and the cover member 6000 are formed covering the surface of the EL element thus formed.

In addition, the sealing member 7000 is formed in a space defined by the cover member 6000 and the substrate 4010 so as to surround the EL element containing the pixel electrode 4027, the EL layer 4029, and the cathode 4030. The sealant (the second sealing member) 7001 is formed on the outside of the sealing member 7000.

Further, a filler 6004 is provided so as to cover the EL element. The filler 6004 also functions as an adhesive for bonding a cover member 6000. As the filler 6004, PVC (polyvinyl chloride), epoxy resin, silicone resin, PVB (polyvinyl butyral) or EVA (ethylene-vinyl acetate) may be used. Preferably, a desiccant is provided in the filler 6004 to maintain a moisture absorbing effect.

The filler 6004 may also contain a spacer. The spacer may be particles of BaO or the like so that the spacer itself has a moisture absorbing effect.

If a spacer is provided, the passivation film 6003 can reduce the spacer pressure. A resin film or the like may also be provided independently of the passivation film to reduce the spacer pressure.

As the cover member 6000, a glass sheet, an aluminum sheet, a stainless steel sheet, an FRP (fiberglass-reinforced plastic) sheet, a PVF (polyvinyl fluoride) film, a Mylar film, a polyester film, an acrylic film, or the like may be used. If PVB or EVA is used as the filler 6004, it is preferable to use a sheet having a structure in which an aluminum foil having a thickness of several tens of $\mu$m is sandwiched between PVF or Mylar films.

Some setting of the direction of luminescence from the EL element (the direction in which light is emitted) necessitates making the cover member 6000 transparent.

Also the wiring 4016 is electrically connected to the FPC (flexible printed circuit) 4017 by being passed through a gap between the sealing member 7000, the sealant 7001, and the substrate 4010. While the electrical connection of the wiring 4016 has been described, other wirings 4014, 4015, and 4018 are also connected electrically to the FPC 4017 by being passed under the sealing member 7000 and the sealant 7001.

In Embodiment 5, after the filler 6004 has been provided, the cover member 6000 is bonded and the sealing member 7000 is attached so as to cover the side surfaces (exposed surfaces) of the filler 6004. However, the filler 6004 may be provided after attachment of the cover member 6000 and the sealing member 7000. In such a case, a filler injection hole is formed which communicates with a cavity formed by the substrate 4010, the cover member 6000 and the sealing member 7000. The cavity is evacuated to produce a vacuum (at 10–2 Torr or lower), the injection hole is immersed in the filler in a bath, and the air pressure outside the cavity is increased relative to the air pressure in the cavity, thereby filling the cavity with the filler.

Embodiment 6

Figure 18A:
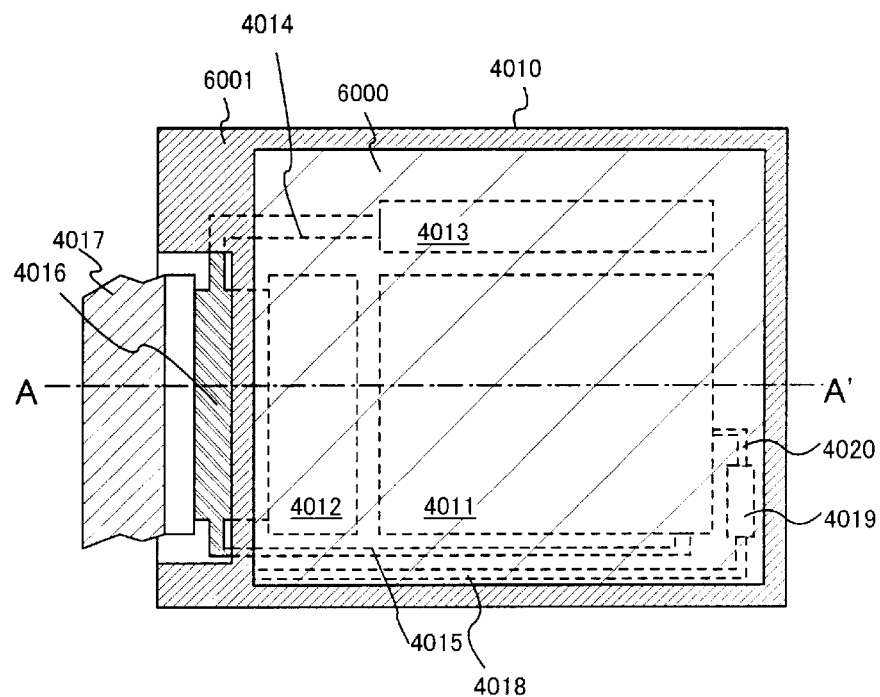
FIGS. 18A and 18B are external views of an EL display of the present invention.
Figure 18B:
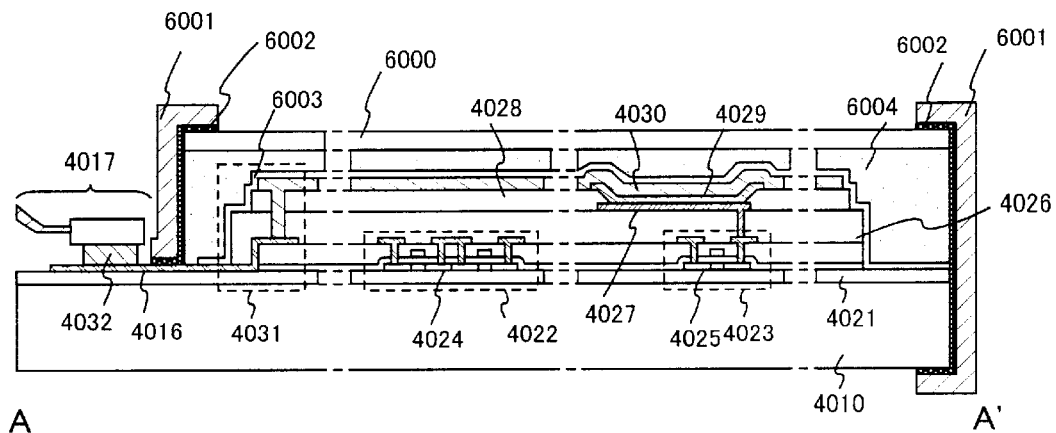

An example of an external view of an EL display of the present invention, differing from that of Embodiment 5, is explained in Embodiment 6 with reference to FIGS. 18A and 18B. Reference numerals which are the same as those of FIGS. 17A and 17B denote the same components, and therefore an explanation of these components is omitted.

FIG. 18A is a top view of the EL display of Embodiment 6, and FIG. 18B is a cross-sectional view taken along the line A–A' in FIG. 18A.

Internal portions of the EL device below a passivation film 6003 which covers a surface of the EL element are formed in the same manner as Embodiment 5.

The filler 6004 also functions as an adhesive for bonding a cover member 6000. As the filler 6004, PVC (polyvinyl chloride), epoxy resin, silicone resin, PVB (polyvinyl butyral) or EVA (ethylene-vinyl acetate) may be used. Preferably, a desiccant is provided in the filler 6004 to maintain a moisture absorbing effect.

The filler 6004 may also contain a spacer. The spacer may be particles of BaO or the like so that the spacer itself has a moisture absorbing effect.

If a spacer is provided, the passivation film 6003 can reduce the spacer pressure. A resin film or the like may also be provided independently of the passivation film to reduce the spacer pressure.

As the cover member 6000, a glass sheet, an aluminum sheet, a stainless steel sheet, an FRP (fiberglass-reinforced plastic) sheet, a PVF (polyvinyl fluoride) film, a Mylar film, a polyester film, an acrylic film, or the like may be used. If PVB or EVA is used as the filler 6004, it is preferable to use a sheet having a structure in which an aluminum foil having a thickness of several tens of $\mu$m is sandwiched between PVF or Mylar films.

Some setting of the direction of luminescence from the EL element (the direction in which light is emitted) necessitates making the cover member 6000 transparent.

Next, the cover member 6000 is bonded by using the filler 6004. Thereafter, a frame member 6001 is attached so as to cover side surfaces (exposed surfaces) of the filler 6004. The frame member 6001 is bonded by a sealing member 6002 (functioning as an adhesive). Preferably, a photo-setting resin is used as the sealing member 6002. However, a thermosetting resin may be used if the heat resistance of the EL layer is high enough to allow use of such a resin. It is desirable that the sealing member 6002 has such properties as to inhibit permeation of moisture and oxygen as effectively as possible. A desiccant may be mixed in the sealing member 6002.

Also wiring 4016 is electrically connected to a flexible printed circuit (FPC) 4017 by being passed through a gap between the sealing member 6002 and the substrate 4010. While the electrical connection of the wiring 4016 has been described, other wirings 4014, 4015 and 4018 are also connected electrically to the FPC 4017 by being passed under the sealing member 6002.

In Embodiment 6, after the filler 6004 has been provided, the cover member 6000 is bonded and the frame member 6001 is attached so as to cover the side surfaces (exposed surfaces) of the filler 6004. However, the filler 6004 may be provided after attachment of the cover member 6000, the sealing member 6002, and the frame member 6001. In such a case, a filler injection hole is formed which communicates with a cavity formed by the substrate 4010, the cover member 6000, the sealing member 6002, and the frame member 6001. The cavity is evacuated to produce a vacuum (at $10^{-2}$ Torr or lower), the injection hole is immersed in the filler in a bath, and the air pressure outside the cavity is increased relative to the air pressure in the cavity, thereby filling the cavity with the filler.

Embodiment 7

Figure 19:
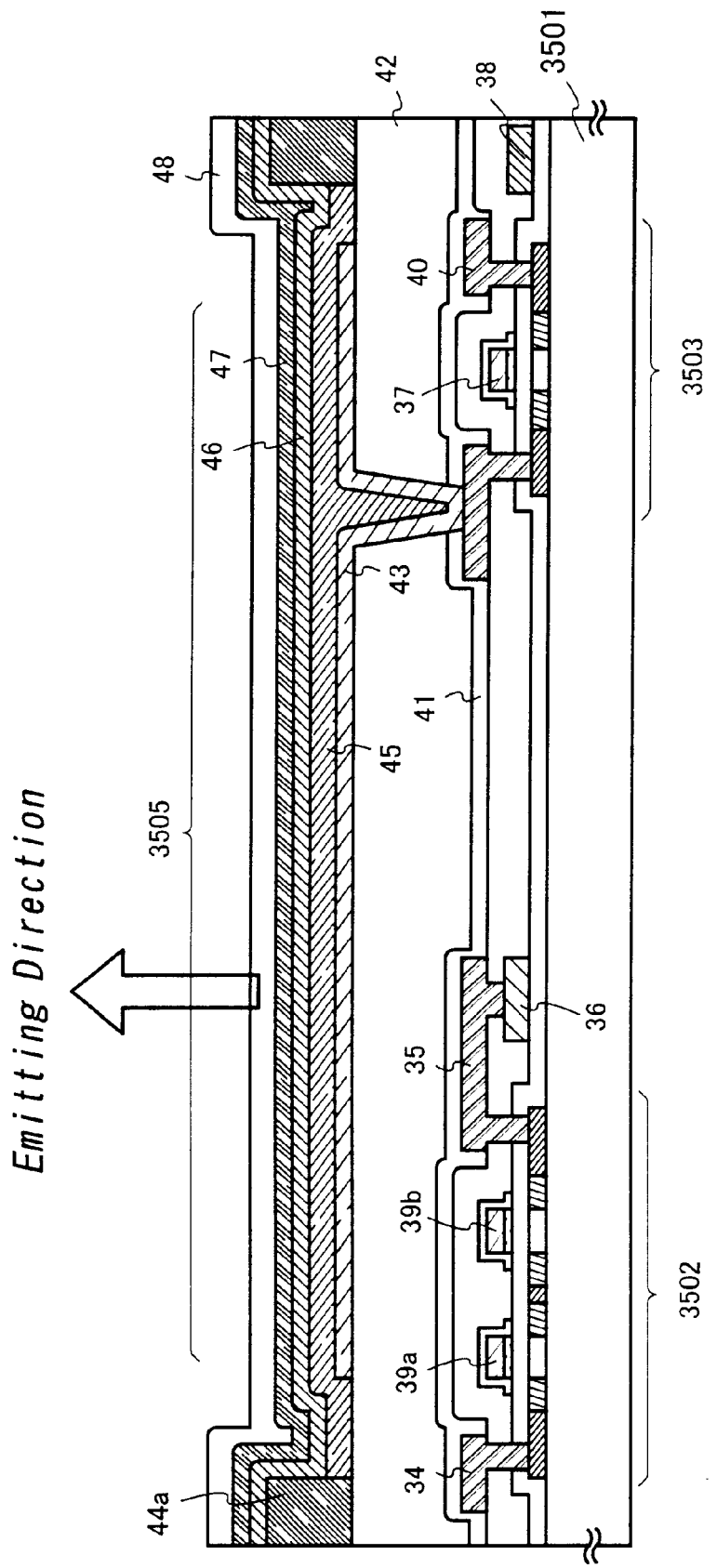
FIG. 19 is a cross sectional diagram of a display pixel of an EL display of the present invention.
Figure 20A:
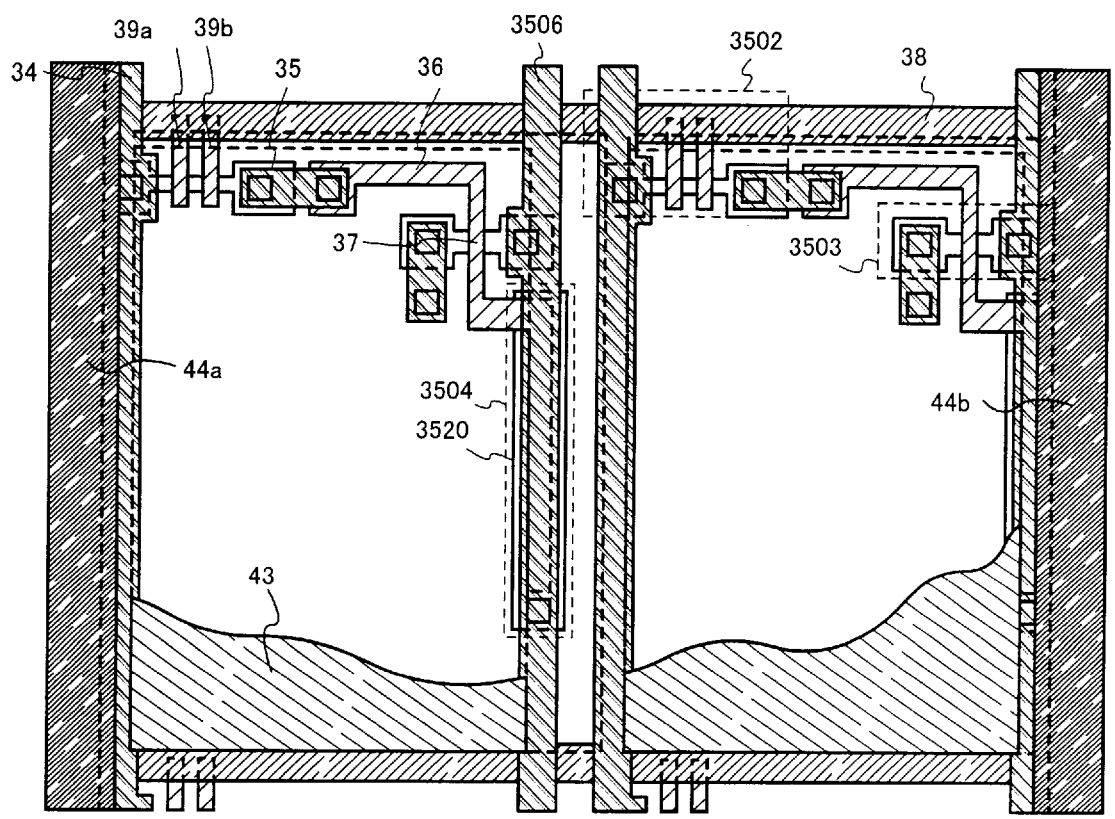
FIGS. 20A and 20B are a top view and a circuit diagram, respectively, of a display pixel of an EL display of the present invention.
Figure 20B:
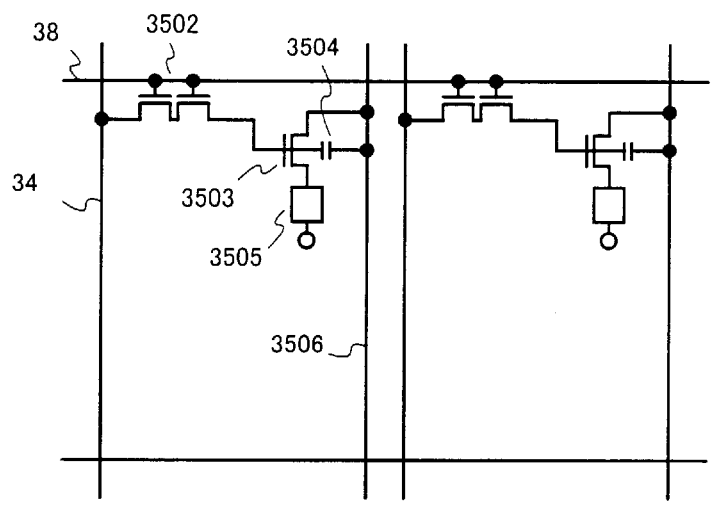

A more detailed cross sectional structure of a display portion in an EL display is shown in FIG. 19, a top structure thereof is shown in FIG. 20A, and a circuit diagram thereof is shown in FIG. 20B. Common symbols are used in FIG. 19 and FIGS. 20A and 20B, and therefore they may be mutually referenced.

In FIG. 19, a switching TFT 3502 formed on a substrate 3501 is an n-channel TFT formed by a known method. A double gate structure is used in Embodiment 7, but there are no large differences in the structure and the manufacturing process, and therefore an explanation is omitted. Note that by using the double gate structure, in effect this becomes a structure in which two TFTs are connected in series, which has the advantage of being capable of reducing the value of the off current. Note also that although the double gate structure is used in Embodiment 7, a single gate structure and a triple gate structure may also be used, and a multi-gate structure possessing more than three gates may also be used. Furthermore, a p-channel TFT formed by using a known method may also be used.

An n-channel TFT formed by a known method is used as an EL driving TFT 3503. A drain wiring 35 of the switching TFT 3502 is electrically connected to a gate electrode 37 of the EL driving TFT 3503 by a wiring 36. Further, a wiring denoted by reference numeral 38 is a gate wiring for electrically connecting gate electrodes 39a and 39b of the switching TFT 3502.

The EL driving TFT 3503 is an element for controlling the amount of electric current flowing in a display EL element, and therefore much current flows therein. Therefore the EL driving TFT 3503 is an element having a high risk of deterioration due to heat and due to hot carriers. An LDD region overlapping the gate electrode through a gate insulating film may therefore be provided on the drain side of the EL driving TFT 3503, through which deterioration due to heat and due to hot carriers is prevented.

The EL driving TFT 3503 having a single gate structure is shown in the figures in Embodiment 7, but a multi-gate structure in which a plurality of TFTs are connected in series may also be used. In addition, a structure in which a plurality of TFTs are connected in parallel and substantially dividing a channel forming region into a plurality of channel forming regions, so that heat can be released with high efficiency may also be used. This type of structure is effective as a measure against deterioration due to heat.

Furthermore, as shown in FIG. 20A, the wiring 36 which includes the gate electrode 37 of the EL driving TFT 3503 overlaps with a drain wiring 40 of the EL driving TFT 3503 through the insulating film in a region denoted by reference numeral 3504. A storage capacitance is formed in the region shown by reference numeral 3504 at this point. The storage capacitance 3504 is formed from a semiconductor film 3520 which is electrically connected to an power source supply line 3506, an insulating film (not shown in the figures) on the same layer as the gate insulating film, and the wiring 36. Further, it is also possible to use a capacitor formed from the wiring 36, the same layer (not shown in the figures) as that of a first interlayer insulating film, and the power source supply line 3506 as a storage capacitance. The storage capacitance 3504 functions as a capacitor for storing a voltage applied to the gate electrode 37 of the EL driving TFT 3503. Note that the drain of the EL driving TFT 3503 is connected to the power source supply line (power source supply line) 3506, and a fixed voltage is always applied.

A first passivation film 41 is formed on the switching TFT 3502 and the EL driving TFT 3503, and a leveling film 42 is formed on top of that from an insulating resin film. It is extremely important to level the step due to the TFTs using the leveling film 42. An EL layer formed later is extremely thin, so there are cases in which defective light emissions occur because of the presence of the step. Therefore, to form the EL layer on as level a surface as possible, it is preferable to perform leveling before forming a pixel electrode.

Furthermore, reference numeral 43 denotes a pixel electrode (display EL element cathode) made from a conductive film with high reflectivity, and this is electrically connected to a drain region of the EL driving TFT 3503. It is preferable to use for the pixel electrode 43 a low resistance conductive film, such as an aluminum alloy film, a copper alloy film, and a silver alloy film, or a laminate of such films. Of course, a lamination structure with another conductive film may also be used.

In addition, a light emitting layer 45 is formed in the middle of a groove (corresponding to a pixel) formed by banks 44a and 44b, which are formed of insulating films (preferably resins). In FIG. 20A, the banks are partially omitted in order to clarify the position of the storage capacitance 3504, showing only the banks 44a and 44b. However, the banks are provided between pixels so as to partially cover the power source supply line 3506 and the source wiring 34. Note that only two pixels are shown in the figures here, but light emitting layers may be formed so as to correspond to the colors R (red), G (green), and B (blue), respectively. A π conjugate polymer type material is used as an organic EL material. PPV(Polyparaphenylene vinylene) type, PVK (polyvinyl carbazole) type, and polyfluorene type can be given as typical polymer type materials.

Note that there are several kinds of PPV type organic EL materials, and materials disclosed in Shenk, H., Becker, H., Gelsen, O., Kluge, E., Kreuder, W, and Spreitzer, H., "Polymers for Light Emitting Diodes", Euro Display Proceedings, 1999, pp. 33–7, and in Japanese Patent Application Laid-open No. Hei 10-92576, for example, may be used.

As specific light emitting layers, cyano-polyphenylene vinylene may be used as a red light emitting layer, polyphenylene vinylene may be used as a green light emitting layer, and polyphenylene vinylene or polyalkylphenylene may be used as a blue light emitting layer. The film thicknesses may be between 30 and 150 nm (preferably between 40 and 100 nm).

However, the above is an example of the organic EL materials which can be used as light emitting layers, and it is not necessary to be limited to these materials. An EL layer (a layer for emitting light and for moving carriers for light emission) may be formed by freely combining light emitting layers, an electric charge transport layer, and an electric charge injection layer.

For example, Embodiment 7 shows an example of using a polymer type material as a light emitting layer, but a low molecular weight organic EL material may also be used. Further, it is possible to use inorganic materials such as silicon carbide, as an electric charge transport layer or an electric charge injection layer. Known materials can be used for these organic EL materials and inorganic materials.

A lamination structure EL layer, in which a hole injection layer 46 made from PEDOT (polythiophene) or PAni (polyaniline) is formed on the light emitting layer 45, is used in Embodiment 7. An anode 47 is then formed on the hole injection layer 46 from a transparent conductive film. The light generated by the light emitting layer 45 is radiated toward the upper surface (toward the top of the TFT) in Embodiment 7, and therefore the anode must be light-transmissive. An indium oxide and tin oxide compound, or an indium oxide and zinc oxide compound can be used for the transparent conductive film. However, because it is formed after forming the low heat resistance light emitting layer and hole injection layer, it is preferable to use a material which can be deposited at as low a temperature as possible.

An EL element 3505 is completed at the point where the anode 47 is formed. Note that what is called the EL element 3505 here is a capacitor formed of the pixel electrode (cathode) 43, the light emitting layer 45, the hole injection layer 46, and the anode 47. The pixel electrode 43 is nearly equal in area to the pixel, and consequently the entire pixel functions as an EL element. Therefore, the light emission efficiency is extremely high, and a bright image display becomes possible.

In addition, a second passivation film 48 is then formed on the anode 47 in Embodiment 7. It is preferable to use a silicon nitride film or a silicon oxynitride film as the second passivation film 48. The purpose of this is the isolation of the display EL element from the outside, and this for preventing degradation due to oxidation of the organic EL material, as well as for controlling degas from the organic EL material. The reliability of the EL display can thus be raised.

The EL display panel of the present invention has a display portion formed of pixels structured as in FIG. 19, and has a switching TFT with a sufficiently low off current value, and an EL driving TFT which is strong against hot carrier injection. An EL display which has high reliability and which is capable of displaying a good image can therefore be obtained.

Note that it is possible to implement the constitution of Embodiment 4 by freely combining it with the constitutions of the embodiment mode and Embodiment 1.

Embodiment 8

Figure 21:
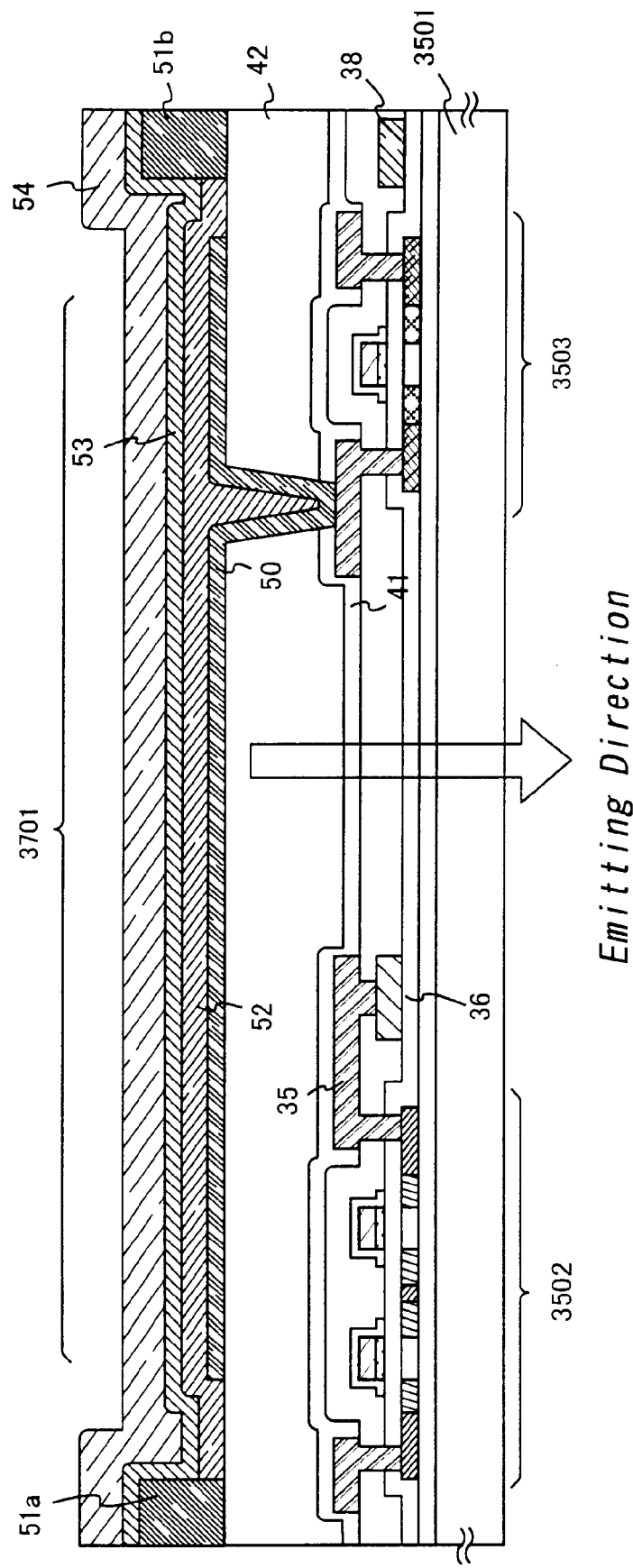
FIG. 21 is a cross sectional diagram of a display pixel of an EL display of the present invention.

A structure in which the structure of the display EL element 3505 in the pixel portion shown in Embodiment 7 is inverted is explained in Embodiment 8. FIG. 21 is used in the explanation. Note that the only points of difference between the structure of FIG. 21 and that of FIG. 19 is the display EL element and the EL driving TFT 3503, and therefore an explanation of other portions is omitted.

An EL driving TFT 3503 in FIG. 21 is a p-channel TFT manufactured by using a known method. Refer to the manufacturing process of Embodiment 2 in forming the p-channel TFT.

A transparent conductive film is used as a pixel electrode (anode) 50 in Embodiment 5. Specifically, a conductive film made from a compound of indium oxide and zinc oxide is used. Of course, a conductive film made from a compound of indium oxide and tin oxide may also be used.

After then forming banks 51a and 51b from insulating films, a light emitting layer 52 is formed from polyvinyl carbazole by solution coating. An electron injection layer 53 is formed on the light emitting layer from potassium acetylacetonate (expressed as acacK), and a cathode 54 is formed from an aluminum alloy. In this case the cathode 54 also functions as a passivation film. A display EL element 3701 is thus formed.

The light generated by the light emitting layer 52 is radiated toward the substrate on which the TFT is formed in Embodiment 8, as shown by the arrows.

Note that it is possible to implement the constitution of Embodiment 5 by freely combining it with the constitution of any of Embodiments 1 to 3.

Embodiment 9

Figure 22A:
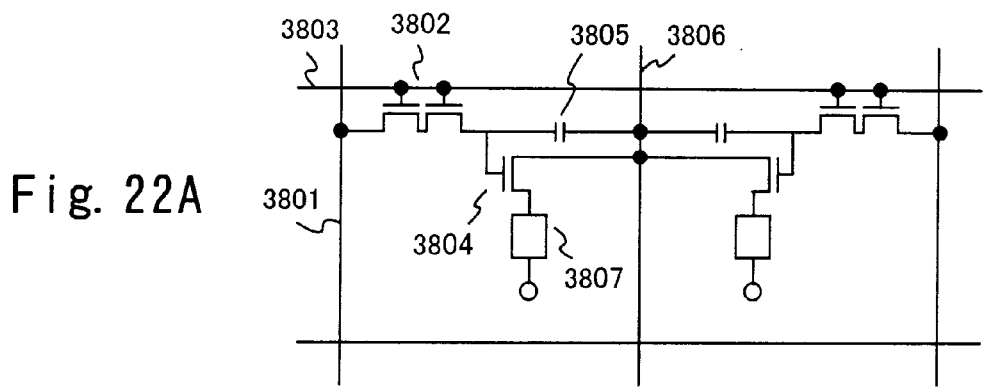
FIGS. 22A to 22C are circuit diagrams of a display pixel of an EL display of the present invention.
Figure 22B:
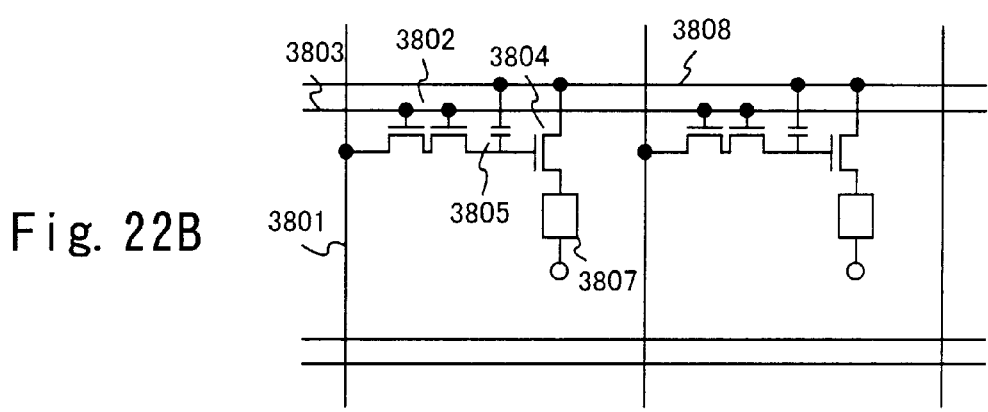
Figure 22C:
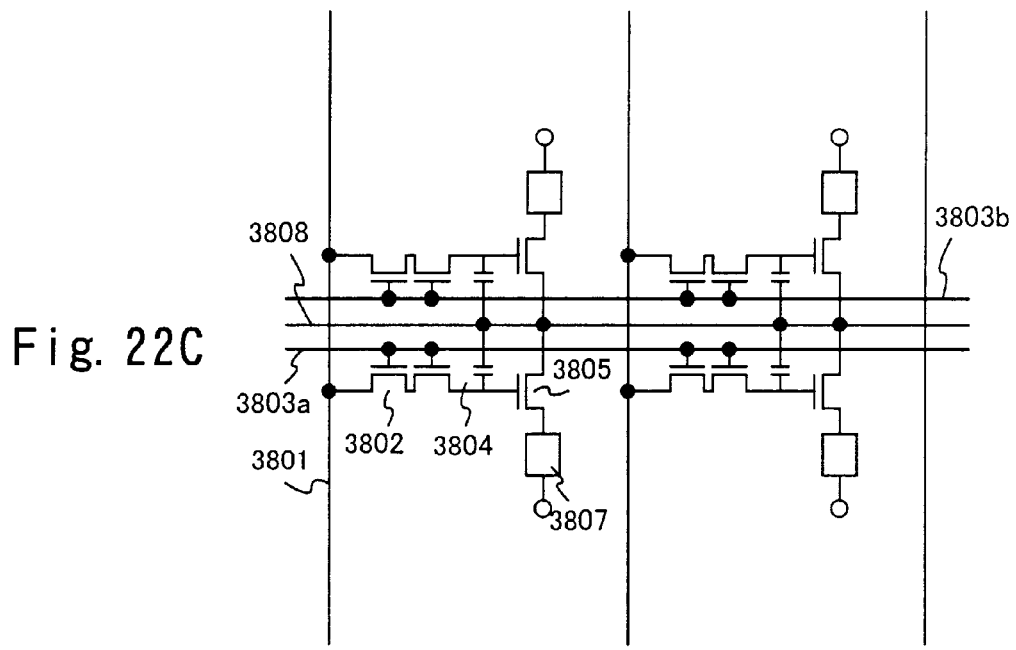

In Embodiment 9, an example of a case of a pixel having a structure which differs from that of the circuit diagram shown in FIG. 20B is shown in FIGS. 22A to 22C. Note that, in Embodiment 9, reference numeral 3801 denotes a source signal line which is a portion of a source wiring of a switching TFT 3802, reference numeral 3803 denotes a gate signal line which is a portion of a gate wiring of a switching TFT 3802, reference numeral 3804 denotes an EL driving TFT, 3805 denotes a capacitor, 3806 and 3808 are power source supply lines, and reference numeral 3807 denotes a display EL element.

FIG. 22A is an example of a case in which the power source supply line 3806 is common between two pixels. The case of FIG. 22A is characterized in that two pixels are formed so as to be symmetric with respect to the power source supply line 3806. In this case the number of power source supply lines can be reduced, and a display portion can have even higher definition.

Further, FIG. 22B is an example of a case of forming the power source supply line 3808 in parallel with the gate signal line 3803. Note that FIG. 22B has a structure in which the power source supply line 3808 and the gate signal line 3803 are formed so as not to overlap, but provided that the two are formed on differing layers, they can be formed so as to overlap through an insulating film. In this case the surface area occupied by the power source supply line 3808 and the gate signal line 3803 can be shared, and therefore the display portion can have even higher definition.

In addition, FIG. 22C has a structure characterized in that the power source supply line 3808 is formed in parallel to the gate signal lines 3803 as in the structure shown in FIG. 22B, and in addition, two pixels are formed so as to be symmetric with respect to the power source supply line 3808. Furthermore, it is also effective to form the power source supply line 3808 so as to overlap with one of the gate signal lines 3803. In this case the number of power source supply lines can be reduced, and the display portion can have even higher definition.

Note that it is possible to implement the constitution of Embodiment 9 by freely combining with the constitution of any of the embodiment mode and Embodiments 1 to 6 and 8. Furthermore, it is effective to use the EL display having the pixel structure of Embodiment 9 as a display device of electronic equipment in Embodiment 11.

Embodiment 10

A structure in which a storage capacitance for maintaining a voltage applied to a gate electrode of an EL driving TFT is omitted is explained in Embodiment 10. For a case in which the EL driving TFT is an n-channel TFT and has an LDD region formed so as to overlap with the gate electrode through a gate insulating film, a parasitic capacitance generally referred to as a gate capacitor is formed in the overlapping region. This parasitic capacitor is actively used as a substitute for a storage capacitance, which characterizes Embodiment 10.

The capacitance of the parasitic capacitor changes in accordance with the surface area in which the gate electrode and the LDD region overlap, and is determined by the length of the LDD region included in the overlapping region.

Further, it is also possible to similarly omit the storage capacitance in the structures of FIGS. 22A, 22B, and 22C shown in Embodiment 9.

Note that it is possible to implement the constitution of Embodiment 10 by freely combining it with the constitution of any of Embodiments 1 to 9. Further, it is effective to use the EL display having the pixel structure of Embodiment 10 as a display device of electronic equipment in Embodiment 11.

Embodiment 11

The present invention is not limited to a structure in which a light receiving diode in a sensor pixel detects only the luminance of light emitted from a sensor EL element. The light receiving diode of the sensor pixel may also detect the luminance of light from outside of an EL display (external light) in addition to the luminance of the light of the sensor EL element, and correction of the luminance of the EL element may be performed by adjusting to the external luminance. For instance, correction is made such that the luminance of the EL element is lowered when the luminance of the external light is high, and when the luminance of the external light is low, on the other hand, the EL element increases its luminance.

According to the above structure, a clear image can be displayed irrespective of the luminance of the surroundings.

Embodiment 12

An EL display of the present invention in which the structure of a sensor pixel differs from that shown in the embodiment mode, and Embodiments 1 to 4 is described.

Figure 25:
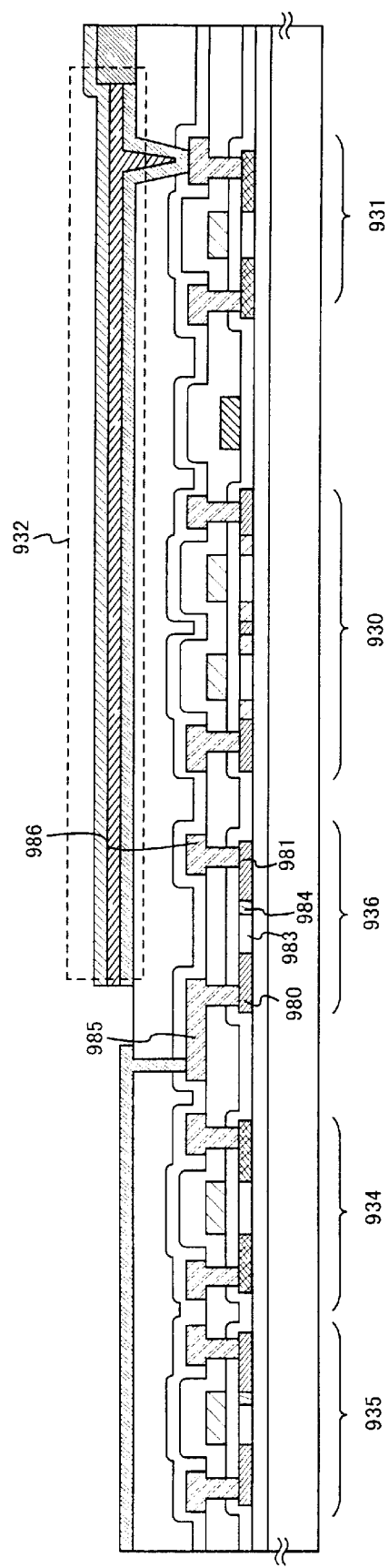
FIG. 25 is a cross sectional diagram of an EL display of the present invention.

A circuit diagram of a sensor pixel of Embodiment 12 is the same as that of the EL display shown in the embodiment mode, and therefore FIG. 3 is referenced. The structure of a light receiving diode in Embodiment 12 differs from that of the embodiment mode. A cross sectional diagram of a sensor pixel of Embodiment 12 is shown in FIG. 25 in order to explain the structure of the light receiving diode of Embodiment 12.

Reference numeral 935 denotes a buffer TFT, reference numeral 934 denotes a reset TFT, 936 denotes a light receiving diode, 930 denotes a switching TFT, 931 denotes an EL driving TFT, and reference numeral 932 denotes a sensor EL element.

The light receiving diode 936 has an anode 980, a cathode 981, a channel forming region 983, a buffer region 984, an anode wiring 985, and a cathode wiring 986 within an active layer.

The anode 980 and the cathode 981 of Embodiment 12 are formed by doping a p-type impurity or an n-type impurity to an essentially intrinsic semiconductor body. Note that the polarity of the impurity added to the anode 980 and to the cathode 981 is the same. Further, the impurity added to the anode 980 and to the cathode 981 is added to the buffer region 984 at a concentration which is lower than that in the anode 980 and in the cathode 981.

It is preferable that the polarity of the impurity added to a source region and a drain region of the buffer TFT 935 be the same as that of the impurity added to the anode 980 and to the cathode 981 of the light receiving diode 936. The cathode 981 of the light receiving diode 936 is electrically connected to a drain region of the reset TFT 934 and to a gate electrode of the buffer TFT 935. The anode 980 of the light receiving diode 936 is maintained at a fixed electric potential.

Electric current flows in the light receiving diode 936 when the light receiving diode 936 is irradiated with light from the sensor EL element 932. The electric potential of the gate electrode of the buffer TFT 935, which is fixed during the reset period, therefore changes in the sample period, and the amount of change of the electric potential changes in accordance with the amount of the electric current flowing in the light receiving diode 936.

The electric current flowing in the light receiving diode 936 is proportional to the intensity of the light irradiating the light receiving diode 936. Namely, comparing when the luminance of the light of the sensor EL element 932 is high and when it is low, when the luminance is high a large off current flows in the light receiving diode 936. The changes in the electric potential of the gate electrode of the buffer TFT 935 therefore is larger when the luminance of the light of the sensor EL element 932 is high compared to when the luminance thereof is low.

The electric potential difference $V_{GS}$ between the source region and the gate electrode of the buffer TFT 935 is always fixed, and therefore the source region of the buffer TFT 935 is maintained at an electric potential in which $V_{GS}$ is subtracted from the electric potential of the gate electrode of the buffer TFT 935. When the electric potential of the gate electrode of the buffer TFT 935 changes, the electric potential of the source region of the buffer TFT 935 also changes in accompaniment.

The electric potential of the source region of the buffer TFT 935 is given to a sensor output wiring FL, and is inputted to a correction circuit or a video signal correction circuit as a sensor output signal.

Without newly adding new manufacturing steps for the light receiving diode, the light receiving diode can be formed simultaneously with the other TFTs and the number of steps for manufacturing the EL display can be reduced with Embodiment 12.

Embodiment 13

An EL display device formed by implementing the present invention has superior visibility in bright locations in comparison to a liquid crystal display device because it is a self-emissive type device, and moreover its field of vision is wide. Accordingly, it can be used as a display portion for various electronic devices. For example, it is appropriate to use the EL display device of the present invention as a display portion of an EL display (a display incorporating the EL display device in its casing) having a diagonal equal to 30 inches or greater (typically equal to 40 inches or greater) for appreciation of TV broadcasts by large screen.

Note that all displays exhibiting (displaying) information such as a personal computer display, a TV broadcast reception display, or an advertisement display are included as the EL display device. Further, the EL display device of the present invention can be used as a display portion of the other various electronic devices.

The following can be given as examples of such electronic devices: a video camera; a digital camera; a goggle type display (head mounted display); a car navigation system; an audio reproducing device (such as a car audio system, an audio compo system); a notebook personal computer; a game equipment; a portable information terminal (such as a mobile computer, a mobile telephone, a mobile game equipment or an electronic book); and an image playback device provided with a recording medium (specifically, a device which performs playback of a recording medium and is provided with a display which can display those images, such as a digital versatile disk (DVD)). In particular, because portable information terminals are often viewed from a diagonal direction, the wideness of the field of vision is regarded as very important. Thus, it is preferable that the EL display device is employed. Examples of these electronic devices are shown in FIGS. 23A to 24B.

Figure 23A:
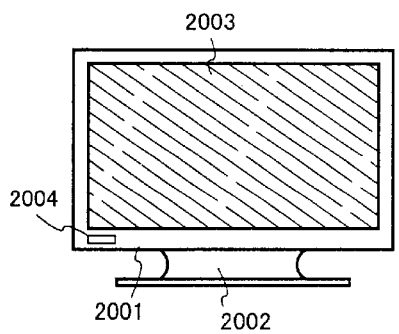
FIGS. 23A to 23F are diagrams showing examples of electronic equipment using an EL display of the present invention.

FIG. 23A is an EL display, containing a casing 2001, a support stand 2002, a display portion 2003 and a sensor portion 2004. The present invention can be used in the display portion 2003 and a sensor portion 2004. Since the EL display is a self-emissive type device without the need of a backlight, its display portion can be made thinner than a liquid crystal display device.

Figure 23B:
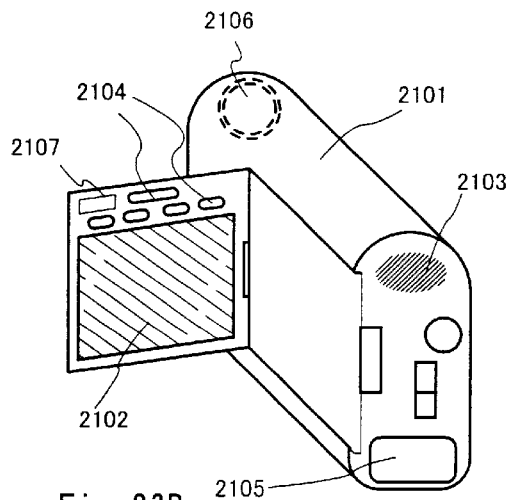

FIG. 23B is a video camera, containing a main body 2101, a display portion 2102, an audio input portion 2103, operation switches 2104, a battery 2105, an image receiving portion 2106 and a sensor portion 2107. The EL display device of the present invention can be used in the display portion 2102 and a sensor portion 2107.

Figure 23C:
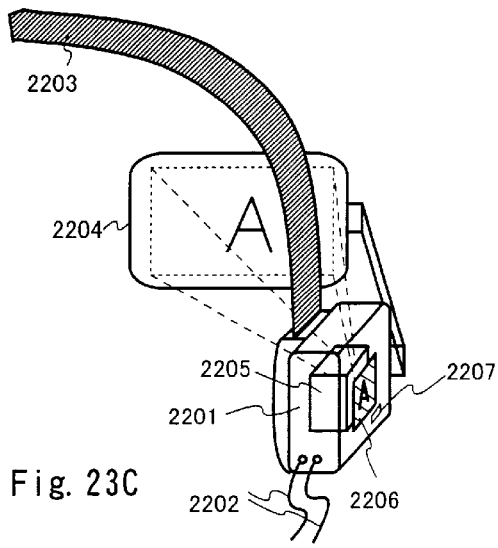

FIG. 23C is a portion of a head fitting type EL display (right side), containing a main body 2201, a signal cable 2202, a head fixing band 2203, a display portion 2204, an optical system 2205, an EL display device 2206 and a sensor portion 2207. The present invention can be used in the EL display device 2206 and a sensor portion 2207.

Figure 23D:
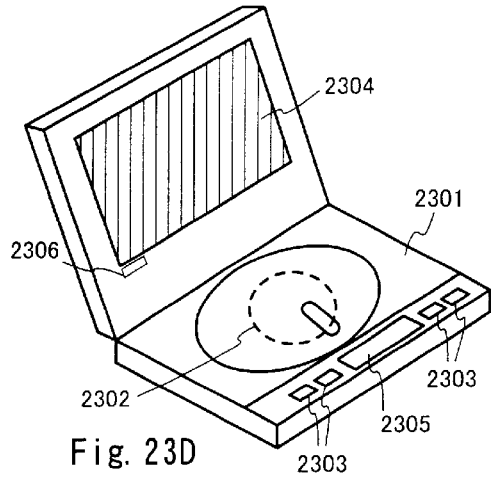

FIG. 23D is an image playback device (specifically, a DVD playback device) provided with a recording medium, containing a main body 2301, a recording medium (such as a DVD) 2302, operation switches 2303, a display portion (a) 2304, a display portion (b) 2305 and a sensor portion 2306. The display portion (a) 2304 is mainly used for displaying image information, and the image portion (b) 2305 is mainly used for displaying character information, and the EL display device of the present invention can be used in the image portion (a) 2304, in the image portion (b) 2305 and in the sensor portion 2306. Note that domestic game equipment is included as the image playback device provided with a recording medium.

Figure 23E:
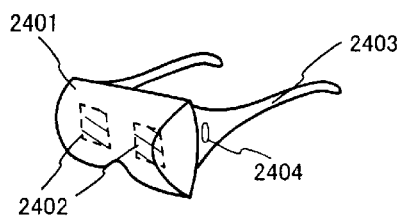

FIG. 23E is a goggle type display (head mounted display), containing a main body 2401, a display portion 2402, an arm portion 2403 and a sensor portion 2404. The present invention can be used in the display portion 2402 and the arm portion 2403. In the FIG. 23E, while a sensor portion 2404 is provided in an arm portion 2403, the present invention is not limited to the structure. The sensor portion 2404 can be provided in a row with the display portion 2402.

Figure 23F:
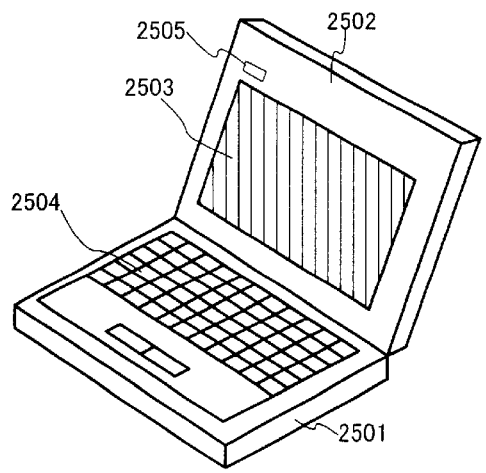

FIG. 23F is a personal computer, containing a main body 2501, a casing 2502, a display portion 2503, a keyboard 2504 and a sensor porting 2505. The EL display device of the present invention can be used in the display portion 2503 and a sensor portion 2505.

Note that in the future if the emission luminance of EL materials becomes higher, the projection of light including output images can be enlarged by lenses or the like. Then it will become possible to use the EL display device of the present invention in a front type or a rear type projector.

The above electronic devices are becoming more often used to display information provided through an electronic transmission circuit such as the Internet or CATV (cable television), and in particular, opportunities for displaying animation information are increasing. The response speed of EL materials is extremely high, and therefore the EL display device is favorable for performing animation display.

The emitting portion of the EL display device consumes power, and therefore it is preferable to display information so as to have the emitting portion become as small as possible. Therefore, when using the EL display device in a display portion which mainly displays character information, such as a portable information terminal, in particular, a portable telephone and an audio reproducing device, it is preferable to drive it by setting non-emitting portions as background and forming character information in emitting portions.

Figure 24A:
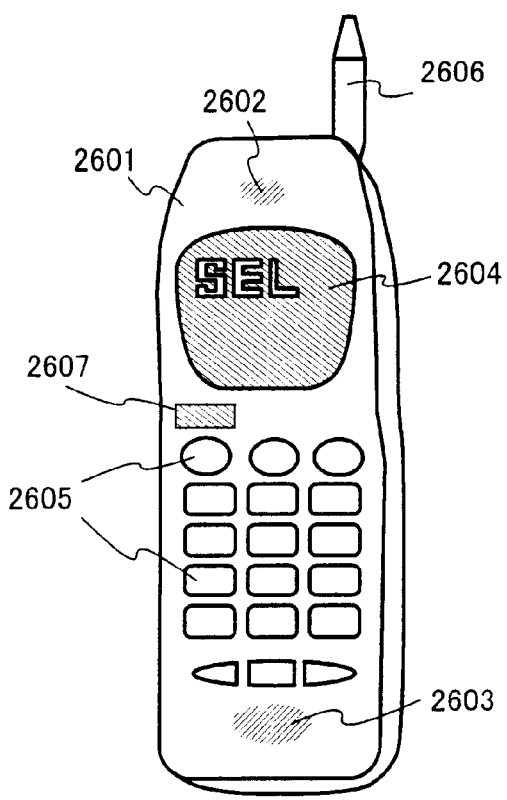
FIGS. 24A and 24B are diagrams of electronic equipments using an EL display of the present invention.

FIG. 24A is a portable telephone, containing a main body 2601, an audio output portion 2602, an audio input portion 2603, a display portion 2604, operation switches 2605, an antenna 2606 and a sensor 2607. The EL display device of the present invention can be used in the display portion 2604 and the sensor 2607. Note that by displaying white characters in a black background in the display portion 2604, the power consumption of the portable telephone can be reduced.

Figure 24B:
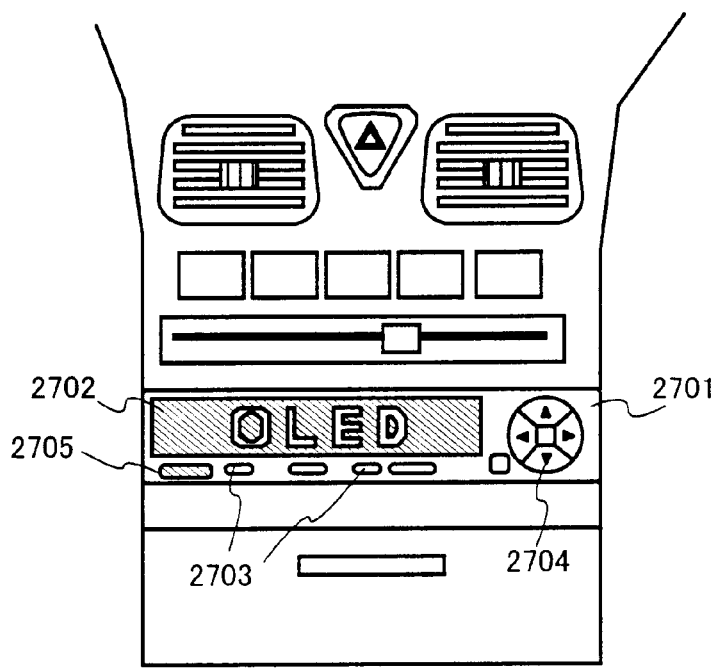

FIG. 24B is an audio reproducing device, specifically a car audio system, containing a main body 2701, a display portion 2702, and operation switches 2703, 2704 and a sensor portion 2705. The EL display device of the present invention can be used in the display portion 2702 and a sensor portion 2705. Furthermore, an audio reproducing device for a car is shown in this embodiment, but it may also be used for a mobile type and a domestic type of audio reproducing device. Note that by displaying white characters in a black background in the display portion 2704, the power consumption can be reduced. This is particularly effective in a mobile type audio reproducing device.

The range of applications of the present invention is thus extremely wide, and it is possible to apply the present invention to electronic devices in all fields. Furthermore, any constitution of the EL display device shown in Embodiments 1 to 12 may be employed in the electronic devices of this embodiment.

According to the present invention, even if the speed of deterioration of an EL layer is influenced by factors such as the structure of a device driving an EL display, the properties of an EL material structuring the EL layer, an electrode material, the conditions in the manufacturing process, and a method of driving the EL display, an EL display capable of displaying a clear image having a desired color can be provided.

Further, by forming a display EL element and a sensor EL element at the same conditions and at the same time, the speed of deterioration of the EL layers of the display EL element and of the sensor EL element can be made the same. Therefore, the luminance of the sensor EL element which a light receiving diode detects becomes very close to the luminance of the display EL element, and changes in the luminance of the display EL element can be more accurately detected, making it possible to correct to obtain desired luminance.

Furthermore, when a sensor portion is formed on a substrate at the same time as a display portion, a process of manufacturing an EL display has only an additional step of forming the light receiving diode, compared to a case of not forming the sensor portion. It is therefore not necessary to have a considerable increase in the number of manufacturing steps, and it is possible to suppress the number of manufacturing processes.

Note that by using a portion of the display portion as the sensor portion, the space for forming the sensor portion can be curtailed compared to a case of not including the sensor portion in the display portion, and therefore the size of the EL display can be reduced.

What is claimed is:

1. A semiconductor display device having a display portion and a sensor portion, wherein:
    said display portion includes a plurality of display pixels;
    said sensor portion includes at least one sensor pixel;
    each of said plurality of display pixels and said sensor pixel has a switching TFT, an EL driving TFT and an EL element;
    said sensor pixel has a light receiving diode; and
    a luminance of each of the EL elements in said plurality of display pixels is controlled by the amount of a current flowing in said light receiving diode.

2. A semiconductor display device according to claim 1, wherein said EL element emits the color red, green, or blue.

3. A semiconductor display device according to claim 1, wherein said EL element comprises an anode, a cathode, and an EL layer sandwiched therebetween, and wherein said EL layer comprises a low molecular organic material or a polymer organic material.

4. A semiconductor display device according to claim 3, wherein said low molecular organic material is made of Alq$_3$ (tris-8-quinolilite-aluminum) or TPD (triphenylamine derivative).

5. A semiconductor display device according to claim 3, wherein said polymer organic material is made of PPV (polyphenylene vinylene), PVK (polyvinyl carbazole), or polycarbonate.

6. A semiconductor display device according to claim 1, wherein said semiconductor display device is incorporated into an electronic device selected from the group consisting of a video camera, a digital camera, a goggle type display, a car navigation system, an audio reproducing system, a notebook personal computer, a game equipment, a portable information terminal and an image playback device.

7. A semiconductor display device having a display portion and a sensor portion, wherein:
    said display portion includes a plurality of display pixels;
    said sensor portion includes at least one sensor pixel;
    each of said plurality of display pixels and said sensor pixel has a switching TFT, an EL driving TFT, and an EL element;
    said sensor pixel has a reset TFT, a buffer TFT, and a light receiving diode;
    a drive of said EL driving TFT is controlled by said switching TFT;
    a luminescence of said EL element is controlled by said EL driving TFT;
    said buffer TFT has a gate electrode, a source region connected to a constant-current power source, and a drain region held at a fixed electric potential;
    an electric potential of said gate electrode and an electric potential of said drain region become equivalent when said reset TFT is ON; and
    a luminance of each of the EL elements in said plurality of display pixels is controlled by a change in an electric potential of said gate electrode in response to a current flowing in said light receiving diode when said reset TFT is OFF.

8. A semiconductor display device according to claim 7, wherein said EL element emits the color red, green, or blue.

9. A semiconductor display device according to claim 7, wherein said reset TFT is an n-channel TFT and said buffer TFT is a p-channel TFT.

10. A semiconductor display device according to claim 7, wherein said reset TFT is a p-channel TFT and said buffer TFT is an n-channel TFT.

11. A semiconductor display device according to claim 7, wherein said EL element comprises an anode, a cathode, and an EL layer sandwiched therebetween, and wherein said EL layer comprises a low molecular organic material or a polymer organic material.

12. A semiconductor display device according to claim 11, wherein said low molecular organic material is made of Alq$_3$ (tris-8-quinolilite-aluminum) or TPD (triphenylamine derivative).

13. A semiconductor display device according to claim 11, wherein said polymer organic material is made of PPV (polyphenylene vinylene), PVK (polyvinyl carbazole), or polycarbonate.

14. A semiconductor display device according to claim 7, wherein said semiconductor display device is incorporated into an electronic device selected from the group consisting of a video camera, a digital camera, a goggle type display, a car navigation system, an audio reproducing system, a notebook personal computer, a game equipment, a portable information terminal and an image playback device.

15. A semiconductor display device having a display portion, a sensor portion, a source signal line driver circuit, and a gate signal line driver circuit, wherein:
    said display portion includes a plurality of display pixels;
    said sensor portion includes at least one sensor pixel;
    each of said plurality of display pixels and said sensor pixel has a switching TFT, an EL driving TFT, and an EL element;
    said sensor pixel has a reset TFT, a buffer TFT, and a light receiving diode;
    a drive of said switching TFT is controlled by a signal that is fed to a gate electrode of said switching TFT from said gate signal line driver circuit;
    a drive of said EL driving TFT is controlled by a signal that is fed to a gate electrode of said EL driving TFT via said switching TFT from said source signal line driver circuit;
    a luminescence of said EL element is controlled by said EL driving TFT;
    said buffer TFT has a gate electrode, a source region connected to a constant-current power source, and a drain region held at a fixed electric potential;

an electric potential of said gate electrode and an electric potential of said drain region become equivalent when said reset TFT is ON; and a luminance of each of the EL elements in said plurality of display pixels is controlled by a change in an electric potential of said gate electrode in response to a current flowing in said light receiving diode when said reset TFT is OFF.

16. A semiconductor display device according to claim 15, wherein said EL element emits the color red, green, or blue.

17. A semiconductor display device according to claim 15, wherein said reset TFT is an n-channel TFT and said buffer TFT is a p-channel TFT.

18. A semiconductor display device according to claim 15, wherein said reset TFT is a p-channel TFT and said buffer TFT is an n-channel TFT.

19. A semiconductor display device according to claim 15, wherein said EL element comprises an anode, a cathode, and an EL layer sandwiched therebetween, and wherein said EL layer comprises a low molecular organic material or a polymer organic material.

20. A semiconductor display device according to claim 19, wherein said low molecular organic material is made of Alq$_3$ (tris-8-quinolilite-aluminum) or TPD (triphenylamine derivative).

21. A semiconductor display device according to claim 19, wherein said polymer organic material is made of PPV (polyphenylene vinylene), PVK (polyvinyl carbazole), or polycarbonate.

22. A semiconductor display device according to claim 15, wherein said semiconductor display device is incorporated into an electronic device selected from the group consisting of a video camera, a digital camera, a goggle type display, a car navigation system, an audio reproducing system, a notebook personal computer, a game equipment, a portable information terminal and an image playback device.

23. A semiconductor display device having a display portion and a sensor portion, wherein:

said display portion includes a plurality of display pixels;

said sensor portion includes at least one sensor pixel;

each of said plurality of display pixels and sensor pixel has a switching TFT, an EL driving TFT, and an EL element;

said sensor pixel has a reset TFT, a buffer TFT, and a sensor TFT;

a drive of said EL driving TFT is controlled by said switching TFT;

a luminescence of said EL element is controlled by said EL driving TFT;

said sensor TFT is constantly OFF;

said buffer TFT has a gate electrode, a source region that is connected to a constant-current source, and a drain region that is held at a fixed electric potential;

an electric potential of said gate electrode and an electric potential of said drain region become equivalent when said reset TFT is ON; and a luminance of each of the EL elements in said plurality of display pixels is controlled by a change in an electric potential of said gate electrode in response to an off current flowing in said sensor TFT when said reset TFT is OFF.

24. A semiconductor display device according to claim 23, wherein said EL element emits the color red, green, or blue.

25. A semiconductor display device according to claim 23, wherein said reset TFT is an n-channel TFT, said buffer TFT is a p-channel TFT, and said sensor TFT is a p-channel TFT.

26. A semiconductor display device according to claim 23, wherein said reset TFT is a p-channel TFT, said buffer TFT is an n-channel TFT, and said sensor TFT is an n-channel TFT.

27. A semiconductor display device according to claim 23, wherein said EL element comprises an anode, a cathode, and an EL layer sandwiched therebetween, and wherein said EL layer comprises a low molecular organic material or a polymer organic material.

28. A semiconductor display device according to claim 27, wherein said low molecular organic material is made of Alq$_3$ (tris-8-quinolilite-aluminum) or TPD (triphenylamine derivative).

29. A semiconductor display device according to claim 27, wherein said polymer organic material is made of PPV (polyphenylene vinylene), PVK (polyvinyl carbazole), or polycarbonate.

30. A semiconductor display device according to claim 23, wherein said semiconductor display device is incorporated into an electronic device selected from the group consisting of a video camera, a digital camera, a goggle type display, a car navigation system, an audio reproducing system, a notebook personal computer, a game equipment, a portable information terminal and an image playback device.

31. A semiconductor display device having a display portion, a sensor portion, a source signal line driver circuit, and a gate signal line driver circuit, wherein:

said display portion includes a plurality of display pixels;

said sensor portion includes at least one sensor pixel;

each of said plurality of display pixels and said sensor pixel has a switching TFT, an EL driving TFT, and an EL element;

said sensor pixel has a reset TFT, a buffer TFT, and a sensor TFT;

said switching TFT is driven by a signal that is fed to a gate electrode of said switching TFT from said gate signal line driver circuit;

a drive of said EL driving TFT is controlled by a signal that is fed to a gate electrode of said EL driving TFT via said switching TFT from said source signal line driver circuit;

a luminescence of said EL element is controlled by said EL driving TFT;

said sensor TFT is constantly OFF;

said buffer TFT has a gate electrode, a source region that is connected to a constant-current power source, and a drain region that is held at a fixed electric potential;

an electric potential of said gate electrode and an electric potential of said drain region become equivalent when said reset TFT is ON; and a luminance of each of the EL elements in said plurality of display pixels is controlled by a change in an electric potential of said gate electrode in response to an off current flowing in said sensor TFT when said reset TFT is OFF.

32. A semiconductor display device according to claim 31, wherein said EL element emits the color red, green, or blue.

33. A semiconductor display device according to claim 31, wherein said reset TFT is an n-channel TFT, said buffer TFT is a p-channel TFT, and said sensor TFT is a p-channel TFT.

34. A semiconductor display device according to claim 31, wherein said reset TFT is a p-channel TFT, said buffer TFT is an n-channel TFT, and said sensor TFT is an n-channel TFT.

35. A semiconductor display device according to claim 31, wherein said EL element comprises an anode, a cathode, and an EL layer sandwiched therebetween, and wherein said EL layer comprises a low molecular organic material or a polymer organic material.

36. A semiconductor display device according to claim 35, wherein said low molecular organic material is made of $Alq_3$ (tris-8-quinolilite-aluminum) or TPD (triphenylamine derivative).

37. A semiconductor display device according to claim 35, wherein said polymer organic material is made of PPV (polyphenylene vinylene), PVK (polyvinyl carbazole), or polycarbonate.

38. A semiconductor display device according to claim 31, wherein said semiconductor display device is incorporated into an electronic device selected from the group consisting of a video camera, a digital camera, a goggle type display, a car navigation system, an audio reproducing system, a notebook personal computer, a game equipment, a portable information terminal and an image playback device.

* * * * *